(12) United States Patent
Kimura et al.

(10) Patent No.: US 10,665,612 B2
(45) Date of Patent: May 26, 2020

(54) SEMICONDUCTOR DEVICE AND DISPLAY DEVICE

(71) Applicant: Semiconductor Energy Laboratory Co., Ltd., Atsugi-shi, Kanagawa-ken (JP)

(72) Inventors: Hajime Kimura, Kanagawa (JP); Atsushi Umezaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 16/275,385

(22) Filed: Feb. 14, 2019

(65) Prior Publication Data

US 2019/0189641 A1    Jun. 20, 2019

Related U.S. Application Data

(63) Continuation of application No. 15/810,228, filed on Nov. 13, 2017, now Pat. No. 10,269,833, which is a (Continued)

(30) Foreign Application Priority Data

Sep. 10, 2009   (JP) .................. 2009-209099

(51) Int. Cl.
*H01L 27/12* (2006.01)
*H01L 29/786* (2006.01)
(Continued)

(52) U.S. Cl.
CPC ........ *H01L 27/1225* (2013.01); *G02F 1/1339* (2013.01); *G02F 1/1368* (2013.01); (Continued)

(58) Field of Classification Search
None
See application file for complete search history.

(56) References Cited

U.S. PATENT DOCUMENTS 3,506,851 A  4/1970  Polkinghorn et al.
4,090,096 A  5/1978  Nagami
(Continued)

FOREIGN PATENT DOCUMENTS

CN    001369871 A    9/2002
CN    001725287 A    1/2006
(Continued)

OTHER PUBLICATIONS

Yoon.S et al., "P-172L: Late-News Poster:Highliy Stable Integrated Gate Driver Circuit Using A-Si TFT With Dual Pull-Down Structure", SID Digest '05 : SID International Symposium Digest of Technical Papers, May 24, 2005, vol. 36, pp. 348-351.
(Continued)

*Primary Examiner* — Benjamin P Sandvik
(74) *Attorney, Agent, or Firm* — Fish & Richardson P.C.

(57) ABSTRACT

A semiconductor device including a circuit which does not easily deteriorate is provided. The semiconductor device includes a first transistor, a second transistor, a first switch, a second switch, and a third switch. A first terminal of the first transistor is connected to a first wiring. A second terminal of the first transistor is connected to a second wiring. A gate and a first terminal of the second transistor are connected to the first wiring. A second terminal of the second transistor is connected to a gate of the first transistor. The first switch is connected between the second wiring and a third wiring. The second switch is connected between the second wiring and the third wiring. The third switch is connected between the gate of the first transistor and the third wiring.

18 Claims, 47 Drawing Sheets

Related U.S. Application Data continuation of application No. 15/334,397, filed on Oct. 26, 2016, now Pat. No. 9,825,059, which is a continuation of application No. 15/231,851, filed on Aug. 9, 2016, now Pat. No. 9,847,352, which is a continuation of application No. 14/658,403, filed on Mar. 16, 2015, now Pat. No. 9,418,989, which is a continuation of application No. 12/875,808, filed on Sep. 3, 2010, now Pat. No. 9,236,377.

(51) Int. Cl.
| | | |
|---|---|---|
| *H01L 27/088* | (2006.01) | |
| *G02F 1/133* | (2006.01) | |
| *G02F 1/1339* | (2006.01) | |
| *G02F 1/1362* | (2006.01) | |
| *G02F 1/1368* | (2006.01) | |
| *H01L 29/417* | (2006.01) | |
| *H01L 29/423* | (2006.01) | |
| *G11C 19/28* | (2006.01) | |
| *G02F 1/1333* | (2006.01) | |
| *G02F 1/1343* | (2006.01) | |
| *G09G 3/36* | (2006.01) | |

(52) U.S. Cl.
CPC .... *G02F 1/13306* (2013.01); *G02F 1/136213* (2013.01); *G02F 1/136286* (2013.01); *G11C 19/28* (2013.01); *H01L 27/088* (2013.01); *H01L 27/124* (2013.01); *H01L 27/127* (2013.01); *H01L 27/1244* (2013.01); *H01L 27/1251* (2013.01); *H01L 27/1255* (2013.01); *H01L 27/1288* (2013.01); *H01L 29/41733* (2013.01); *H01L 29/42384* (2013.01); *H01L 29/7869* (2013.01); *H01L 29/78696* (2013.01); *G02F 1/133345* (2013.01); *G02F 1/134309* (2013.01); *G02F 2001/133302* (2013.01); *G02F 2201/121* (2013.01); *G02F 2201/123* (2013.01); *G09G 3/3677* (2013.01); *G09G 2310/0251* (2013.01); *G09G 2310/08* (2013.01); *G09G 2330/021* (2013.01)

(56) References Cited

U.S. PATENT DOCUMENTS

| | | | |
|---|---|---|---|
| 4,578,597 A | 3/1986 | Soneda et al. | |
| 5,949,398 A | 9/1999 | Kim | |
| 6,052,426 A | 4/2000 | Maurice | |
| 6,300,928 B1 | 10/2001 | Kim | |
| 6,426,743 B1 | 7/2002 | Yeo et al. | |
| 6,556,646 B1 | 4/2003 | Yeo et al. | |
| 6,690,347 B2 | 2/2004 | Jeon et al. | |
| 6,756,816 B2 | 6/2004 | Miyake | |
| 6,813,332 B2 | 11/2004 | Nagao et al. | |
| 6,845,140 B2 | 1/2005 | Moon et al. | |
| 6,850,090 B2 | 2/2005 | Aoki | |
| 6,928,135 B2 | 8/2005 | Sasaki et al. | |
| 6,958,750 B2 | 10/2005 | Azami et al. | |
| 7,023,410 B2 | 4/2006 | Lee et al. | |
| 7,068,076 B2 | 6/2006 | Azami | |
| 7,116,748 B2 | 10/2006 | Nagao et al. | |
| 7,202,863 B2 | 4/2007 | Kimura et al. | |
| 7,203,264 B2 | 4/2007 | Lo et al. | |
| 7,289,096 B2 | 10/2007 | Jeon et al. | |
| 7,317,779 B2 | 1/2008 | Moon et al. | |
| 7,327,161 B2 | 2/2008 | Jang et al. | |
| 7,403,038 B2 | 7/2008 | Azami | |
| 7,405,716 B2 | 7/2008 | Lee et al. | |
| 7,486,269 B2 | 2/2009 | Moon | |
| 7,646,841 B2 | 1/2010 | Moon et al. | |
| 7,664,218 B2 | 2/2010 | Tobita | |
| 7,760,846 B2 | 7/2010 | Peng et al. | |
| 7,786,985 B2 | 8/2010 | Kimura et al. | |
| 7,859,510 B2 | 12/2010 | Umezaki | |
| 7,910,929 B2 | 3/2011 | Takayama et al. | |
| 7,936,332 B2 | 5/2011 | Lee et al. | |
| 7,978,274 B2 | 7/2011 | Umezaki et al. | |
| 7,994,500 B2 | 8/2011 | Kim et al. | |
| 8,018,423 B2 | 9/2011 | Tsai et al. | |
| 8,044,906 B2 | 10/2011 | Kimura et al. | |
| 8,054,279 B2 | 11/2011 | Umezaki et al. | |
| 8,059,078 B2 | 11/2011 | Kimura et al. | |
| 8,102,340 B2 | 1/2012 | Lee et al. | |
| 8,148,779 B2 | 4/2012 | Jeong et al. | |
| 8,188,480 B2 | 5/2012 | Itai | |
| 8,203,143 B2 | 6/2012 | Imai | |
| 8,237,692 B2 | 8/2012 | Tsai | |
| 8,330,492 B2 | 12/2012 | Umezaki | |
| 8,405,596 B2 | 3/2013 | Kumada | |
| 8,456,396 B2 | 6/2013 | Umezaki | |
| 8,462,100 B2 | 6/2013 | Umezaki | |
| 8,493,524 B2 | 7/2013 | Her et al. | |
| 8,520,159 B2 | 8/2013 | Umezaki et al. | |
| 8,605,027 B2 | 12/2013 | Pak et al. | |
| 8,643,586 B2 | 2/2014 | Umezaki | |
| 8,692,741 B2 | 4/2014 | Shin | |
| 8,743,044 B2 | 6/2014 | Umezaki et al. | |
| 8,902,145 B2 | 12/2014 | Umezaki et al. | |
| 8,908,115 B2 | 12/2014 | Umezaki et al. | |
| 8,951,849 B2 | 2/2015 | Takayama et al. | |
| 9,184,183 B2 | 11/2015 | Umezaki | |
| 9,236,377 B2 | 1/2016 | Kimura et al. | |
| 9,263,468 B2 | 2/2016 | Umezaki et al. | |
| 9,335,599 B2 | 5/2016 | Umezaki | |
| 9,418,989 B2 | 8/2016 | Kimura et al. | |
| 9,606,408 B2 | 3/2017 | Umezaki et al. | |
| 10,048,558 B2 | 8/2018 | Umezaki et al. | |
| 2002/0158666 A1 | 10/2002 | Azami et al. | |
| 2002/0167026 A1 | 11/2002 | Azami et al. | |
| 2002/0190326 A1 | 12/2002 | Nagao et al. | |
| 2003/0020520 A1 | 1/2003 | Miyake et al. | |
| 2003/0231735 A1 | 12/2003 | Moon et al. | |
| 2004/0140839 A1 | 7/2004 | Nagao et al. | |
| 2004/0165692 A1 | 8/2004 | Moon et al. | |
| 2004/0253781 A1 | 12/2004 | Kimura et al. | |
| 2005/0008114 A1 | 1/2005 | Moon | |
| 2005/0220262 A1 | 10/2005 | Moon | |
| 2006/0001637 A1 | 1/2006 | Pak et al. | |
| 2006/0280279 A1 | 12/2006 | Nagao et al. | |
| 2008/0007296 A1 | 1/2008 | Umezaki | |
| 2008/0012816 A1 | 1/2008 | Moon | |
| 2008/0165169 A1 | 7/2008 | Lee | |
| 2008/0219401 A1 | 9/2008 | Tobita | |
| 2010/0134396 A1 | 6/2010 | Umezaki | |
| 2010/0182306 A1 | 7/2010 | Kimura et al. | |
| 2011/0193083 A1 | 8/2011 | Kim et al. | |
| 2012/0032943 A1 | 2/2012 | Kimura et al. | |
| 2013/0107154 A1 | 5/2013 | Umezaki | |
| 2013/0293800 A1 | 11/2013 | Her et al. | |
| 2016/0238916 A1 | 8/2016 | Umezaki | |
| 2016/0351587 A1 | 12/2016 | Kimura et al. | |
| 2017/0047353 A1 | 2/2017 | Kimura et al. | |
| 2018/0348561 A1 | 12/2018 | Umezaki et al. | |

FOREIGN PATENT DOCUMENTS

| | | |
|---|---|---|
| CN | 101083139 A | 12/2007 |
| CN | 101135791 A | 3/2008 |
| EP | 1231594 A | 8/2002 |
| EP | 1445862 A | 8/2004 |
| EP | 1445862 A | 11/2006 |
| EP | 1870877 A | 12/2007 |
| EP | 1895545 A | 3/2008 |
| EP | 1906414 A | 4/2008 |
| JP | 55-156427 A | 12/1980 |
| JP | 2000-155550 A | 6/2000 |
| JP | 2001-273785 A | 10/2001 |
| JP | 2003-273228 A | 9/2003 |
| JP | 2004-078172 A | 3/2004 |
| JP | 2004-246358 A | 9/2004 |
| JP | 2005-050502 A | 2/2005 |

(56) References Cited

FOREIGN PATENT DOCUMENTS

| | | |
|---|---|---|
| JP | 2005-522734 | 7/2005 |
| JP | 2006-024350 A | 1/2006 |
| JP | 2006-191026 A | 7/2006 |
| JP | 2008-003602 A | 1/2008 |
| JP | 2008-009393 A | 1/2008 |
| JP | 2008-083692 A | 4/2008 |
| JP | 2008-107807 A | 5/2008 |
| JP | 2008-108374 A | 5/2008 |
| JP | 2009-170896 A | 7/2009 |
| JP | 2009-188749 A | 8/2009 |
| JP | 2009-231613 A | 10/2009 |
| JP | 2010-016347 A | 1/2010 |
| JP | 2010-067954 A | 3/2010 |
| JP | 2011-082967 A | 4/2011 |
| KR | 2008-0083480 A | 9/2008 |
| TW | 200836150 | 9/2008 |
| TW | 200842792 | 11/2008 |
| TW | 200903515 | 1/2009 |
| TW | 200929131 | 7/2009 |
| TW | 200937377 | 9/2009 |
| WO | WO-1995/031804 | 11/1995 |
| WO | WO-2002/065062 | 8/2002 |
| WO | WO-2003/087921 | 10/2003 |
| WO | WO-2004/006435 | 1/2004 |
| WO | WO-2007/080813 | 7/2007 |
| WO | WO-2008/093458 | 8/2008 |

OTHER PUBLICATIONS

Jang.Y et al., "P-5: A-Si TFT Integrated Gate Driver With AC-Driven Single Pull-Down Structure", SID Digest '06 : SID International Symposium Digest of Technical Papers, Jun. 6, 2006, vol. 37, pp. 208-211.

Kim.B et al., "A-Si Gate Driver Integration With Time Shared Data Driving", IDW/AD '05(Proceedings of The 12th International Display Workshops in conjunction with Asia Display ), 2005, vol. 2, pp. 1073-1076.

Chun.M et al., "Integrated Gate Driver Using Highly Stable A-Si TFT's", IDW/AD '05(Proceedings of The 12th International Display Workshops in conjunction with Asia Display ), 2005, vol. 2, pp. 1077-1080.

Wei.C et al., "Integrated Gate Driver Circuit Using A-Si TFT", IDW/AD '05(Proceedings of The 12th International Display Workshops in conjunction with Asia Display ), 2005, vol. 2, pp. 1023-1026.

Chen.Y et al., "7.0-in. a-Si:H TFT-LCD with Stable Integrate Gate Driver", IDW '09 : Proceedings of The 16th International Display Workshops, Dec. 9, 2009, No. 3, pp. 1729-1732.

Stewart.R et al., "8.4: Circuit Design for a-Si AMLCDs with Integrated Drivers", SID Digest '95 : SID International Symposium Digest of Technical Papers, 1995, vol. 26, pp. 89-92.

Jeon.J et al., "3.2: Integrated a-Si Gate Driver Circuit for TFT-LCD Panel", SID Digest '04 : SID International Symposium Digest of Technical Papers, 2004, vol. 35, pp. 10-13.

Jang.Y et al., "Integrated Gate Driver Circuit Using a-Si TFT with Dual Pull-down Structure.", IDW '04 : Proceedings of The 11th International Display Workshops, Dec. 8, 2004, pp. 333-336.

Maurice.F et al., "High Resolution Projection Valve With the Amorphous Silicon AMLCD Technology", Proceedings of SPIE—Conference on Projection Displays IV, 1998, vol. 3296, pp. 92-99.

Lebrun.H et al., "P-6: AMLCD with integrated Drivers Made with Amorphous-Silicon TFTs", SID Digest '95 : SID International Symposium Digest of Technical Papers, May 1, 1995, vol. 26, pp. 403-406.

Lebrun.H et al., "4-4: Threshold Voltage Drift of Amorphous Silicon TFT in Integrated Drivers for Active Matrix LCDs", Eurodisplay '02 : The 22th International Display Research Conference, Oct. 2, 2002, pp. 83-85.

Jang.Y et al., "P-18: Highly Stable a-Si TFT Gate Driver with Simple Logic Circuit", SID Digest '08 : SID International Symposium Digest of Technical Papers, May 20, 2008, vol. 39, pp. 1235-1238.

Lee.W et al., "Amorphous Silicon Gate Driver with Low Power Consumption and Highly Driving Capability for High Resolution Mobile Display", IDW '06 : Proceedings of The 13th International Display Workshops, Dec. 7, 2006, vol. 2, pp. 739-742.

Jang.Y, "Instability of Integrated Shift Register Circuits Using Hydrogenated Amorphous Silicon Thin Film Transistors", JPN. J. Appl. Phys. (Japanese Journal of Applied Physics) , 2006, vol. 45, No. 9A, pp. 6806-6811.

Nakayama.M et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Chinese Office Action (Application No. 201010288990.5) dated Mar. 14, 2014.

Taiwanese Office Action (Application No. 099129681) dated Mar. 12, 2015.

Taiwanese Office Action (Application No. 104126982) dated May 4, 2016.

Chinese Office Action (Application No. 201510350218.4) dated May 31, 2017.

Chinese Office Action (Application No. 201510350230.5) dated Sep. 5, 2017.

FIG. 1A
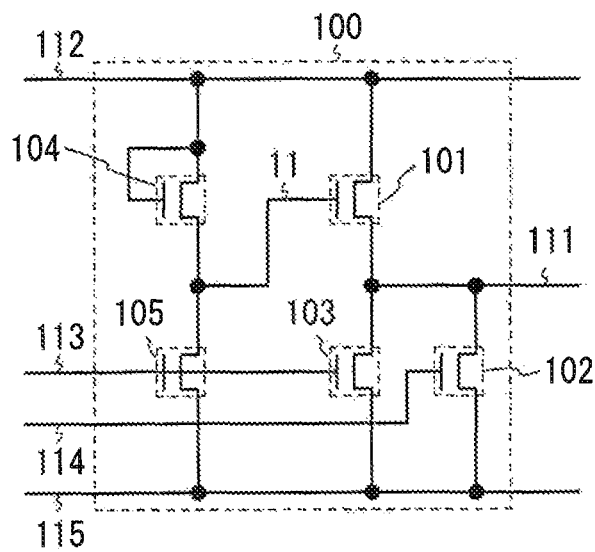
FIG. 1B
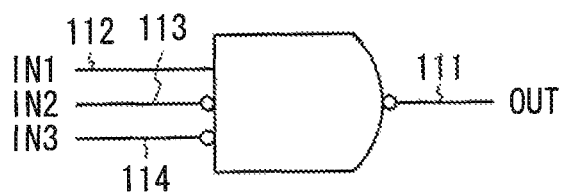
FIG. 1C
$$OUT = IN1 \cdot \overline{IN2} \cdot \overline{IN3} = \overline{IN1} \text{ AND } \overline{IN2} \text{ AND } \overline{IN3}$$
FIG. 1D
|  | IN1 | IN2 | IN3 | OUT |
|---|---|---|---|---|
| Operation 1 | H | H | H | L |
| Operation 2 | H | H | L | L |
| Operation 3 | H | L | H | L |
| Operation 4 | H | L | L | H |
| Operation 5 | L | H | H | L |
| Operation 6 | L | H | L | L |
| Operation 7 | L | L | H | L |
| Operation 8 | L | L | L | Z |

FIG. 5A
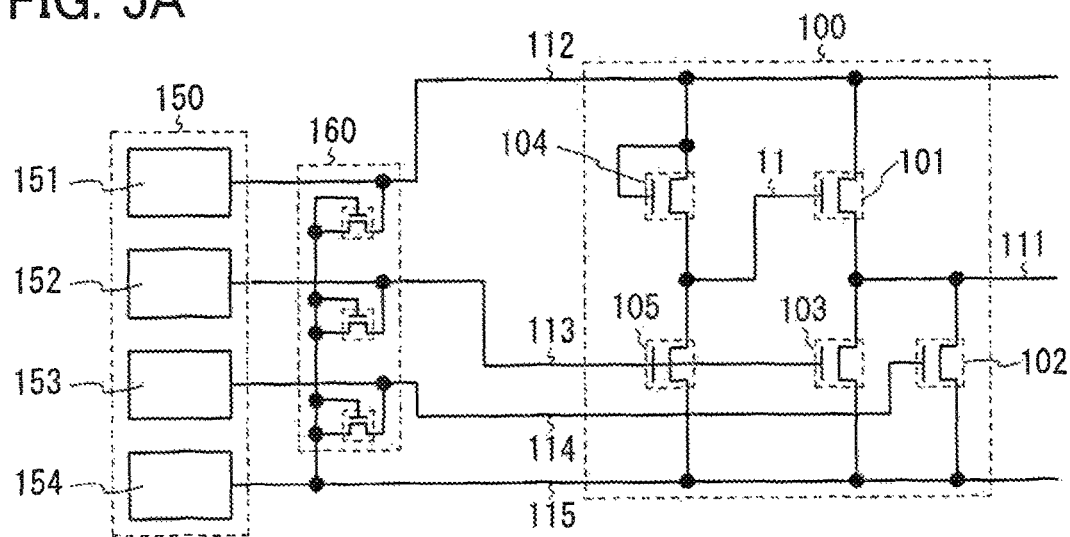
FIG. 5B  FIG. 5C  FIG. 5D
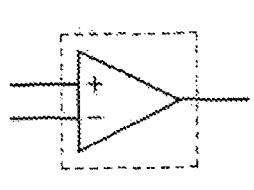  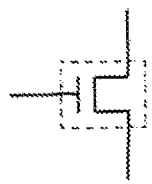
FIG. 5E  FIG. 5F  FIG. 5G
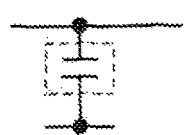 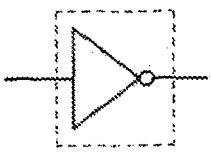 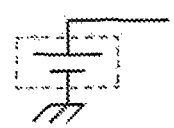
FIG. 5H  FIG. 5I
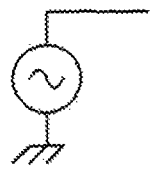 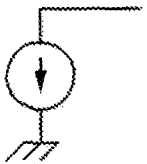

FIG. 13A
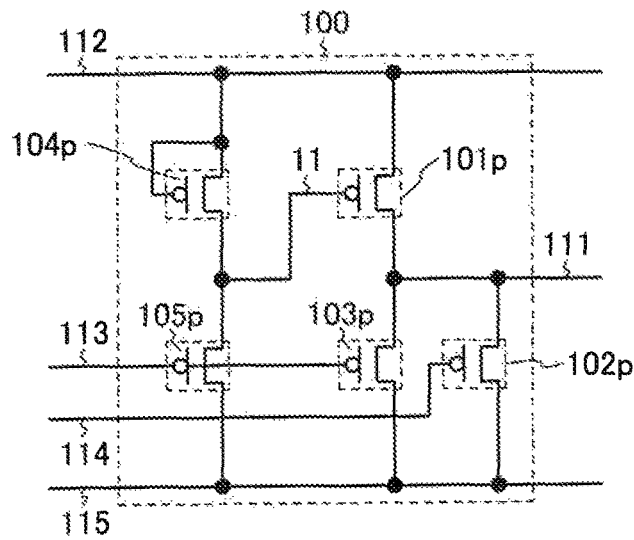
FIG. 13B
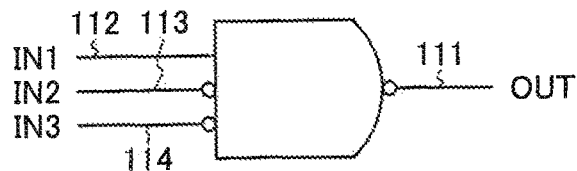
FIG. 13C
$$OUT = \overline{IN1 \cdot \overline{IN2} \cdot \overline{IN3}} = \overline{\overline{IN1} \text{ AND } \overline{IN2} \text{ AND } \overline{IN3}}$$
FIG. 13D
|             | IN1 | IN2 | IN3 | OUT |
|-------------|-----|-----|-----|-----|
| Operation 1 | H   | H   | H   | Z   |
| Operation 2 | H   | H   | L   | H   |
| Operation 3 | H   | L   | H   | H   |
| Operation 4 | H   | L   | L   | H   |
| Operation 5 | L   | H   | H   | L   |
| Operation 6 | L   | H   | L   | H   |
| Operation 7 | L   | L   | H   | H   |
| Operation 8 | L   | L   | L   | Z   |

Period A

Period B

Period A

Period B

Period A

Period B

Period C

Period D

Period E

Period A

Period B

Period C

Period B

Period C

Period B

Period A

Period E

Period B

SEMICONDUCTOR DEVICE AND DISPLAY DEVICE

CROSS-REFERENCE TO RELATED APPLICATIONS

This application is a continuation of U.S. application Ser. No. 15/810,228, filed Nov. 13, 2017, now allowed, which is a continuation of U.S. application Ser. No. 15/334,397, filed Oct. 26, 2016, now U.S. Pat. No. 9,825,059, which is a continuation of U.S. application Ser. No. 15/231,851, filed Aug. 9, 2016, now U.S. Pat. No. 9,847,352, which is a continuation of U.S. application Ser. No. 14/658,403, filed Mar. 16, 2015, now U.S. Pat. No. 9,418,989, which is a continuation of U.S. application Ser. No. 12/875,808, filed Sep. 3, 2010, now U.S. Pat. No. 9,236,377, which claims the benefit of a foreign priority application filed in Japan as Serial No. 2009-209099 on Sep. 10, 2009, all of which are incorporated by reference.

BACKGROUND OF THE INVENTION

1. Field of the Invention

The present invention relates to a semiconductor device and a driving method thereof.

2. Description of the Related Art

In recent years, with the increase of large display devices such as liquid crystal televisions, display devices have actively developed. In particular, a technique for forming a driver circuit such as a gate driver over the same substrate as a pixel portion with the use of a transistor formed using a non-single-crystal semiconductor has actively developed because the technique greatly contributes to reduction in manufacturing cost and improvement in reliability.

However, a transistor formed using a non-single-crystal semiconductor deteriorates. Accordingly, the decrease in mobility, the rise (or the fall) in the threshold voltage, or the like occurs. In particular, in a gate driver, a transistor having a function of applying negative voltage (also referred to as an L-level potential) to a gate signal line (such a transistor is also referred to as a pull-down transistor) greatly deteriorates. This is because the pull-down transistor is turned on so as to apply negative voltage to the gate signal line in the case where the gate signal line is not selected. In other words, the pull-down transistor is on in most of the one frame period because the gate signal line is not selected.

In order to solve the foregoing problems, Reference 1 discloses a gate driver where deterioration of a pull-down transistor can be suppressed. Reference 1 discloses a circuit capable of outputting pulses (e.g., a holding control portion 350 in FIG. 7 in Reference 1) that is provided in each stage of the gate driver in order to suppress deterioration of the pull-down transistor. The conduction state of the pull-down transistor is controlled with an output signal of the circuit. The circuit outputs a pulse in synchronization with a clock signal or the like. Therefore, the length of time during which the pull-down transistor is on can be decreased, so that deterioration of the pull-down transistor can be suppressed. However, the circuit capable of outputting pulses includes a transistor Q32 which is on in most of the one frame period. Therefore, the transistor Q32 deteriorates.

REFERENCE

[Reference 1] Japanese Published Patent Application No. 2005-050502

SUMMARY OF THE INVENTION

In one embodiment of the present invention, deterioration of a first transistor, a second transistor, and first to third switches is suppressed in a semiconductor device including the first transistor, the second transistor, and the first to third switches. Alternatively, deterioration of first to fifth transistors is suppressed in a semiconductor device including the first to fifth transistors. Alternatively, in the semiconductor device further including a sixth transistor, deterioration of the first to sixth transistors is suppressed. Alternatively, in the semiconductor device further including a seventh transistor, deterioration of the first to seventh transistors is suppressed.

One embodiment of the present invention is a semiconductor device including a first transistor, a second transistor, a first switch, a second switch, and a third switch. A first terminal of the first transistor is connected to a first wiring. A second terminal of the first transistor is connected to a second wiring. A gate and a first terminal of the second transistor are connected to the first wiring. A second terminal of the second transistor is connected to a gate of the first transistor. The first switch is connected between the second wiring and a third wiring. The second switch is connected between the second wiring and the third wiring. The third switch is connected between the gate of the first transistor and the third wiring.

In the above embodiment, a first period and a second period may be provided. In the first period, the first switch, the second switch, and the third switch may be turned off and a potential of the first wiring may become an H level. In the second period, the first switch may be turned off, the second switch and the third switch may be turned on, and the potential of the first wiring may become an L level.

One embodiment of the present invention is a semiconductor device including a first transistor, a second transistor, a third transistor, a fourth transistor, and a fifth transistor. A first terminal of the first transistor is connected to a first wiring. A second terminal of the first transistor is connected to a second wiring. A gate and a first terminal of the second transistor are connected to the first wiring. A second terminal of the second transistor is connected to a gate of the first transistor. A gate of the third transistor is connected to a fourth wiring. A first terminal of the third transistor is connected to a third wiring. A second terminal of the third transistor is connected to the second wiring. A gate of the fourth transistor is connected to a fifth wiring. A first terminal of the fourth transistor is connected to the third wiring. A second terminal of the fourth transistor is connected to the second wiring. A gate of the fifth transistor is connected to the fifth wiring. A first terminal of the fifth transistor is connected to the third wiring. A second terminal of the fifth transistor is connected to the gate of the first transistor.

In the above embodiment, the channel width of the fifth transistor may be larger than the channel width of the second transistor, and the channel width of the second transistor may be larger than the channel width of the first transistor.

In the above embodiment, the semiconductor device may include a sixth transistor. A gate of the sixth transistor may be connected to the second wiring. A first terminal of the sixth transistor may be connected to the third wiring. A second terminal of the sixth transistor may be connected to a sixth wiring.

In the above embodiment, a period A and a period B may be provided. In the period A, a potential of the first wiring may become an H level; potentials of the fifth wiring and the fourth wiring may become an L level; the first transistor, the second transistor, and the sixth transistor may be turned on; the third transistor, the fourth transistor, and the fifth transistor may be turned off; and a potential of the sixth wiring may become an L level. In the period B, the potential of the first wiring may become an L level; the potential of the fifth wiring may become an H level; the potential of the fourth wiring may become an L level; the first transistor, the second transistor, the third transistor, and the sixth transistor may be turned off; the fourth transistor and the fifth transistor may be turned on; and the potential of the sixth wiring may become an L level.

In the above embodiment, the semiconductor device may include a seventh transistor. A gate of the seventh transistor may be connected to the fourth wiring. A first terminal of the seventh transistor may be connected to the first wiring. A second terminal of the seventh transistor may be connected to the sixth wiring.

In the above embodiment, the period A, the period B, a period C, a period D, and a period E may be provided. In the period A, the potential of the first wiring may become an H level; potentials of the fifth wiring and the fourth wiring may become an L level; the first transistor, the second transistor, and the sixth transistor may be turned on; the third transistor, the fourth transistor, the fifth transistor, and the seventh transistor may be turned off; and the potential of the sixth wiring may become an L level. In the period B, the potential of the first wiring may become an L level; the potential of the fifth wiring may become an H level; the potential of the fourth wiring may become an L level; the first transistor, the second transistor, the third transistor, and the sixth transistor may be turned off; the fourth transistor and the fifth transistor may be turned on; and the potential of the sixth wiring may become an L level. In the period C, the potential of the first wiring may become an L level; the potentials of the fifth wiring and the fourth wiring may become an H level; the first transistor, the second transistor, and the sixth transistor may be turned off; the third transistor, the fourth transistor, the fifth transistor, and the seventh transistor may be turned on; and the potential of the sixth wiring may become an L level. In the period D, the potential of the first wiring may become an H level; the potential of the fifth wiring may become an L level; the potential of the fourth wiring may become an H level; the first transistor, the second transistor, the third transistor, and the seventh transistor may be turned on; the fourth transistor, the fifth transistor, and the sixth transistor may be turned off; and the potential of the sixth wiring may become an H level. In the period E, the potential of the first wiring may become an L level; the potential of the fifth wiring may become an H level; the potential of the fourth wiring may become an L level; the first transistor, the second transistor, the third transistor, the sixth transistor, and the seventh transistor may be turned off; the fourth transistor and the fifth transistor may be turned on; and the potential of the sixth wiring may become an L level.

In each of the above embodiments of the present invention, a variety of switches can be used as a switch. An electrical switch, a mechanical switch, or the like can be used as a switch. That is, any element can be used as a switch as long as it can control current, without limitation to a certain element. A transistor (e.g., a bipolar transistor or a MOS transistor), a diode (e.g., a PN diode, a PIN diode, a Schottky diode, an MIM (metal insulator metal) diode, an MIS (metal insulator semiconductor) diode, or a diode-connected transistor), a logic circuit in which such elements are combined, or the like can be used as an electrical switch. A switch formed using a MEMS (micro electro mechanical system) technology, such as a digital micromirror device (DMD), can be used as a mechanical switch. Such a switch includes an electrode which can be moved mechanically, and operates by controlling conduction and non-conduction in accordance with movement of the electrode.

In the case where a transistor is used as a switch, the polarity (conductivity type) of the transistor is not particularly limited to a certain type because it operates just as a switch. However, a transistor having polarity with smaller off-state current is preferably used when the amount of off-state current is to be suppressed. A transistor provided with an LDD region, a transistor with a multi-gate structure, or the like can be used as a transistor with smaller off-state current.

In each of the above embodiments of the present invention, when a transistor is used as a switch and a potential of a source of the transistor is close to a potential of a low-potential-side power source (e.g., $V_{ss}$, GND, or 0 V), an n-channel transistor is preferably used as the switch. In contrast, a p-channel transistor is preferably used as the switch when the potential of the source of the transistor is close to a potential of a high-potential-side power source (e.g., $V_{dd}$). This is because the absolute value of gate-source voltage can be increased when the potential of the source of the n-channel transistor is close to a potential of a low-potential-side power source and when the potential of the source of the p-channel transistor is close to a potential of a high-potential-side power source, so that the transistor can be more accurately operated as a switch. Alternatively, this is because the transistor does not often perform source follower operation, so that the decrease in output voltage does not often occur.

In each of the above embodiments of the present invention, a CMOS switch may be used as a switch with the use of both an n-channel transistor and a p-channel transistor. By using a CMOS switch, the switch can be more accurately operated as a switch because current can flow when either the p-channel transistor or the n-channel transistor is turned on. Therefore, voltage can be appropriately output regardless of whether voltage of a signal input to the switch is high or low. Alternatively, since the voltage amplitude value of a signal for turning on or off the switch can be made small, power consumption can be reduced.

Note that when a transistor is used as a switch, the switch includes an input terminal (one of a source and a drain), an output terminal (the other of the source and the drain), and a terminal for controlling conduction (a gate) in some cases. On the other hand, when a diode is used as a switch, the switch does not include a terminal for controlling conduction in some cases. Therefore, when a diode is used as a switch, the number of wirings for controlling terminals can be reduced as compared to the case where a transistor is used.

In the invention disclosed in this specification, transistors with a variety of structures can be used as a transistor. That is, there is no limitation on the structures of transistors to be used.

In this specification, a semiconductor device corresponds to a device including a circuit having a semiconductor element (e.g., a transistor, a diode, or a thyristor). Note that the semiconductor device may correspond to also all devices that can function by utilizing semiconductor characteristics and a device having a semiconductor material. In this specification, a display device corresponds to a device having a display element.

In this specification, a drive device corresponds to a device having a semiconductor element, an electric circuit, or an electronic circuit. For example, a transistor which controls input of signals from a source signal line to pixels (also referred to as a selection transistor, a switching transistor, or the like), a transistor which supplies voltage or current to a pixel electrode, a transistor which supplies voltage or current to a light-emitting element, and the like are examples of the drive device. A circuit which supplies signals to a gate signal line (also referred to as a gate driver, a gate line driver circuit, or the like), a circuit which supplies signals to a source signal line (also referred to as a source driver, a source line driver circuit, or the like), and the like are also examples of the drive device.

A display device, a semiconductor device, a lighting device, a cooling device, a light-emitting device, a reflective device, a drive device, and the like can be combined with each other, and such a device is included in an embodiment of the present invention. For example, a display device includes a semiconductor device and a light-emitting device in some cases. Alternatively, a semiconductor device includes a display device and a drive device in some cases.

In each of the above embodiments of the present invention, all circuits that are necessary to realize a predetermined function can be formed using the same substrate (e.g., a glass substrate, a plastic substrate, a single crystal substrate, or an SOI substrate). Thus, cost can be reduced by reduction in the number of components or reliability can be improved by reduction in the number of connections to circuit components.

It is possible not to form all the circuits that are necessary to realize the predetermined function over the same substrate. That is, some of the circuits which are necessary to realize the predetermined function can be formed using one substrate and some of the circuits which are necessary to realize the predetermined function can be formed using another substrate. For example, some of the circuits which are necessary to realize the predetermined function can be formed using a glass substrate and some of the circuits which are necessary to realize the predetermined function can be formed using a single crystal substrate (or an SOI substrate). The single crystal substrate over which some of the circuits which are necessary to realize the predetermined function (such a substrate is also referred to as an IC chip) can be connected to the glass substrate by COG (chip on glass), and the IC chip can be provided over the glass substrate. Alternatively, the IC chip can be connected to the glass substrate by TAB (tape automated bonding), COF (chip on film), SMT (surface mount technology), a printed circuit board, or the like.

In this specification, when it is explicitly described that "X and Y are connected", the case where X and Y are electrically connected, the case where X and Y are functionally connected, and the case where X and Y are directly connected are included therein. Here, each of X and Y is an object (e.g., a device, an element, a circuit, a wiring, an electrode, a terminal, a conductive film, or a layer). Therefore, another element may be interposed between elements having a connection relationship illustrated in drawings and texts, without limitation to a predetermined connection relationship, for example, the connection relationship illustrated in the drawings and the texts.

For example, in the case where X and Y are electrically connected, one or more elements which enable electrical connection between X and Y (e.g., a switch, a transistor, a capacitor, an inductor, a resistor, and/or a diode) can be connected between X and Y.

For example, in the case where X and Y are functionally connected, one or more circuits which enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing a potential level of a signal; a voltage source; a current source; a switching circuit; an amplifier circuit such as a circuit which can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

In this specification, when an object is explicitly described in a singular form, the object is preferably singular. Note that even in this case, the object can be plural. In a similar manner, when an object is explicitly described in a plural form, the object is preferably plural. Note that even in this case, the object can be singular.

The size, the thickness of layers, or regions in the drawings of this application are exaggerated for simplicity in some cases. Therefore, embodiments of the present invention are not limited to such scales illustrated in the drawings. The drawings are perspective views of ideal examples, and shapes or values are not limited to those illustrated in the drawings. For example, the following can be included: variation in shape due to a manufacturing technique; variation in shape due to an error; variation in signal, voltage, or current due to noise; variation in signal, voltage, or current due to a difference in timing: or the like.

Note that technical terms are used in order to describe a specific embodiment, example, or the like in many cases. However, one embodiment of the present invention should not be construed as being limited by the technical terms.

Note that terms which are not defined (including terms used for science and technology, such as technical terms or academic parlance) can be used as terms which have meaning equal to general meaning that an ordinary person skilled in the art understands. It is preferable that terms defined by dictionaries or the like be construed as consistent meaning with the background of related art.

Note that terms such as "first", "second", and "third" are used for distinguishing various elements, members, regions, layers, areas, and the like from others. Therefore, the terms such as "first", "second", and "third" do not limit the order and the number of the elements, members, regions, layers, areas, and the like. Further, for example, the term "first" can be replaced with the term "second", "third", or the like.

Terms for describing spatial arrangement, such as "over", "above", "under", "below", "laterally", "right", "left", "obliquely", "behind", "front", "inside", "outside", and "in" are used for briefly showing a relationship between an element and another element or between a feature and another feature with reference to a diagram. Note that embodiments of the present invention are not limited to the above usage, and such terms for describing spatial arrangement indicate not only the direction illustrated in a diagram but also another direction in some cases. For example, when it is explicitly described that "Y is over X", it does not necessarily mean that Y is placed over X, and can include the case where Y is placed under X because a structure in a diagram can be inverted or rotated by 180°. Therefore, the term "over" can refer to the direction described by the term "under" in addition to the direction described by the term "over". Note that embodiments of the present invention are not limited to this, and the term "over" can refer to any of the other directions described by the terms "laterally", "right", "left", "obliquely", "behind", "front", "inside", "outside", and "in" in addition to the directions described by the terms "over" and "under" because the device in the diagram can be rotated in a variety of directions. That is, the terms for describing spatial arrangement can be construed adequately depending on the situation.

Note that when it is explicitly described that "Y is formed on X" or "Y is formed over X", it does not necessarily mean that Y is formed in direct contact with X. The description includes the case where X and Y are not in direct contact with each other, i.e., the case where another object is interposed between X and Y. Here, each of X and Y is an object (e.g., a device, an element, a circuit, a wiring, an electrode, a terminal, a conductive film, or a layer).

Therefore, for example, when it is explicitly described that "a layer Y is formed on (or over) a layer X", it includes both the case where the layer Y is formed in direct contact with the layer X, and the case where another layer (e.g., a layer Z) is formed in direct contact with the layer X and the layer Y is formed in direct contact with the layer Z. Note that another layer (e.g., a layer Z) may be a single layer or a plurality of layers.

In a similar manner, when it is explicitly described that "Y is formed above X", it does not necessarily mean that Y is formed in direct contact with X, and another object may be interposed therebetween. Therefore, for example, when it is described that "a layer Y is formed above a layer X", it includes both the case where the layer Y is formed in direct contact with the layer X, and the case where another layer (e.g., a layer Z) is formed in direct contact with the layer X and the layer Y is formed in direct contact with the layer Z. Note that another layer (e.g., a layer Z) may be a single layer or a plurality of layers.

Note that when it is explicitly described that "Y is formed on X", "Y is formed over X", or "Y is formed above X", it includes the case where Y is formed obliquely over/above X.

Note that the same can be said when it is described that "Y is formed under X" or "Y is formed below X".

In one embodiment of the present invention, a first transistor, a second transistor, a first switch, a second switch, and a third switch are provided. A first terminal of the first transistor is connected to a first wiring. A second terminal of the first transistor is connected to a second wiring. A first terminal of the second transistor is connected to the first wiring. A second terminal of the second transistor is connected to a gate of the first transistor. A gate of the second transistor is connected to the first wiring. The first switch is connected between the second wiring and a third wiring. The second switch is connected between the second wiring and the third wiring. The third switch is connected between the gate of the first transistor and the third wiring.

Note that in one embodiment of the present invention, a first period and a second period can be provided. In the first period, the first to third switches can be turned off. Further, a potential of the first wiring can become an H level. In the second period, the first switch can be turned off, and the second and third switches can be turned on. Furthermore, the potential of the first wiring can become an L level.

In one embodiment of the present invention, deterioration can be suppressed in a semiconductor device including first and second transistors and first to third switches because the length of time during which the first and second transistors and the first to third switches are on or the number of times the first and second transistors and the first to third switches are turned on can be reduced. Alternatively, deterioration can be suppressed in a semiconductor device including first to fifth transistors because the length of time during which the first to fifth transistors are on or the number of times the first to fifth transistors are turned on can be reduced. Alternatively, in the semiconductor device further including a sixth transistor, deterioration can be suppressed because the length of time during which the first to sixth transistors are on or the number of times the first to sixth transistors are turned on can be reduced. Alternatively, in the semiconductor device further including a seventh transistor, deterioration can be suppressed because the length of time during which the first to seventh transistors are on or the number of times the first to seventh transistors are turned on can be reduced.

BRIEF DESCRIPTION OF THE DRAWINGS

In the accompanying drawings:

FIGS. 1A to 1D are a circuit diagram, a logic circuit, a logical expression, and a truth table in a semiconductor device in Embodiment 1;

FIGS. 5A to 5I are circuit diagrams of the semiconductor device in Embodiment 1;

FIGS. 13A to 13D are a circuit diagram, a logic circuit, a logical expression, and a truth table in the semiconductor device in Embodiment 1;

DETAILED DESCRIPTION OF THE INVENTION

Figure 2A:
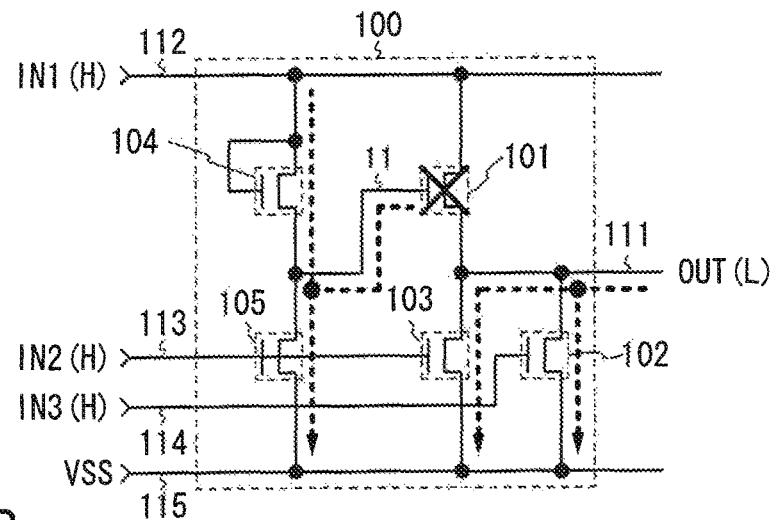
FIGS. 2A to 2C are schematic views for illustrating operation of the semiconductor device in Embodiment 1.

Hereinafter, embodiments will be described with reference to the drawings. Note that the embodiments can be implemented in various different ways and it will be readily appreciated by those skilled in the art that modes and details of the embodiments can be changed in various ways without departing from the spirit and scope of the present invention. Therefore, the present invention should not be construed as being limited to the following description of the embodiments. Note that in structures described below, the same portions or portions having similar functions are denoted by common reference numerals in different drawings, and description thereof is not repeated.

(Embodiment 1)

Figure 45A:
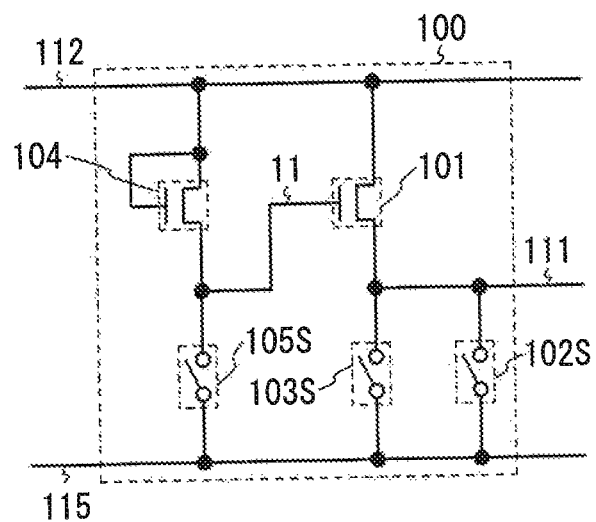
FIGS. 45A and 45B are circuit diagrams of the semiconductor device in Embodiment 1.

The structure of this embodiment is described with reference to FIG. 45A. FIG. 45A is a circuit diagram of a semiconductor device in this embodiment.

A circuit 100 includes a transistor 101 (a first transistor), a switch 102S (a first switch), a switch 103S (a second switch), a transistor 104 (a second transistor), and a switch 105S (a third switch).

Note that each of the transistor 101 and the transistor 104 is an n-channel transistor. The n-channel transistor is turned on when a potential difference ($V_{gs}$) between a gate and a source exceeds the threshold voltage ($V_{th}$). However, this embodiment is not limited to this. Each of the transistor 101 and the transistor 104 can be a p-channel transistor. The p-channel transistor is turned on when a potential difference ($V_{gs}$) between a gate and a source is lower than the threshold voltage ($V_{th}$).

A first terminal of the transistor 101 is connected to a wiring 112 (a first wiring). A second terminal of the transistor 101 is connected to a wiring 111 (a second wiring). The switches 102S and 103S are connected between the wiring 111 and a wiring 115 (a third wiring). A first terminal of the transistor 104 is connected to the wiring 112. A second terminal of the transistor 104 is connected to a gate of the transistor 101. A gate of the transistor 104 is connected to the wiring 112. The switch 105S is connected between the wiring 115 and the gate of the transistor 101.

Figure 45B:
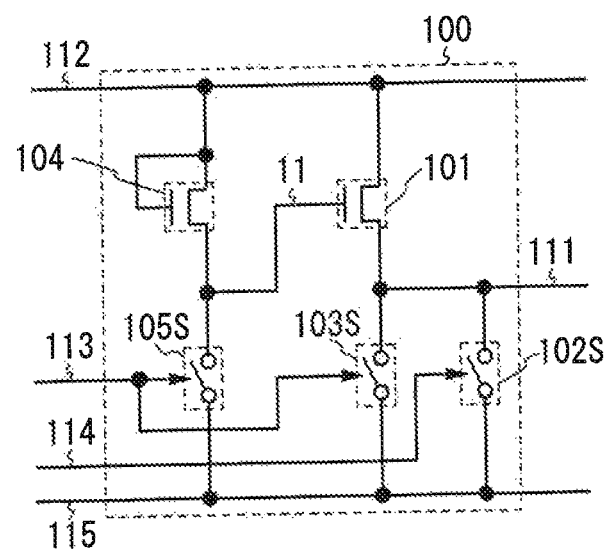

Note that each of the switch 102S, the switch 103S, and the switch 105S can have a control terminal FIG. 45B illustrates a structure in the case where a control terminal of the switch 102S is connected to a wiring 114 (a fourth wiring) and a control terminal of the switch 103S and a control terminal of the switch 105S are connected to a wiring 113 (a fifth wiring).

Note that transistors can be used as the switch 102S, the switch 103S, and the switch 105S. In FIG. 1A, transistors are used as switches. An example where a transistor 102 (a third transistor), a transistor 103 (a fourth transistor), and a transistor 105 (a fifth transistor) are used as the switch 102S, the switch 103S, and the switch 105S, respectively, is described. A first terminal of the transistor 102 is connected to the wiring 115. A second terminal of the transistor 102 is connected to the wiring 111. A gate of the transistor 102 is connected to the wiring 114. A first terminal of the transistor 103 is connected to the wiring 115. A second terminal of the transistor 103 is connected to the wiring 111. A gate of the transistor 103 is connected to the wiring 113. A first terminal of the transistor 105 is connected to the wiring 115. A second terminal of the transistor 105 is connected to the gate of the transistor 101. A gate of the transistor 105 is connected to the wiring 113.

Note that each of the transistor 102, the transistor 103, and the transistor 105 is an re-channel transistor like the transistor 101. However, each of the transistor 102, the transistor 103, and the transistor 105 may be a p-channel transistor.

Note that a portion where the gate of the transistor 101 and the second terminal of the transistor 104 are connected to each other or a portion where the gate of the transistor 101 and the second terminal of the transistor 105 are connected to each other is denoted by a node 11.

Next, examples of signals or voltages which are input to or output from the wirings 111 to 115 and the functions of these wirings are described.

A signal OUT is output from the wiring 111.

A signal IN1 is input to the wiring 112. A signal IN2 is input to the wiring 113. A signal IN3 is input to the wiring 114.

A voltage $V_1$ is supplied to the wiring 115. The voltage $V_1$ is power supply voltage, reference voltage, ground voltage, a ground, or negative power supply voltage. Note that this embodiment is not limited to this. A signal (e.g., a clock signal or an inverted clock signal) may be input to the wiring 115.

An L-level signal, an L signal, an L-level potential, the voltage $V_1$, or the like has a potential of approximately $V_1$. An H-level signal, an H signal, an H-level potential, a voltage $V_2$, or the like has a potential of approximately $V_2$ ($V_2 > V_1$). Note that the term "approximately" is used in consideration of various kinds of variation such as variation due to noise, variation due to process variation, variation due to steps of manufacturing an element, and/or measurement deviation (the same can be said hereinafter).

For example, when a gate of a transistor is connected to a node and a potential of the node becomes an L level, the transistor is turned off (or on). In this case, the case where the potential of the node becomes an L level means that the transistor can be turned off (or on) with the potential of the node. Alternatively, the case where the potential of the node becomes an L level means that gate-source voltage ($V_{gs}$) of the transistor can be lowered (or raised) so that a circuit including the transistor can conduct predetermined operation with the potential of the node.

Note that when a clock signal is used as each of the signals IN1 to IN3, the clock signal can be either a balanced signal or an unbalanced signal. A balanced signal is a signal whose period during which the signal is at an H level and whose period during which the signal is at an L level in one cycle have approximately the same length. An unbalanced signal is a signal whose period during which the signal is at an H level and whose period during which the signal is at an L level in one cycle have different lengths.

For example, a clock signal is used as the signal IN1, a signal which is approximately 180° out of phase from the signal IN1 is used as the signal IN2, and the signal IN1 and the signal IN2 are unbalanced. In this case, the signal IN2 is not a signal obtained by inversion of the signal IN1 in some cases.

Here, as illustrated in FIG. 5A, signals or voltages are supplied from a circuit 150 to the wirings 112 to 115. The circuit 150 generates signals, voltages, or the like and supplies the signals or voltages to the wirings 112 to 115.

The circuit 150 can include circuits 151 to 154. The circuit 151 has a function of generating a signal or voltage and supplying it to the wiring 112. The circuit 152 has a function of generating a signal or voltage and supplying it to the wiring 113. The circuit 153 has a function of generating a signal or voltage and supplying it to the wiring 114. The circuit 154 has a function of generating a signal or voltage and supplying it to the wiring 115.

The circuits 150 to 154 include an amplifier circuit in FIG. 5B, a bipolar transistor in FIG. 5C, a MOS transistor in FIG. 5D, a capacitor in FIG. 5E, an inverter in FIG. 5F, a DC voltage source in FIG. 5G, an AC voltage source in FIG. 5H, and/or a direct current source in FIG. 5I, for example.

As illustrated in FIG. 5A, a protection circuit 160 is connected to the wirings 112 to 114.

Next, the functions of the circuit 100 and the transistors 101 to 105 are described.

The circuit 100 has a function of controlling a potential of the wiring 111. Alternatively, the circuit 100 has a function of controlling timing of supplying a potential of the wiring 112, a potential of the wiring 113, a potential of the wiring 114, or a potential of the wiring 115 to the wiring 111. Alternatively, the circuit 100 has a function of controlling timing of supplying a signal or voltage to the wiring 111. Alternatively, the circuit 100 has a function of controlling timing of supplying an H-level signal or the voltage $V_2$ to the wiring 111. Alternatively, the circuit 100 has a function of controlling timing of supplying an L-level signal or the voltage $V_1$ to the wiring 111. Alternatively, the circuit 100 has a function of controlling timing of raising the potential of the wiring 111. Alternatively, the circuit 100 has a function of controlling timing of lowering the potential of the wiring 111. Alternatively, the circuit 100 has a function of controlling timing of keeping the potential of the wiring 111. As described above, the circuit 100 functions as a control circuit. Note that the circuit 100 does not need to have all the above functions. The circuit 100 is controlled in response to the signals IN1 to IN3.

Note that the circuit 100 functions as a logic circuit including an AND, as illustrated in FIG. 1B. Specifically, the circuit 100 functions as a logic circuit where a three-input AND is combined with two NOTs. The signal IN1 is input to a first input terminal of the AND. A signal obtained by inversion of the signal IN2 with a first NOT is input to a second input terminal of the AND. A signal obtained by inversion of the signal IN3 with a second NOT is input to a third input terminal of the AND. The signal OUT is output from an output of the AND. In other words, the circuit 100 has a function of realizing a logical expression illustrated in FIG. 1C or a function of realizing a truth table illustrated in FIG. 1D.

The transistor 101 has a function of controlling conduction between the wiring 112 and the wiring 111. Alternatively, the transistor 101 has a function of controlling timing of supplying the potential of the wiring 112 to the wiring 111. Alternatively, the transistor 101 has a function of controlling timing of supplying a signal or voltage which is to be input to the wiring 112 to the wiring 111 when the signal or voltage is input to the wiring 112. Alternatively, the transistor 101 has a function of controlling timing of supplying an H-level signal or the voltage $V_2$ to the wiring 111. Alternatively, the transistor 101 has a function of controlling timing of supplying an L-level signal or the voltage $V_1$ to the wiring 111. Alternatively, the transistor 101 has a function of controlling timing of raising the potential of the wiring 111. Alternatively, the transistor 101 has a function of controlling timing of lowering the potential of the wiring 111. Alternatively, the transistor 101 has a function of performing bootstrap operation. Alternatively, the transistor 101 has a function of raising a potential of the node 11 by bootstrap operation. As described above, the transistor 101 functions as a switch or a buffer. Note that the transistor 101 does not need to have all the above functions.

The transistor 102 has a function of controlling conduction between the wiring 115 and the wiring 111. Alternatively, the transistor 102 has a function of controlling timing of supplying the potential of the wiring 115 to the wiring 111. Alternatively, the transistor 102 has a function of controlling timing of supplying a signal or voltage which is to be input to the wiring 115 to the wiring 111 when the signal or voltage is input to the wiring 115. Alternatively, the transistor 102 has a function of controlling timing of supplying an L-level signal or the voltage $V_1$ to the wiring 111. Alternatively, the transistor 102 has a function of controlling timing of lowering the potential of the wiring 111. As described above, the transistor 102 functions as a switch. Note that the transistor 102 does not need to have all the above functions. The transistor 102 can be controlled by the potential of the wiring 114 (the signal IN3).

The transistor 103 has a function of controlling conduction between the wiring 115 and the wiring 111. Alternatively, the transistor 103 has a function of controlling timing of supplying the potential of the wiring 115 to the wiring 111. Alternatively, the transistor 103 has a function of controlling timing of supplying a signal or voltage which is to be input to the wiring 115 to the wiring 111 when the signal or voltage is input to the wiring 115. Alternatively, the transistor 103 has a function of controlling timing of supplying an L-level signal or the voltage $V_1$ to the wiring 111. Alternatively, the transistor 103 has a function of controlling timing of lowering the potential of the wiring 111. As described above, the transistor 103 functions as a switch. Note that the transistor 103 does not need to have all the above functions. The transistor 103 can be controlled by the potential of the wiring 113 (the signal IN2).

The transistor 104 has a function of controlling conduction between the wiring 112 and the node 11. Alternatively, the transistor 104 has a function of controlling timing of supplying the potential of the wiring 112 to the node 11. Alternatively, the transistor 104 has a function of controlling timing of supplying a signal or voltage which is to be input to the wiring 112 to the node 11 when the signal or voltage is input to the wiring 112. Alternatively, the transistor 104 has a function of controlling timing of supplying an H-level signal or the voltage $V_2$ to the node 11. Alternatively, the transistor 104 has a function of controlling timing of raising the potential of the node 11. Alternatively, the transistor 104 has a function of making the node 11 be in a floating state. As described above, the transistor 104 functions as a switch, a diode, a diode-connected transistor, or the like. Note that the transistor 104 does not need to have all the above functions. The transistor 104 can be controlled by the potential of the wiring 112 (the signal IN1) and/or the potential of the node 11.

The transistor 105 has a function of controlling conduction between the wiring 115 and the node 11. Alternatively, the transistor 105 has a function of controlling timing of supplying the potential of the wiring 115 to the node 11. Alternatively, the transistor 105 has a function of controlling timing of supplying a signal or voltage which is to be input to the wiring 115 to the node 11 when the signal or voltage is input to the wiring 115. Alternatively, the transistor 105 has a function of controlling timing of supplying an L-level signal or the voltage $V_1$ to the node 11. Alternatively, the transistor 105 has a function of controlling timing of lowering the potential of the node 11. As described above, the transistor 105 functions as a switch. Note that the transistor 105 does not need to have all the above functions. The transistor 105 can be controlled by the potential of the wiring 113 (the signal IN2).

Next, the operation of the circuit 100 is described with reference to the truth table (also referred to as the operation table) in FIG. 1D. FIG. 1D illustrates a truth table when the signals IN1 to IN3 are digital signals. Therefore, there are eight combinations of the H levels and L levels of the signals IN1 to IN3. That is, the circuit 100 can perform at least eight patterns of operation. Here, the eight patterns of the operation are described.

Note that the circuit 100 does not need to perform all the eight patterns of the operation and can selectively perform some of the patterns of the operation. The circuit 100 can perform operation other than the eight patterns of the operation. For example, in the case where each of the signals IN1 to IN3 has three or more values or is an analog signal, the circuit 100 can perform different operation in addition to the eight patterns of the operation.

First, first operation of the circuit 100 is described with reference to FIG. 2A. Since the signal IN2 becomes an H level, the transistor 105 is turned on. Then, the wiring 115 and the node 11 are brought into conduction, so that the potential of the wiring 115 (e.g., the voltage $V_1$) is supplied to the node 11. In this case, since the signal IN1 is set at an H level, the transistor 104 is turned on. Then, the wiring 112 and the node 11 are brought into conduction, so that the potential of the wiring 112 (e.g., the signal IN1 at an H level) is supplied to the node 11. That is, the potential of the wiring 115 (e.g., the voltage $V_1$) and the potential of the wiring 112 (e.g., the signal IN1 at an H level) are supplied to the node 11. Here, the channel width of the transistor 105 is larger than the channel width of the transistor 104. Thus, the potential of the node 11 becomes an L level. The potential of the node 11 in this case is higher than $V_1$ and lower than $V_1+V_{th}101$ ($V_{th}101$ is the threshold voltage of the transistor 101). Accordingly, the transistor 101 is turned off, so that the wiring 112 and the wiring 111 are brought out of conduction.

Then, the signal IN2 is set at an H level, so that the transistor 103 is turned on. In this case, since the signal IN3 is set at an H level, the transistor 102 is turned on. After that, the wiring 115 and the wiring 111 are brought into conduction, so that the potential of the wiring 115 (e.g., the voltage $V_1$) is supplied to the wiring 111. Thus, the potential of the wiring 111 becomes $V_1$, so that the signal OUT is set at an L level.

Note that description "the channel width of a transistor A is larger than the channel width of a transistor B" can be replaced with description "1/W (W represents channel width) of the transistor A is smaller than 1/W of the transistor B", "L (L represents channel length) of the transistor A is smaller than L of the transistor B", "1/L of the transistor A is larger than 1/L of the transistor B", "W/L of the transistor A is larger than W/L of the transistor B", "$V_{gs}$ ($V_{gs}$ represents a potential difference between a gate and a source) of the transistor A is higher than $V_{gs}$ of the transistor B", or the like. In the case where the transistor has a multi-gate structure and has a plurality of gates, the description "the channel width of a transistor A is larger than the channel width of a transistor B" can be replaced with description "the number of gates of the transistor A is smaller than the number of gates of the transistor B" or "the reciprocal of the number of gates of the transistor A is larger than the reciprocal of the number of gates of the transistor B".

Figure 2B:
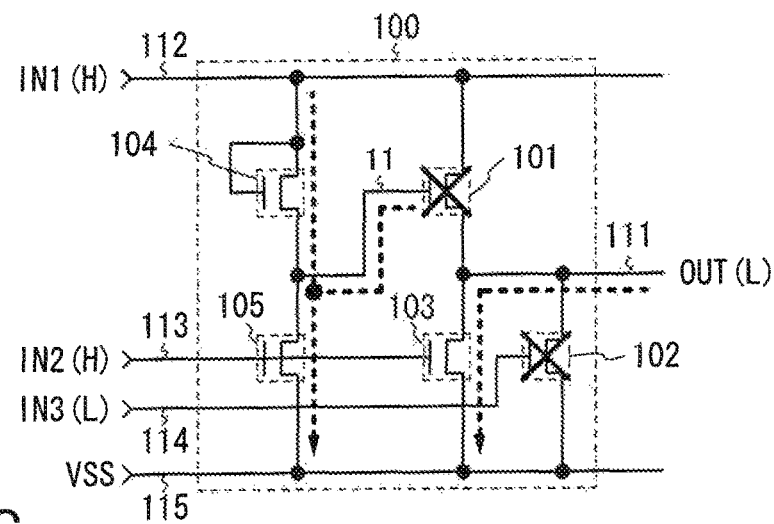

Next, second operation of the circuit 100 is described with reference to FIG. 2B. The second operation differs from the first operation in that the signal IN3 is set at an L level. Thus, the signal IN3 becomes an L level, so that the transistor 102 is turned off. Note that although the transistor 102 is turned off, the transistor 103 is turned on as in the first operation. In other words, the wiring 115 and the wiring 111 are brought into conduction as in the first operation, so that the potential of the wiring 115 (e.g., the voltage $V_1$) is supplied to the wiring 111. Thus, the potential of the wiring 111 becomes $V_1$, so that the signal OUT is set at an L level.

Figure 2C:
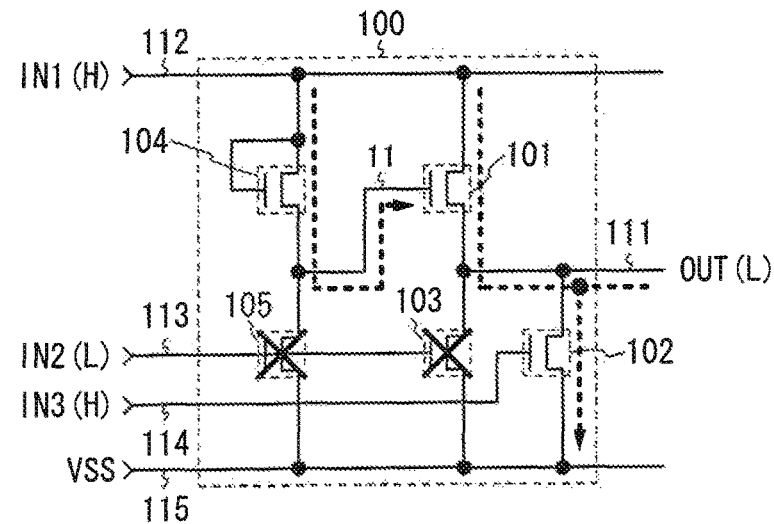

Next, third operation of the circuit 100 is described with reference to FIG. 2C. Since the signal IN2 is set at an L level, the transistor 105 is turned off. Then, the wiring 115 and the node 11 are brought out of conduction. In this case, since the signal IN1 is set at an H level, the transistor 104 is turned on. Then, the wiring 112 and the node 11 are brought into conduction, so that the potential of the wiring 112 (e.g., the signal IN1 at an H level) is supplied to the node 11. That is, the potential of the wiring 112 (e.g., the signal IN1 at an H level) is supplied to the node 11. Then, the potential of the node 11 starts to rise. When the potential of the node 11 becomes $V_1+V_{th}101+V_a$ ($V_a$ is positive voltage), the transistor 101 is turned on. After that, the wiring 112 and the wiring 111 are brought into conduction, so that the potential of the wiring 112 (e.g., the signal IN1 at an H level) is supplied to the wiring 111. Then, the potential of the node 11 continuously rises. When the potential of the node 11 becomes $V_2-V_{th}104$ ($V_{th}104$ is the threshold voltage of the transistor 104), the transistor 104 is turned off. Then, the wiring 112 and the node 11 are brought out of conduction. Accordingly, the node 11 is made to be in a floating state while keeping its potential at $V_2-V_{th}104$.

Then, the signal IN2 is set at an L level, so that the transistor 103 is turned off. In this case, since the signal IN3 is set at an H level, the transistor 102 is turned on. After that, the wiring 115 and the wiring 111 are brought into conduction, so that the potential of the wiring 115 (e.g., the voltage $V_1$) is supplied to the wiring 111. That is, the potential of the wiring 115 (e.g., the voltage $V_1$) and the potential of the wiring 112 (e.g., the signal IN1 at an H level) are supplied to the wiring 111. Here, the channel width of the transistor 102 is larger than the channel width of the transistor 101. Thus, the potential of the wiring 111 becomes an L level. The potential of the wiring 111 in this case is lower than the sum of the voltage $V_1$ and the threshold voltage of one of the transistors 101 to 105. Accordingly, the potential of the wiring 111 becomes an L level, so that the signal OUT is set at an L level.

Figure 3A:
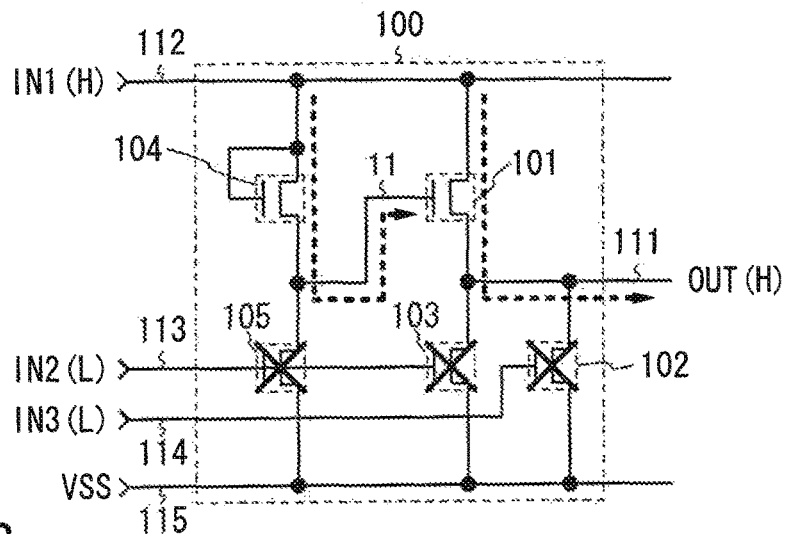
FIGS. 3A to 3C are schematic views for illustrating operation of the semiconductor device in Embodiment 1.

Next, fourth operation of the circuit 100 is described with reference to FIG. 3A. The fourth operation differs from the third operation in that the signal IN3 is set at an L level. Thus, the signal IN3 is set at an L level, so that the transistor 102 is turned off. In this case, the transistor 103 is also turned off, so that the wiring 115 and the wiring 111 are brought out of conduction. That is, the potential of the wiring 112 (e.g., the signal IN1 at an H level) is supplied to the wiring 111. Thus, the potential of the wiring 111 starts to rise. In this case, the node 11 is in a floating state. Then, the potential of the node 11 is raised by capacitive coupling between the gate and the second terminal of the transistor 101. Accordingly, the potential of the node 11 becomes $V_2+V_{th}101+V_a$. This is so-called bootstrap operation. Thus, the potential of the wiring 111 becomes $V_2$, so that the signal OUT is set at an H level.

Figure 3B:
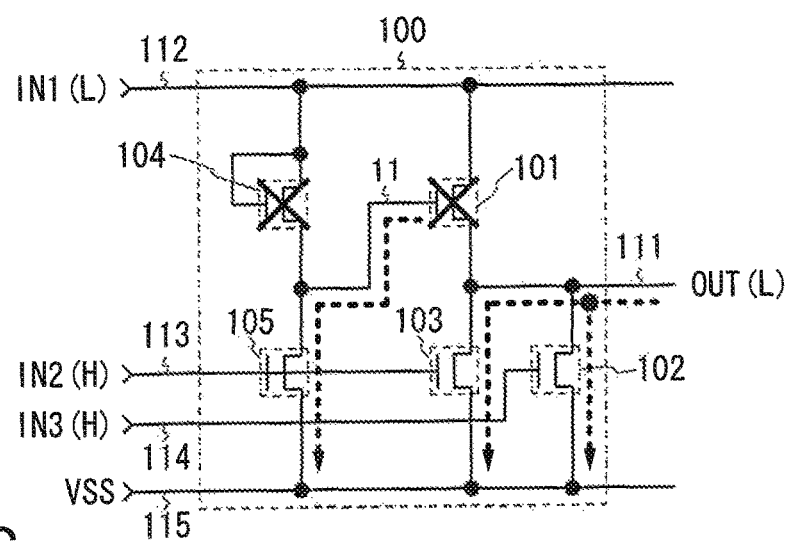

Next, fifth operation of the circuit 100 is described with reference to FIG. 3B. Since the signal IN2 is set at an H level, the transistor 105 is turned on. Then, the wiring 115 and the node 11 are brought into conduction, so that the potential of the wiring 115 (e.g., the voltage $V_1$) is supplied to the node 11. In this case, since the signal IN1 is set at an L level, the transistor 104 is turned off. Then, the wiring 112 and the node 11 are brought out of conduction. That is, the potential of the wiring 115 (e.g., the voltage $V_1$) is supplied to the node 11. Thus, the potential of the node 11 becomes $V_1$. Then, the transistor 101 is turned off, so that the wiring 112 and the wiring 111 are brought out of conduction.

Then, the signal IN2 is set at an H level, so that the transistor 103 is turned on. In this case, since the signal IN3 is set at an H level, the transistor 102 is turned on. After that, the wiring 115 and the wiring 111 are brought into conduction, so that the potential of the wiring 115 (e.g., the voltage $V_1$) is supplied to the wiring 111. Thus, the potential of the wiring 111 becomes $V_1$, so that the signal OUT is set at an L level.

Figure 3C:
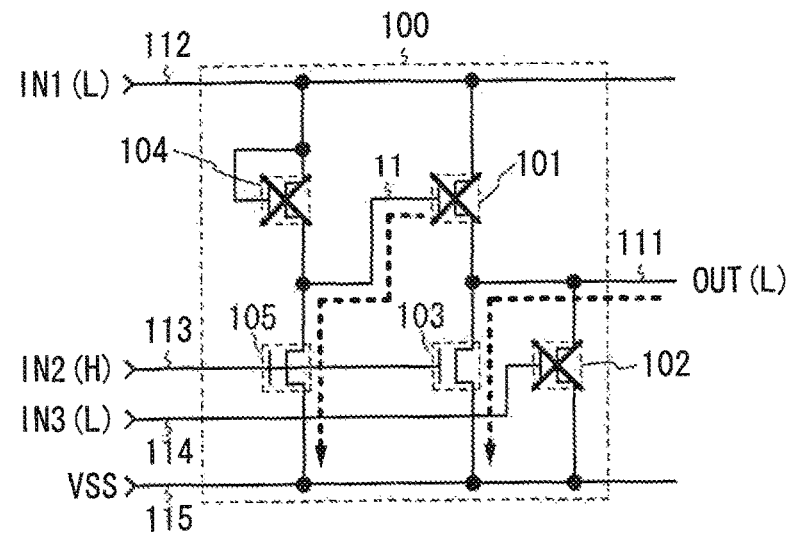

Next, sixth operation of the circuit 100 is described with reference to FIG. 3C. The sixth operation differs from the fifth operation in that the signal IN3 is set at an L level. Thus, the signal IN3 is set at an L level, so that the transistor 102 is turned off. Note that although the transistor 102 is turned off, the transistor 103 is turned on as in the fifth operation. In other words, the wiring 115 and the wiring 111 are brought into conduction as in the fifth operation, so that the potential of the wiring 115 (e.g., the voltage $V_1$) is supplied to the wiring 111. Thus, the potential of the wiring 111 becomes $V_1$, so that the signal OUT is set at an L level.

Figure 4A:
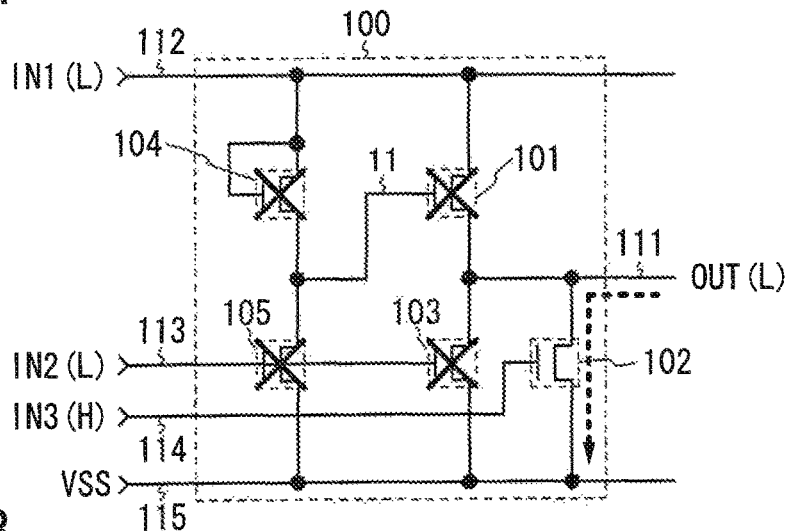
FIGS. 4A to 4C are schematic views for illustrating operation of the semiconductor device in Embodiment 1.

Next, seventh operation of the circuit 100 is described with reference to FIG. 4A. Since the signal IN2 is set at an L level, the transistor 105 is turned off. Then, the wiring 115 and the node 11 are brought out of conduction. In this case, since the signal IN1 is set at an L level, the transistor 104 is turned off. Then, the wiring 112 and the node 11 are brought out of conduction. That is, since the node 11 is made to be in a floating state, the potential in the previous state is held. Here, the potential of the node 11 is lower than $V_1+V_{th}101$. Thus, the transistor 101 is turned off, so that the wiring 112 and the wiring 111 are brought out of conduction.

Then, the signal IN2 is set at an L level, so that the transistor 103 is turned off. In this case, since the signal IN3 is set at an H level, the transistor 102 is turned on. After that, the wiring 115 and the wiring 111 are brought into conduction, so that the potential of the wiring 115 (e.g., the voltage $V_1$) is supplied to the wiring 111. Thus, the potential of the wiring 111 becomes $V_1$, so that the signal OUT is set at an L level.

Figure 4B:
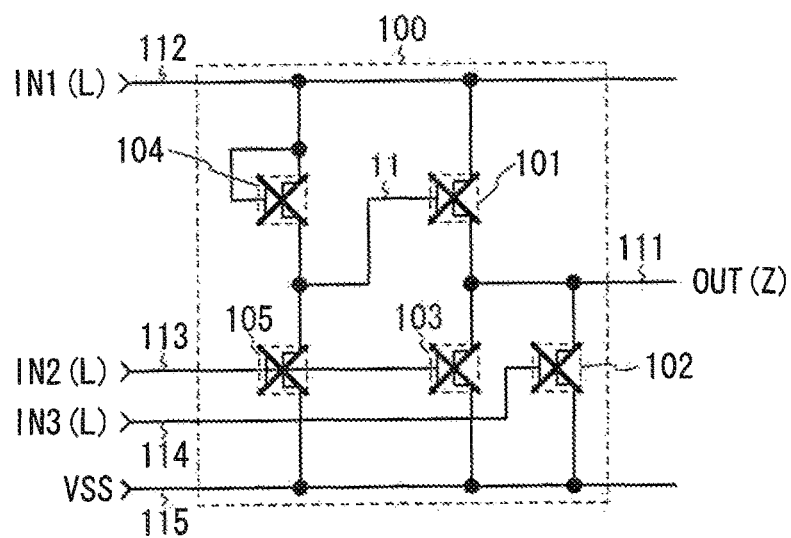

Next, eighth operation of the circuit 100 is described with reference to FIG. 4B. The eighth operation differs from the seventh operation in that the signal IN3 is set at an L level. Thus, the signal IN3 is set at an L level, so that the transistor 102 is turned off. In this case, the transistor 103 is also turned off, so that the wiring 115 and the wiring 111 are brought out of conduction. That is, the wiring 111 is made to be in an indefinite state Z (a floating state or a high impedance state). Therefore, when the potential does not fluctuate due to noise or the like, the potential of the wiring 111 is kept at the level in the previous state. Thus, for example, when a preceding operation of the eighth operation is one of the first operation, the second operation, the third operation, the fifth operation, the sixth operation, and the seventh operation, the signal OUT is set at an L level. Alternatively, for example, when the preceding operation of the eighth operation is the fourth operation, the signal OUT is set at an H level.

As described above, the transistors 101 to 105 are turned off in any of the first to eighth operations. Thus, the length of time during which the transistors are on or the number of times the transistors are on can be reduced, so that deterioration of the transistors can be suppressed. Accordingly, deterioration in characteristics (e.g., the increase in the threshold voltage or the decrease in mobility) of the transistors can be suppressed.

Alternatively, since deterioration of the transistors can be suppressed or all the transistors that are included in the circuit 100 can be n-channel transistors, a material which deteriorates more easily than a single crystal semiconductor (e.g., a non-single-crystal semiconductor such as an amorphous semiconductor or a microcrystalline semiconductor, an organic semiconductor, or an oxide semiconductor) can be used for semiconductor layers of the transistors. Therefore, the number of steps can be reduced, yield can be increased, and/or manufacturing cost can be reduced, for example Alternatively, for example, when the semiconductor device of this embodiment is used for a display device, the display device can be made large.

Alternatively, it is not necessary to make the channel widths of the transistors large considering the case where the transistors deteriorate. Alternatively, since $V_{gs}$ of the transistors can be made high by bootstrap operation, the channel widths of the transistors can be made small. Alternatively, since the amplitude of an output signal can be the same as that of power supply voltage or a signal, the amplitude of the output signal can be increased. Therefore, the channel width of a transistor which is controlled with the output signal can be made small. In other words, since the channel width of the transistor can be made small, the area of a channel of the transistor can be decreased.

Alternatively, since the area of the channel of the transistor can be decreased, a layout area can be decreased. Accordingly, for example, when the semiconductor device of this embodiment is used for a display device, the display device can have higher resolution or the frame of the display device can be narrowed.

Alternatively, since the area of the channel of the transistor can be decreased, the area of a portion where a material used for a gate and a semiconductor layer overlap with each other with an insulating layer therebetween can be decreased. Accordingly, short-circuit between the material used for the gate and the semiconductor layer can be suppressed. Thus, variation in output signals can be reduced, malfunctions can be prevented, and/or yield can be increased, for example Alternatively, all the transistors can be n-channel transistors or p-channel transistors. Therefore, reduction in the number of steps, improvement in yield, improvement in reliability, or reduction in cost can be achieved more efficiently as compared to a CMOS circuit. In particular, when all the transistors are n-channel transistors, a non-single-crystal semiconductor such as an amorphous semiconductor or a microcrystalline semiconductor, an organic semiconductor, or an oxide semiconductor can be used for semiconductor layers of the transistors. Transistors including such semiconductor layers easily deteriorate. However, in the semiconductor device of this embodiment, deterioration of the transistors can be suppressed.

Next, in addition to the first to eighth operations, operation which can be performed by the circuit 100 is described.

First, by making the channel width of the transistor 104 larger than the channel width of the transistor 105 in the first operation and the second operation, the transistor 101 can be turned on. Then, the wiring 112 and the wiring 111 are brought into conduction, so that the potential of the wiring 112 (e.g., the signal IN1 at an H level) is supplied to the wiring 111. That is, the potential of the wiring 115 (e.g., the voltage $V_1$) and the potential of the wiring 112 (e.g., the signal IN1 at an H level) are supplied to the wiring 111. In this case, by decreasing the current supply capability of the transistor 101 and making the potential of the wiring 111 slightly higher than $V_1$, the signal OUT can be set at an L level. Therefore, it is preferable that the channel width of the transistor 101 be smaller than the channel width of the transistor 102 or the channel width of the transistor 103. Alternatively, it is preferable that $V_{gs}$ of the transistor 101 be lower than $V_2-V_1$. It is much preferable that $V_{gs}$ of the transistor 101 be lower than $(V_2-V_1)\times\frac{1}{2}$. For example, by controlling $V_{gs}$ of the transistor 101, analog voltage can be output from the wiring 111. That is, the circuit 100 can function as an analog buffer, an amplifier circuit, or the like. As another example, by making the channel width of the transistor 101 larger than the sum of the channel width of the transistor 102 and the channel width of the transistor 103, the signal OUT can be set at an H level.

Figure 4C:
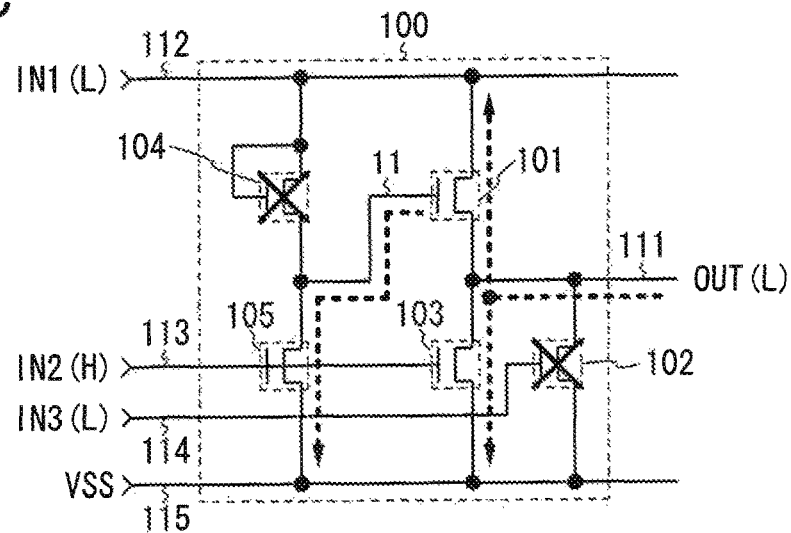

Next, the signal IN1 is changed from an H level to an L level and the signal IN2 is changed from an L level to an H level, so that the operation is changed from the fourth operation to the sixth operation. In this case, as illustrated in FIG. 4C, by making the transistor 101 on for a period of time in the sixth operation, the potential of the wiring 112 (e.g., the signal IN1 at an L level) can be supplied to the wiring 111. Accordingly, the fall time of the signal OUT can be shortened. In order to realize this, timing of when the transistor 101 is turned off can be delayed as compared to timing of when the signal IN1 is set at an L level. Alternatively, timing of when the signal IN2 is set at an H level can be delayed as compared to the timing of when the signal IN1 is set at an L level. Alternatively, distortion in the signal IN2 can be greater than that in the signal IN1. Alternatively, the channel width of the transistor 105 can be smaller than the channel width of the transistor 103. Alternatively, one of electrodes of a capacitor can be connected to the node 11. The other of the electrodes of the capacitor can be connected to a power supply line or a signal line (e.g., the wiring 115 or the wiring 111). The capacitor can be parasitic capacitance of a transistor (e.g., the transistor 101, the transistor 104, or the transistor 105). Alternatively, a signal can be supplied to the wiring 113 from a circuit which is formed over the same substrate as the circuit 100.

Next, in the seventh operation and the eighth operation, the potential of the node 11 can be $V_1+V_{th}+V_a$. In this case, since the transistor 101 is turned on, the wiring 112 and the wiring 111 are brought into conduction. Then, the potential of the wiring 112 (e.g., the signal IN1 at an L level) is supplied to the wiring 111. Accordingly, the potential of the wiring 111 can be fixed at a certain potential especially in the eighth operation, so that the circuit does not easily malfunction.

As described above, in addition to the first to eighth operations, the semiconductor device of this embodiment can perform a variety of operations.

Next, the ratio of the channel widths of the transistors 101 to 105 is described.

A load driven by the transistors 104 and 105 (e.g., the gate of the transistor 101) is smaller than a load driven by the transistors 101 to 103 (e.g., a load connected to the wiring 111 (e.g., a gate of the transistor)). Therefore, the channel width of the transistor 104 can be smaller than the channel width of the transistor 101, the channel width of the transistor 102, and/or the channel width of the transistor 103. Alternatively, the channel width of the transistor 105 can be smaller than the channel width of the transistor 101, the channel width of the transistor 102, and/or the channel width of the transistor 103. In such a case, the channel width of the transistor 101 is preferably 20 times or less the channel width of the transistor 104. More preferably, the channel width of the transistor 101 is ten times or less the channel width of the transistor 104. Further preferably, the channel width of the transistor 101 is seven times or less the channel width of the transistor 104. The channel width of the transistor 101 is preferably ten times or less the channel width of the transistor 105. More preferably, the channel width of the transistor 101 is five times or less the channel width of the transistor 105. Further preferably, the channel width of the transistor 101 is three times or less the channel width of the transistor 105.

Next, in the case where the signal OUT is set at an L level, the potential of the wiring 115 (e.g., the voltage $V_1$) is supplied to the wiring 111 through the transistor 102 and the transistor 103 in some cases. In contrast, in the case where the signal OUT is set at an H level, the potential of the wiring 112 (e.g., the signal IN1 at an H level) is supplied to the wiring 111 through the transistor 101 in some cases. Therefore, the channel width of the transistor 101 can be smaller than the channel width of the transistor 102 and/or the channel width of the transistor 103. In such a case, the channel width of the transistor 101 is preferably three times or less the channel width of the transistor 102 or the channel width of the transistor 103. More preferably, the channel width of the transistor 101 is twice or less the channel width of the transistor 102 or the channel width of the transistor 103.

Next, the signal IN1 is set at an H level and the transistor 101 is turned on. At this time, the transistor 102 or the transistor 103 is turned on. In this case, in order to set the potential of the wiring 111 at an L level, the channel width of the transistor 102 can be larger than the channel width of the transistor 101. Alternatively, the channel width of the transistor 103 can be larger than the channel width of the transistor 101. In such a case, the channel width of the transistor 101 is preferably the same as or smaller than the channel width of the transistor 102 or the channel width of the transistor 103. More preferably, the channel width of the transistor 101 is 0.7 times or less the channel width of the transistor 102 or the channel width of the transistor 103.

Note that the signal IN1 is set at an H level and the transistor 101 is turned on. In this case, although the transistor 103 is turned on, the transistor 102 is not likely to be turned on. Thus, the channel width of the transistor 103 can be smaller than the channel width of the transistor 102.

Then, by turning on the transistor 104 and the transistor 105 in the first operation and the second operation, the potential of the wiring 115 (e.g., the voltage $V_1$) and the potential of the wiring 112 (e.g., the signal IN1 at an H level) are supplied to the node 11. Therefore, as described above, in order to set the potential of the node 11 at an L level, the channel width of the transistor 105 can be larger than the channel width of the transistor 104. In such a case, the channel width of the transistor 105 is preferably 15 times or less the channel width of the transistor 104. More preferably, the channel width of the transistor 105 is ten times or less the channel width of the transistor 104. Further preferably, the channel width of the transistor 105 is eight times or less the channel width of the transistor 104. For example, by making the channel length of the transistor 104 larger than the channel length of the transistor 105, W/L of the transistor 105 can be larger than W/L of the transistor 104. In such a case, the channel length of the transistor 104 is preferably nine times or less the channel length of the transistor 105. More preferably, the channel length of the transistor 104 is six times or less the channel length of the transistor 105. Further preferably, the channel length of the transistor 104 is three times or less the channel length of the transistor 105.

As described above, the ratio of the channel widths of the transistors is preferably set to an appropriate ratio. Note that considering the ratio of the size of the transistors, the channel width of the transistor 101 is preferably 100 to 1000 μm. More preferably, the channel width of the transistor 101 is 100 to 300 μm or 500 to 800 μm. The channel width of the transistor 102 or the channel width of the transistor 103 is preferably 100 to 1500 μm. More preferably, the channel width of the transistor 102 or the channel width of the transistor 103 is 100 to 300 μm or 700 to 1200 μm. The channel width of the transistor 104 is preferably 10 to 300 μm. More preferably, the channel width of the transistor 104 is 20 to 100 μm. The channel width of the transistor 105 is preferably 30 to 500 μm. More preferably, the channel width of the transistor 105 is 50 to 150 μm.

Next, a semiconductor device with a structure which is different from that in FIG. 1A is described.

In the structure in FIG. 1A, the first terminal of the transistor 105 can be connected to a wiring which is different from the wiring 115 (e.g., the wiring 112). Further, the gate of the transistor 105 can be connected to a wiring which is different from the wiring 113 (e.g., the wiring 111, a wiring 116, or the node 11).

Note that the voltage $V_2$ can be supplied to the wiring 116. Thus, the wiring 116 can function as a power supply line. For example, a signal can be input to the wiring 116. Thus, the wiring 116 can function as a signal line.

Figure 6A:
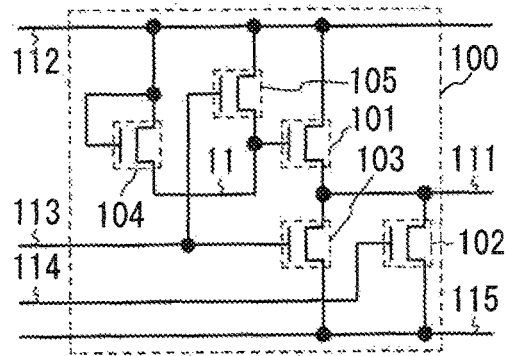
FIGS. 6A to 6F are circuit diagrams of the semiconductor device in Embodiment 1.

FIG. 6A illustrates a structure where the first terminal of the transistor 105 is connected to the wiring 112 in the semiconductor device in FIG. 1A. An H-level signal can be supplied to the first terminal of the transistor 105. Thus, a reverse bias can be applied to the transistor 105, so that deterioration of the transistor 105 can be suppressed.

Figure 6B:
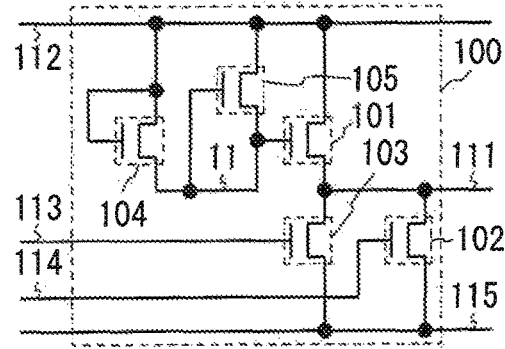

FIG. 6B illustrates a structure where the first terminal of the transistor 105 is connected to the wiring 112 and the gate of the transistor 105 is connected to node 11 in the semiconductor device in FIG. 1A. An H-level signal can be supplied to the first terminal of the transistor 105. Thus, a reverse bias can be applied to the transistor 105, so that deterioration of the transistor 105 can be suppressed.

Figure 6C:
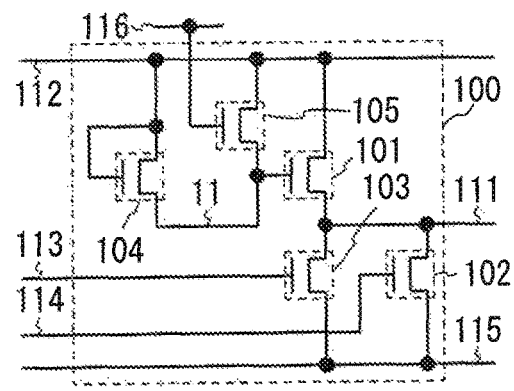

FIG. 6C illustrates a structure where the first terminal of the transistor 105 is connected to the wiring 112 and the gate of the transistor 105 is connected to the wiring 116 in the semiconductor device in FIG. 1A. The signal IN1 at an H level can be supplied to the node 11 through the transistor 104 and the transistor 105. Thus, the channel width of the transistor 104 can be made small.

In the structures in FIG. 1A and FIGS. 6A to 6C, the first terminal of the transistor 103 can be connected to a wiring which is different from the wiring 115 (e.g., the wiring 112). Further, the gate of the transistor 103 can be connected to a wiring which is different from the wiring 113 (e.g., the wiring 111, the wiring 116, or the node 11).

Figure 6D:
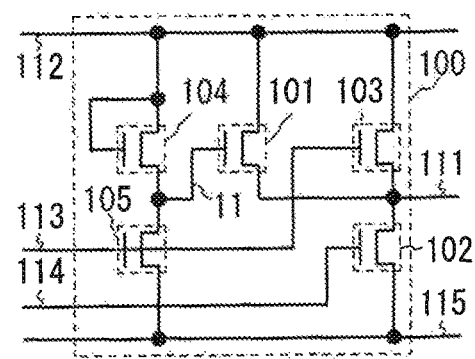

FIG. 6D illustrates a structure where the first terminal of the transistor 103 is connected to the wiring 112 in the semiconductor device in FIG. 1A. An H-level signal can be supplied to the first terminal of the transistor 103. Thus, a reverse bias can be applied to the transistor 103, so that deterioration of the transistor 103 can be suppressed.

Figure 6E:
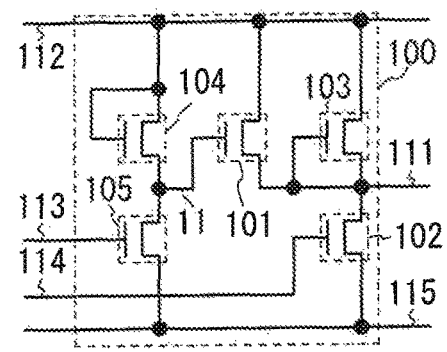

FIG. 6E illustrates a structure where the first terminal of the transistor 103 is connected to the wiring 112 and the gate of the transistor 103 is connected to wiring 111 in the semiconductor device in FIG. 1A. Thus, a reverse bias can be applied to the transistor 103, so that deterioration of the transistor 103 can be suppressed.

Figure 6F:
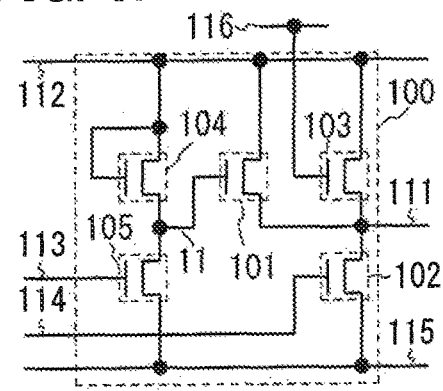

FIG. 6F illustrates a structure where the first terminal of the transistor 103 is connected to the wiring 112 and the gate of the transistor 103 is connected to the wiring 116 in the semiconductor device in FIG. 1A. The signal IN1 at an H level can be supplied to the wiring 111 through the transistor 103 and the transistor 101. Thus, the channel width of the transistor 101 can be made small.

In the structures in FIG. 1A and FIGS. 6A to 6F, the first terminal of the transistor 104 can be connected to a wiring which is different from the wiring 112 (e.g., the wiring 116). Alternatively, the gate of the transistor 104 can be connected to a wiring which is different from the wiring 112 (e.g., the wiring 116).

Figure 7A:
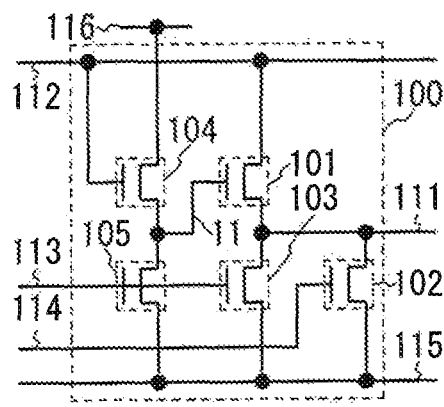
FIGS. 7A to 7E are circuit diagrams of the semiconductor device in Embodiment 1.

FIG. 7A illustrates a structure where the first terminal of the transistor 104 is connected to the wiring 116 in the semiconductor device in FIG. 1A.

Figure 7B:
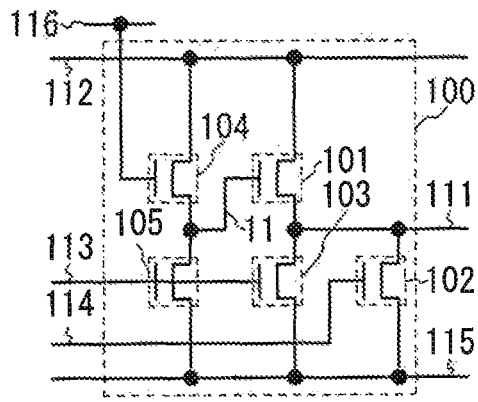

FIG. 7B illustrates a structure where the gate of the transistor 104 is connected to the wiring 116 in the semiconductor device in FIG. 1A. The potential of the wiring 112 (e.g., the signal IN1 at an L level) can be supplied through the transistor 104. Thus, the potential of the node 11 can be fixed at a certain potential, so that a noise-resistant semiconductor device can be obtained.

In the structures in FIG. 1A, FIGS. 6A to 6F, and FIGS. 7A and 7B, the first terminal of the transistor 102 can be connected to a wiring which is different from the wiring 115 (e.g., the wiring 113, the wiring 114, or the node 11). Alternatively, the first terminal of the transistor 103 and/or the first terminal of the transistor 105 can be connected to a wiring which is different from the wiring 115 (e.g., the wiring 113, the wiring 114, or the node 11).

Figure 7C:
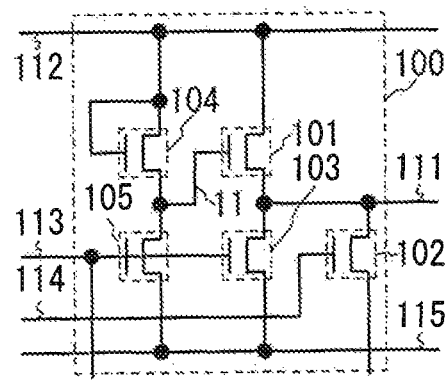

FIG. 7C illustrates a structure where the first terminal of the transistor 102 is connected to the wiring 113 in the semiconductor device in FIG. 1A. An H-level signal can be supplied to the first terminal of the transistor 102. Thus, a reverse bias can be applied to the transistor 102, so that deterioration of the transistor 102 can be suppressed.

Figure 7D:
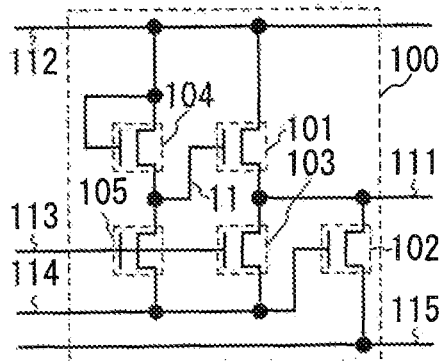

FIG. 7D illustrates a structure where the first terminal of the transistor 103 and the first terminal of the transistor 105 are connected to the wiring 114 in the semiconductor device in FIG. 1A. An H-level signal can be supplied to the first terminal of the transistor 103 or the first terminal of the transistor 105. Thus, a reverse bias can be applied to the transistor 103 or the transistor 105, so that deterioration of the transistor 103 or the transistor 105 can be suppressed.

In the structures illustrated in FIG. 1A, FIGS. 6A to 6F, and FIGS. 7A to 7D, terminals or electrodes of the transistors do not need to be connected to the same wiring. For example, the first terminal of the transistor 101 and the first terminal of the transistor 104 can be connected to different wirings. Alternatively, the gate of the transistor 103 and the gate of the transistor 105 can be connected to different wirings. Alternatively, the first terminal of the transistor 102, the first terminal of the transistor 103, and the first terminal of the transistor 105 can be connected to different wirings. In order to realize such a structure, one wiring can be divided into a plurality of wirings.

Figure 7E:
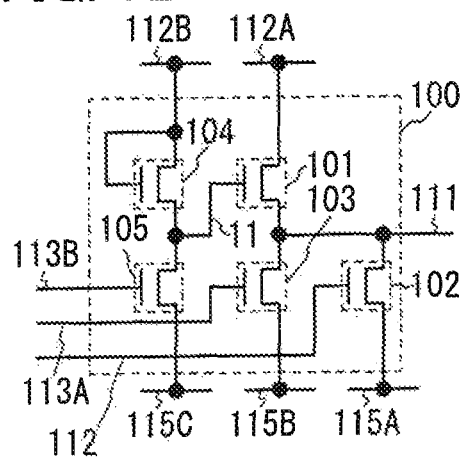

FIG. 7E illustrates a structure where the wiring 112 is divided into a plurality of wirings 112A and 112B, the wiring 113 is divided into a plurality of wirings 113A and 113B, and the wiring 115 is divided into a plurality of wirings 115A to 115C in the semiconductor device in FIG. 1A. The first terminal of the transistor 101 is connected to the wiring 112A; the first terminal of the transistor 104 is connected to the wiring 112B; and the gate of the transistor 104 is connected to the wiring 112B. Alternatively, the gate of the transistor 103 is connected to the wiring 113A, and the gate of the transistor 105 is connected to the wiring 113B. Alternatively, the first terminal of the transistor 102 is connected to the wiring 115A; the first terminal of the transistor 103 is connected to the wiring 115B; and the first terminal of the transistor 105 is connected to the wiring 115C.

Note that the wirings 112A and 112B can have functions which are similar to that of the wiring 112. The wirings 113A and 113B can have functions which are similar to that of the wiring 113. The wirings 115A to 115C can have functions which are similar to that of the wiring 115. Therefore, the signal IN1 can be input to the wirings 112A and 112B. The signal IN2 can be input to the wirings 113A and 113B. The voltage $V_1$ can be supplied to the wirings 115A to 115C. For example, different voltages or signals can be supplied to the wirings 112A and 112B. Different voltages or signals can be supplied to the wirings 113A and 113B. Different voltages or signals can be supplied to the wirings 115A to 115C.

In the structures illustrated in FIG. 1A, FIGS. 6A to 6F, and FIGS. 7A to 7E, a transistor 105A and/or a transistor 103A can be additionally provided.

Figure 8A:
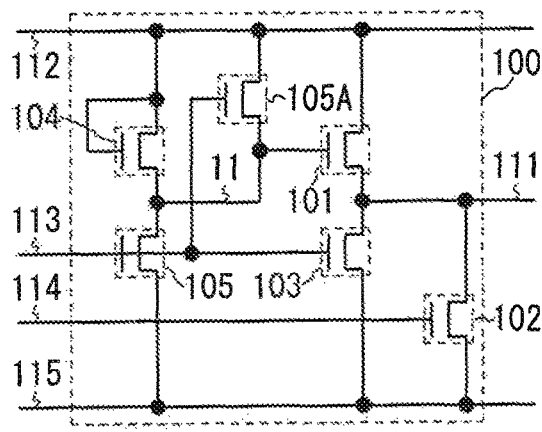
FIGS. 8A to 8F are circuit diagrams of the semiconductor device in Embodiment 1.

FIG. 8A illustrates a structure where the transistor 105A is additionally provided in the semiconductor device in FIG. 1A. The transistor 105A can correspond to the transistor 105 and can have a similar function. A first terminal of the transistor 105A is connected to the wiring 112. A second terminal of the transistor 105A is connected to the node 11. A gate of the transistor 105A is connected to the wiring 113. For example, as in FIGS. 6B and 6C, the gate of the transistor 105A can be connected to the node 11 or the wiring 116. For example, as in FIGS. 6C and 6D, the gate of the transistor 105A can be connected to a wiring which is different from the wiring 113 (e.g., the node 11, the wiring 116, or the wiring 111).

Figure 8B:
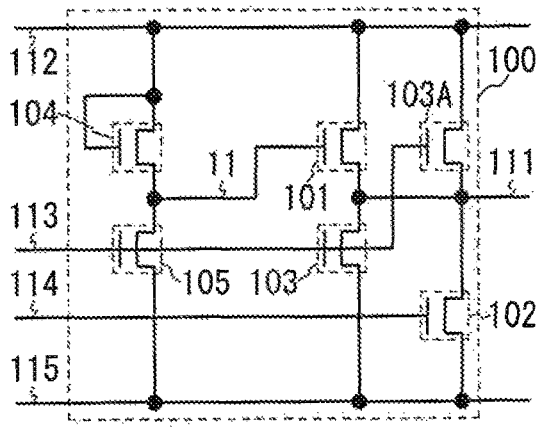

FIG. 8B illustrates a structure where the transistor 103A is additionally provided in the semiconductor device in FIG. 1A. The transistor 103A can correspond to the transistor 103 and can have a similar function. A first terminal of the transistor 103A is connected to the wiring 112. A second terminal of the transistor 103A is connected to the wiring 111. A gate of the transistor 103A is connected to the wiring 113. For example, as in FIGS. 6E and 6F, the gate of the transistor 103A can be connected to a wiring which is different from the wiring 113 (e.g., the wiring 111, the wiring 116, or the node 11).

In the structures illustrated in FIG. 1A, FIGS. 6A to 6F, FIGS. 7A to 7E, and FIGS. 8A and 8B, a transistor 106 can be additionally provided.

Figure 8C:
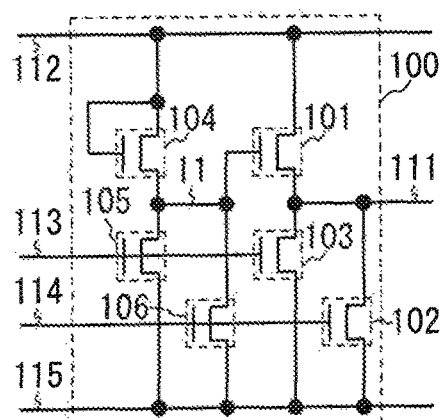

FIG. 8C illustrates a structure where the transistor 106 is additionally provided in the semiconductor device in FIG. 1A. The transistor 106 is an n-channel transistor. However, this embodiment is not limited to this, and the transistor 106 can be a p-channel transistor. A first terminal of the transistor 106 is connected to the wiring 115. A second terminal of the transistor 106 is connected to the node 11. A gate of the transistor 106 is connected to the wiring 114.

The function of the transistor 106 is described. The transistor 106 has a function of controlling conduction between the wiring 115 and the node 11. Alternatively, the transistor 106 has a function of controlling timing of supplying the potential of the wiring 115 to the node 11. Alternatively, the transistor 106 has a function of controlling timing of supplying a signal or voltage which is to be input to the wiring 115 to the node 11 when the signal or voltage is input to the wiring 115. Alternatively, the transistor 106 has a function of controlling timing of supplying an L-level signal or the voltage $V_1$ to the node 11. Alternatively, the transistor 106 has a function of controlling timing of lowering the potential of the node 11. As described above, the transistor 106 can function as a switch. Note that the transistor 106 does not need to have all the above functions. The transistor 106 can be controlled by the potential of the wiring 114 (the signal IN3).

The operation of the semiconductor device in FIG. 8C is described. In first operation, third operation, fifth operation, and seventh operation, the signal IN3 is set at an H level, so that the transistor 106 is turned on. Then, the wiring 115 and the node 11 are brought into conduction, so that the potential of the wiring 115 (e.g., the voltage $V_1$) is supplied to the node 11. Thus, the potential of the node 11 can be fixed at a certain potential, so that a noise-resistant semiconductor device can be obtained. Alternatively, the potential of the node 11 can be further lowered, so that the transistor 101 is likely to be turned off. Alternatively, the channel width of the transistor 105 can be made small, so that a layout area can be decreased. In contrast, in second operation, fourth operation, sixth operation, and eighth operation, the signal IN3 is set at an L level, so that the transistor 106 is turned off. Therefore, the length of time during which the transistor 106 is on can be decreased, so that deterioration of the transistor 106 can be suppressed.

In the structures illustrated in FIG. 1A, FIGS. 6A to 6F, FIGS. 7A to 7E, and FIGS. 8A to 8C, the transistor 103 and/or the transistor 105 can be eliminated.

Figure 8D:
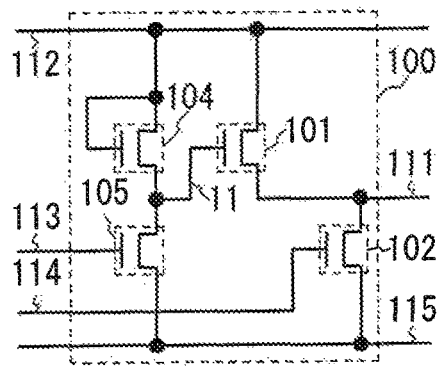

FIG. 8D illustrates a structure where the transistor 103 is eliminated from the semiconductor device in FIG. 1A. Even in the case where the transistor 103 is eliminated, for example, by delaying timing of turning off the transistor 101 as compared to timing of setting the signal IN1 at an L level from an H level, the potential of the wiring 112 (e.g., the signal IN1 at an L level) can be supplied to the wiring 111. Thus, the potential of the wiring 111 can be $V_1$. In this manner, by elimination of the transistor 103, the number of transistors can be reduced.

Note that in order to delay timing of turning off the transistor 101 as compared to timing of setting the signal IN1 at an L level from an H level, the channel width of the transistor 105 can be smaller than the channel width of the transistor 101. Alternatively, the area of the channel (e.g., L×W) of the transistor 101 can be the largest in the transistors included in the circuit 100.

Figure 8E:
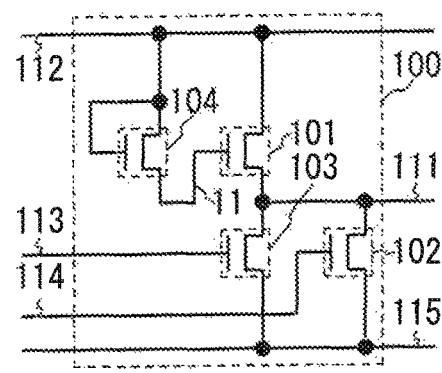

FIG. 8E illustrates a structure where the transistor 105 is eliminated from the semiconductor device in FIG. 1A. By elimination of the transistor 105, the number of transistors can be reduced.

Figure 8F:
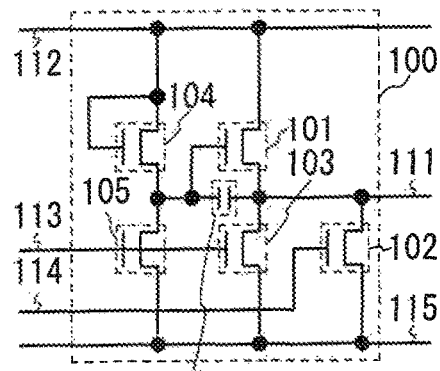

In the structures illustrated in FIG. 1A, FIGS. 6A to 6F, FIGS. 7A to 7E, and FIGS. 8A to 8E, a capacitor 107 can be connected between the gate and the second terminal of the transistor 101. A MOS capacitor can be used as the capacitor, for example FIG. 8F illustrates a structure where the capacitor 107 is connected between the gate and the second terminal of the transistor 101 in the semiconductor device in FIG. 1A. The potential of the node 11 is likely to rise in bootstrap operation. Thus, $V_{gs}$ of the transistor 101 can be increased. Accordingly, the channel width of the transistor 101 can be made small. Alternatively, the fall time or rise time of the signal OUT can be shortened.

Note that the material of one of electrodes of the capacitor 107 is preferably a material which is similar to that of a gate of a transistor. Alternatively, the material of the other of the electrodes of the capacitor 107 is preferably a material which is similar to that of a source or a drain of the transistor. In this manner, a layout area can be decreased. Alternatively, a capacitance value can be increased.

Note that an area where the one of the electrodes of the capacitor 107 overlaps with the other of the electrodes of the capacitor 107 is preferably smaller than an area where a material used for the gate and a semiconductor layer in the transistor 101 overlap with each other.

In the structures illustrated in FIG. 1A, FIGS. 6A to 6F, FIGS. 7A to 7E, and FIGS. 8A to 8F, a circuit 120 can be additionally provided in the circuit 100.

Figure 9A:
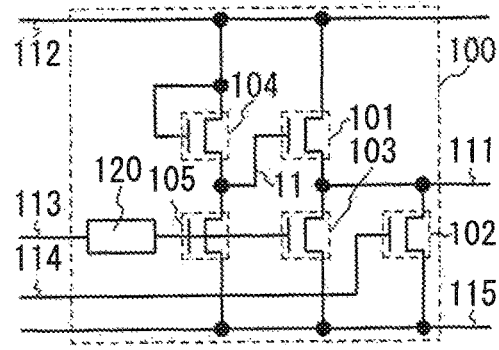
FIGS. 9A to 9H are circuit diagrams of the semiconductor device in Embodiment 1.
Figure 9B:
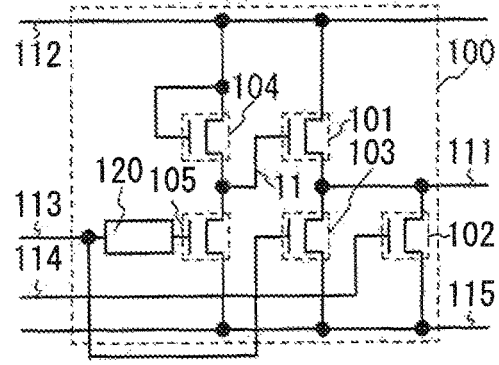

FIG. 9A illustrates a structure where the circuit 120 is additionally provided in the semiconductor device in FIG. 1A. The circuit 120 is connected between the wiring 113 and a portion where the gate of the transistor 103 and the gate of the transistor 105 are connected to each other. The circuit 120 has a function of delaying the signal IN2 which is to be input to the wiring 113. Thus, for example, timing of when the potential of the gate of the transistor 105 rises is delayed as compared to timing of when the signal IN2 is set at an H level from an L level. In other words, timing of when the transistor 105 is turned on or timing of when the potential of the node 11 is lowered is delayed as compared to the timing of when the signal IN2 is set at an H level from an L level. Therefore, for example, timing of turning off the transistor 101 can be delayed as compared to timing of setting the signal IN1 at an L level from an H level. Accordingly, the signal IN1 at an L level can be supplied to the wiring 111, so that the fall time of the signal OUT can be shortened. For example, as illustrated in FIG. 9B, the gate of the transistor 103 can be connected to the wiring 113 without the circuit 120, and the gate of the transistor 105 can be connected to the wiring 113 through the circuit 120. This is because the voltage $V_1$ can be quickly supplied to the wiring 111 when the transistor 103 is quickly turned on, so that the fall time of the signal OUT can be shortened. As another example, the gate of the transistor 105 can be connected to the wiring 111 through the circuit 120. In this case, the gate of the transistor 103 can be connected to either the gate of the transistor 105 or the wiring 113.

Figure 9C:
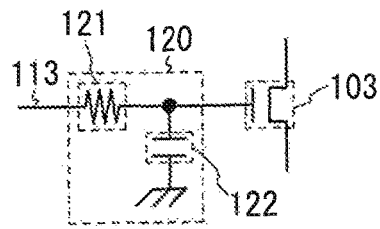
Figure 9D:
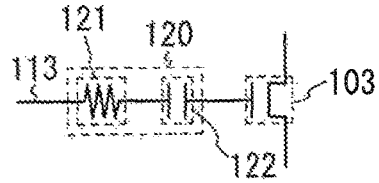
Figure 9E:
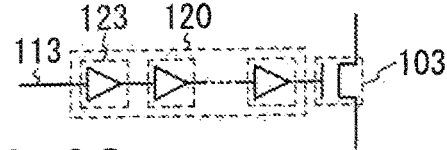
Figure 9F:
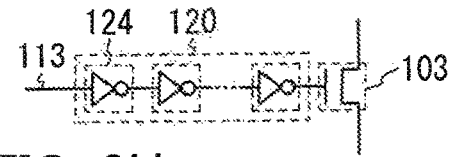

Note that any circuit can be used as the circuit 120 as long as it includes at least a capacitance component and a resistance component. For example, as the circuit 120, a resistor, a capacitor, a transistor, a diode, an element in which these elements are combined with each other, or a variety of different elements can be used. FIGS. 9C and 9D each illustrate a structure where the circuit 120 includes a resistor 121 and a capacitor 122. As another example, as the circuit 120, a buffer circuit, an inverter circuit, a NAND circuit, a NOR circuit, a level shifter circuit, a circuit in which these circuits are combined with each other, or a variety of different circuits can be used. FIG. 9E illustrates a structure where the circuit 120 includes a buffer circuit 123. FIG. 9F illustrates a structure where the circuit 120 includes an inverter circuit 124.

Note that the capacitance component can be parasitic capacitance and the resistance component can be parasitic resistance. In other words, as the circuit 120, a wiring, a contact of the material of a layer and the material of a different layer, an FPC pad, or the like can be used. Therefore, for example, the wiring resistance of the wiring 113 is preferably higher than the wiring resistance of the wiring 112. In order to realize this, the minimum width of the wiring 113 is preferably smaller than the minimum width of the wiring 112. Alternatively, the wiring 113 can contain a larger amount of the highest-resistant conductive material (e.g., a material including the material of a pixel electrode) than the wiring 112. Alternatively, for example, when a certain material is used for both the wiring 113 and the wiring 112, the minimum thickness of the material included in the wiring 113 can be smaller than the minimum thickness of the material included in the wiring 112.

Figure 9G:
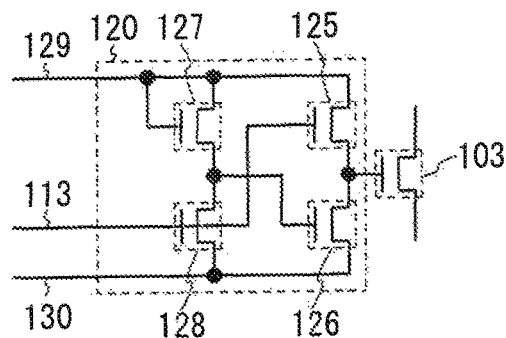

Note that for the buffer circuit 123, a structure illustrated in FIG. 9G can be used. The buffer circuit includes a transistor 125, a transistor 126, a transistor 127, and a transistor 128. A first terminal of the transistor 125 is connected to a wiring 129. A second terminal of the transistor 125 is connected to the gate of the transistor 103. A gate of the transistor 125 is connected to the wiring 113. A first terminal of the transistor 126 is connected to a wiring 130. A second terminal of the transistor 126 is connected to the gate of the transistor 103. A first terminal of the transistor 127 is connected to the wiring 129. A second terminal of the transistor 127 is connected to a gate of the transistor 126. A gate of the transistor 127 is connected to the wiring 129. A first terminal of the transistor 128 is connected to the wiring 130. A second terminal of the transistor 128 is connected to the gate of the transistor 126. A gate of the transistor 128 is connected to the wiring 113. Note that high voltage such as the voltage $V_2$ is often supplied to the wiring 129, and negative voltage such as the voltage $V_1$ is supplied to the wiring 130.

Figure 9H:
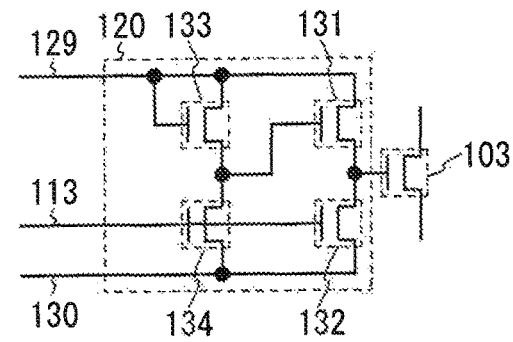

Note that for the inverter circuit 124, a structure illustrated in FIG. 9H can be used. The inverter circuit includes a transistor 131, a transistor 132, a transistor 133, and a transistor 134. A first terminal of the transistor 131 is connected to the wiring 129. A second terminal of the transistor 131 is connected to the gate of the transistor 103. A first terminal of the transistor 132 is connected to the wiring 130. A second terminal of the transistor 132 is connected to the gate of the transistor 103. A gate of the transistor 132 is connected to the wiring 113. A first terminal of the transistor 133 is connected to the wiring 129. A second terminal of the transistor 133 is connected to a gate of the transistor 131. A gate of the transistor 133 is connected to the wiring 129. A first terminal of the transistor 134 is connected to the wiring 130. A second terminal of the transistor 134 is connected to the gate of the transistor 131. A gate of the transistor 134 is connected to the wiring 113.

In the structures illustrated in FIG. 1A, FIGS. 6A to 6F, FIGS. 7A to 7E, FIGS. 8A to 8F, and FIGS. 9A and 9B, the transistors can be replaced with diodes. For example, the transistors can be diode-connected.

Figure 11A:
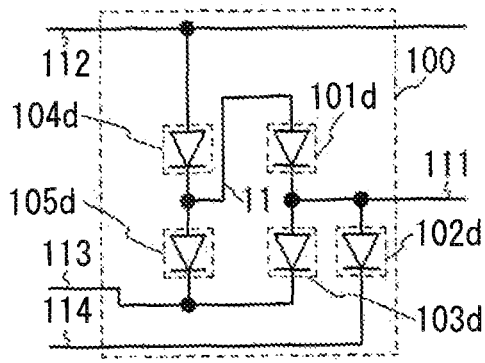
FIGS. 11A to 11F are circuit diagrams of the semiconductor device in Embodiment 1.

FIG. 11A illustrates a structure where the transistors are replaced with diodes in the semiconductor device in FIG. 1A. The transistor 101 can be replaced with a diode 101$d$. One of electrodes (e.g., an input terminal) of the diode 101$d$ is connected to the node 11, and the other of the electrodes (e.g., an output terminal) of the diode 101$d$ is connected to the wiring 111. The transistor 102 can be replaced with a diode 102$d$. One of electrodes (e.g., an input terminal) of the diode 102$d$ is connected to the wiring 111, and the other of the electrodes (e.g., an output terminal) of the diode 102$d$ is connected to the wiring 114. The transistor 103 can be replaced with a diode 103$d$. One of electrodes (e.g., an input terminal) of the diode 103$d$ is connected to the wiring 111, and the other of the electrodes (e.g., an output terminal) of the diode 103$d$ is connected to the wiring 113. The transistor 104 can be replaced with a diode 104$d$. One of electrodes (e.g., an input terminal) of the diode 104$d$ is connected to the wiring 112, and the other of the electrodes (e.g., an output terminal) of the diode 104$d$ is connected to the node 11. The transistor 105 can be replaced with a diode 105$d$. One of electrodes (e.g., an input terminal) of the diode 105$d$ is connected to the node 11, and the other of the electrodes (e.g., an output terminal) of the diode 105$d$ is connected to the wiring 113. In this manner, the number of signals or power sources can be reduced. That is, the number of wirings can be reduced. Therefore, the number of connections between a substrate over which the circuit 100 is formed and a substrate for supplying signals to the substrate can be reduced, so that improvement in reliability, improvement in yield, reduction in manufacturing cost, or the like can be achieved. Some of the plurality of transistors (e.g., the transistors 101 to 105) included in the circuit 100 can be replaced with diodes.

Figure 11B:
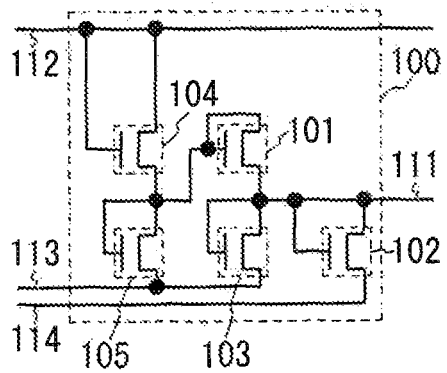

FIG. 11B illustrates a structure where the transistors are diode-connected in the semiconductor device in FIG. 1A. The first terminal of the transistor 101 can be connected to the node 11. The first terminal of the transistor 102 can be connected to the wiring 114, and the gate of the transistor 102 can be connected to the wiring 111. The first terminal of the transistor 103 can be connected to the wiring 113, and the gate of the transistor 103 can be connected to the wiring 111. The first terminal of the transistor 105 can be connected to the wiring 113, and the gate of the transistor 105 can be connected to the node 11. In this manner, the number of signals or power sources can be reduced. That is, the number of wirings can be reduced. Therefore, the number of connections between the substrate over which the circuit 100 is formed and the substrate for supplying signals to the substrate can be reduced, so that improvement in reliability, improvement in yield, reduction in manufacturing cost, or the like can be achieved. Some of the plurality of transistors (e.g., the transistors 101 to 105) included in the circuit 100 can be diode-connected.

In the structures illustrated in FIG. 1A, FIGS. 6A to 6F, FIGS. 7A to 7E, FIGS. 8A to 8F, FIGS. 9A and 9B, and FIGS. 11A and 11B, the transistors can be replaced with capacitors. For example, the capacitors can be additionally provided without elimination of the transistors.

Figure 11C:
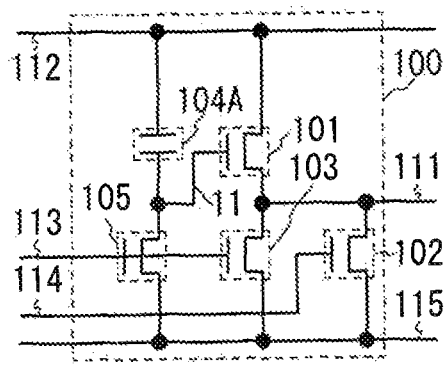

FIG. 11C illustrates a structure where the transistor 104 is replaced with a capacitor 104A connected between the wiring 112 and the node 11 in the semiconductor device in FIG. 1A. The capacitor 104A can control the potential of the node 11 in accordance with the potential of the wiring 112 by capacitive coupling. In this manner, by replacement of the transistor 104 with the capacitor 104A, the amount of stationary current can be reduced, so that power consumption can be reduced.

Figure 11D:
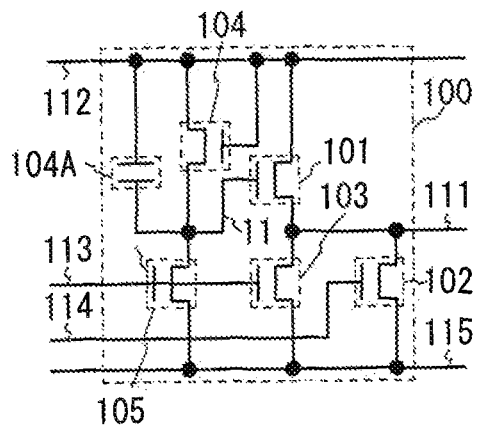

FIG. 11D illustrates a structure where the capacitor 104A is additionally provided in the semiconductor device in FIG. 1A. Changes in the potential of the node 11 can be steep, so that power consumption can be reduced.

Figure 11E:
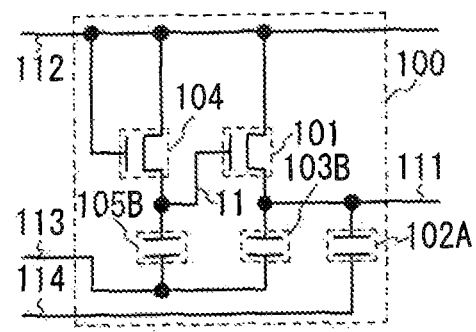

FIG. 11E illustrates a structure where the transistor 102, the transistor 103, and the transistor 105 are replaced with a capacitor 102A connected between the wiring 114 and the wiring 111, a capacitor 103B connected between the wiring 113 and the wiring 111, and a capacitor 105B connected between the wiring 113 and the node 11, respectively, in the semiconductor device in FIG. 1A.

In the structures illustrated in FIG. 1A, FIGS. 6A to 6F, FIGS. 7A to 7E, FIGS. 8A to 8F, FIGS. 9A and 9B, and FIGS. 11A to 11F, the transistors can be replaced with resistors.

Figure 11F:
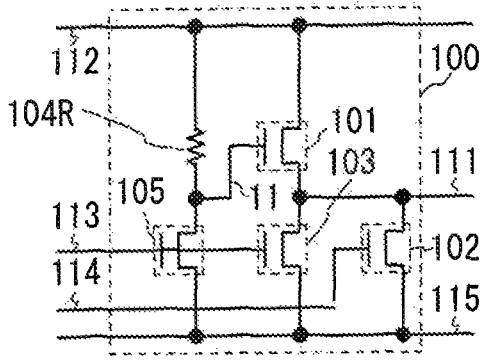

FIG. 11F illustrates a structure where the transistor 104 is replaced with a resistor 104R in the semiconductor device in FIG. 1A. The resistor 104R is connected between the wiring 112 and the node 11.

In the structures illustrated in FIG. 1A, FIGS. 6A to 6F, FIGS. 7A to 7E, FIGS. 8A to 8F, FIGS. 9A and 9B, and FIGS. 11A to 11F, a transistor 108 can be additionally provided.

Figure 46A:
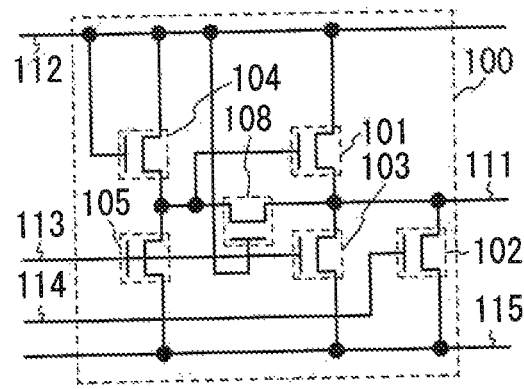
FIGS. 46A and 46B are circuit diagrams of the semiconductor device in Embodiment 1.

FIG. 46A illustrates a structure where the transistor 108 is additionally provided in the semiconductor device in FIG. 1A. The transistor 108 is an n-channel transistor. However, this embodiment is not limited to this, and the transistor 108 can be a p-channel transistor. A first terminal of the transistor 108 is connected to the wiring 111. A second terminal of the transistor 108 is connected to the node 11. A gate of the transistor 108 is connected to the wiring 112.

The operation of the semiconductor device in FIG. 46A is described. In first operation, second operation, and third operation, the signal IN3 is set at an H level, so that the transistor 108 is turned on. Then, the wiring 111 and the node 11 are brought into conduction, so that the potential of the wiring 111 is supplied to the node 11. Alternatively, the potential of the node 11 is supplied to the wiring 111. Note that in fourth operation, although the signal IN3 is set at an H level, the potential of the node 11 and the potential of the wiring 111 become an H level; thus, the transistor 108 is turned off. However, the transistor 108 is on until the potential of the wiring 111 becomes an H level. Thus, the potential of the node 11 is lowered. Then, $V_{gs}$ of the transistor 101 is lowered, so that dielectric breakdown, deterioration, or the like of the transistor 101 can be prevented. In contrast, in fifth operation, sixth operation, seventh operation, and eighth operation, the signal IN1 is set at an L level, so that the transistor 108 is turned off. Thus, the node 11 and the wiring 111 are brought out of conduction.

In the structures illustrated in FIG. 1A, FIGS. 6A to 6F, FIGS. 7A to 7E, FIGS. 8A to 8F, FIGS. 9A and 9B, FIGS. 11A to 11F, and FIG. 46A, a signal which is different from the signal OUT can be generated. For that purpose, a transistor 109 can be additionally provided in these semiconductor devices.

Figure 46B:
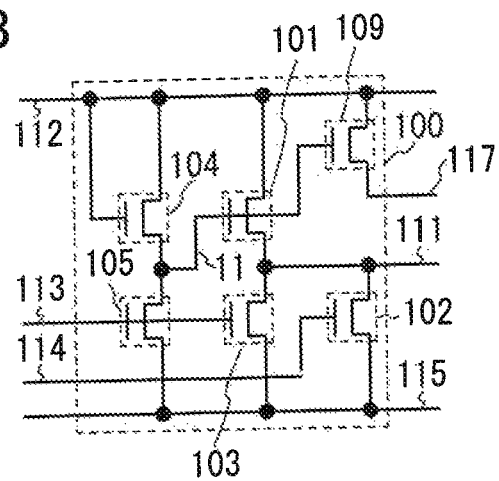

FIG. 46B illustrates a structure where the transistor 109 is additionally provided in the semiconductor device in FIG. 1A. The polarity of the transistor 109 is the same as that of the transistor 101. Further, the transistor 109 can have the same function as the transistor 101. A first terminal of the transistor 109 is connected to the wiring 112. A second terminal of the transistor 109 is connected to a wiring 117. A gate of the transistor 109 is connected to the node 11.

Here, the structures illustrated in FIG. 1A, FIGS. 6A to 6F, FIGS. 7A to 7E, FIGS. 8A to 8F, FIGS. 9A and 9B, FIGS. 11A to 11F, and FIGS. 46A and 46B can be combined with each other as appropriate.

Figure 12A:
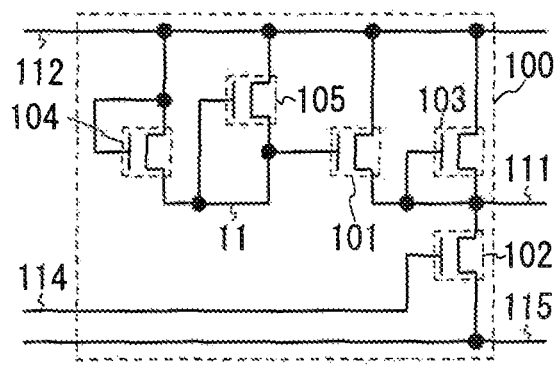
FIGS. 12A to 12D are circuit diagrams of the semiconductor device in Embodiment 1.

FIG. 12A illustrates a structure where the structure illustrated in FIG. 6B is combined with the structure illustrated in FIG. 6E. The first terminal of the transistor 103 is connected to the wiring 112. The second terminal of the transistor 103 is connected to the wiring 111. The gate of the transistor 103 is connected to the wiring 111. The first terminal of the transistor 105 is connected to the wiring 112. The second terminal of the transistor 105 is connected to the node 11. The gate of the transistor 105 is connected to the node 11. In this manner, the signal IN2 and the wiring 113 can be eliminated, so that the number of signals and the number of wirings can be reduced. Therefore, reduction in the number of connections between the substrate over which the circuit 100 is formed and a different substrate, improvement in reliability, reduction in manufacturing cost, and/or reduction in power consumption can be achieved, for example.

Figure 12B:
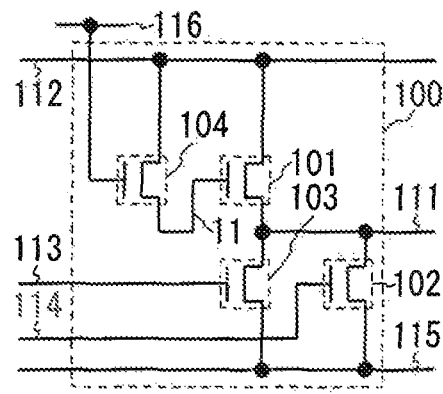

FIG. 12B illustrates a structure where the structure illustrated in FIG. 7A is combined with the structure illustrated in FIG. 8E. The transistor 105 is eliminated. The first terminal of the transistor 104 is connected to the wiring 112. The second terminal of the transistor 104 is connected to the node 11. The gate of the transistor 104 is connected to the wiring 116. In this manner, the number of transistors can be reduced, so that a layout area can be decreased. Further, the potential of the node 11 can be fixed at an L level, so that a noise-resistant circuit can be obtained.

Figure 12C:
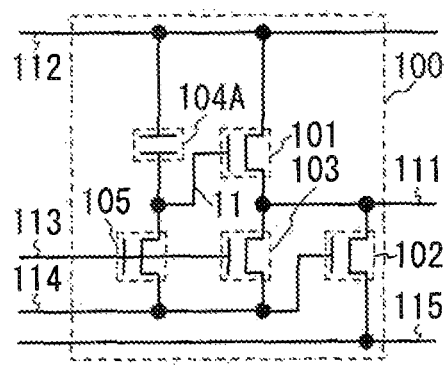

FIG. 12C illustrates a structure where the structure illustrated in FIG. 7D is combined with the structure illustrated in FIG. 11C. The first terminal of the transistor 103 is connected to the wiring 114. The first terminal of the transistor 105 is connected to the wiring 114. The transistor 104 is replaced with the capacitor 104A connected between the wiring 112 and the node 11.

As described above, this embodiment is not limited to the structure illustrated in FIG. 1A, and a variety of different structures can be used.

In the structures illustrated in FIG. 1A, FIGS. 6A to 6F, FIGS. 7A to 7E, FIGS. 8A to 8F, FIGS. 9A and 9B, FIGS. 11A to 11F, FIGS. 12A to 12C, and FIGS. 46A and 46B, p-channel transistors can be used as the transistors. Only some of the plurality of transistors included in the semiconductor devices can be p-channel transistors. That is, a CMOS circuit can be employed in the semiconductor device of this embodiment.

FIG. 13A illustrates a structure where p-channel transistors are used as the transistors in the semiconductor device in FIG. 1A. Transistors 101p to 105p are p-channel transistors having functions which are similar to those of the transistors 101 to 105. In such a case, the voltage $V_2$ is supplied to the wiring 115.

In the semiconductor device in FIG. 13A, as illustrated in FIG. 13B, the circuit 100 can function as a logic circuit including a NAND. Specifically, the circuit 100 functions as a logic circuit where a three-input NAND is combined with two NOTs. The signal IN1 can be input to a first input terminal of the NAND. A signal obtained by inversion of the signal IN2 with a first NOT can be input to a second input terminal of the NAND. A signal obtained by inversion of the signal IN3 with a second NOT can be input to a third input terminal of the NAND. The signal OUT can be output from an output of the NAND. In other words, the circuit 100 has a function of realizing a logical expression illustrated in FIG. 13C or a function of realizing a truth table obtained with the logical expression. Therefore, the signal OUT is set at an L level when the signal IN1 is set at an L level and the signals IN2 and IN3 are set at an H level, and the signal OUT is set at an H level when other input signals are input. FIG. 13D illustrates a truth table when the signals IN1 to IN3 are digital signals.

Figure 12D:
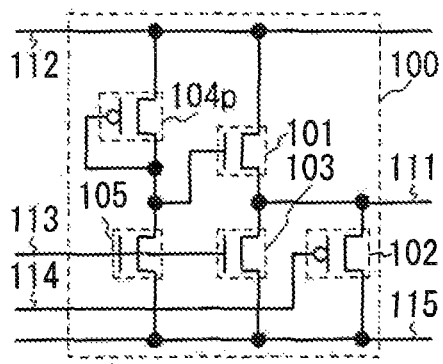

FIG. 12D illustrates a structure where p-channel transistors are used as some of the transistors in the semiconductor device in FIG. 1A. A gate of the transistor 104p is connected to the node 11.

(Embodiment 2)

In this embodiment, a semiconductor device obtained by addition of an element, a circuit, or the like to the semiconductor device in Embodiment 1 is described.

Figure 14A:
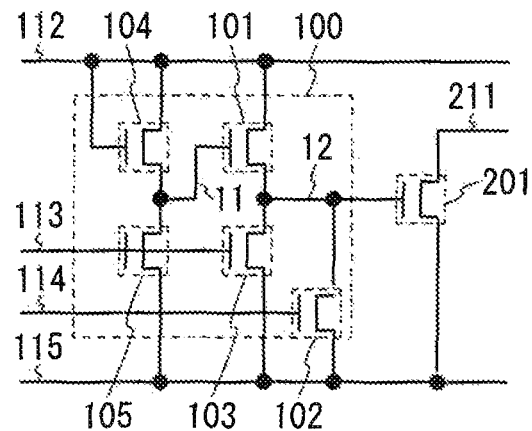
FIGS. 14A to 14C are a circuit diagram of the semiconductor device in Embodiment 2 and schematic views for illustrating operation of the semiconductor device.

First, a structure where a transistor 201 (a sixth transistor) is additionally provided in the semiconductor device in Embodiment 1 is described. FIG. 14A illustrates a structure where the transistor 201 is additionally provided in the semiconductor device in FIG. 1A.

The transistor 201 is an n-channel transistor. However, this embodiment is not limited to this, and the transistor 201 can be a p-channel transistor. A first terminal of the transistor 201 is connected to the wiring 115. A second terminal of the transistor 201 is connected to a wiring 211 (a sixth wiring). A gate of the transistor 201 is connected to the wiring 111.

Note that a gate of the transistor 201 is denoted by a node 12. Since the node 12 corresponds to the wiring 111 described in Embodiment 1, description "the wiring 111" can be replaced with description "the node 12". Therefore, description "the potential of the wiring 111 (a potential of the signal OUT)" can be replaced with description "a potential of the node 12".

The function of the transistor 201 is described. The transistor 201 has a function of controlling conduction between the wiring 115 and the wiring 211. Alternatively, the transistor 201 has a function of controlling timing of supplying the potential of the wiring 115 to the wiring 211. Alternatively, the transistor 201 has a function of controlling timing of supplying a signal or voltage which is to be input to the wiring 115 to the wiring 211 when the signal or voltage is input to the wiring 115. Alternatively, the transistor 201 has a function of controlling timing of supplying an L-level signal or the voltage $V_1$ to the wiring 211. Alternatively, the transistor 201 has a function of controlling timing of lowering a potential of the wing 211. As described above, the transistor 201 can function as a switch. Note that the transistor 201 does not need to have all the above functions. The transistor 201 can be controlled by an output signal of the circuit 100.

Figure 15A:
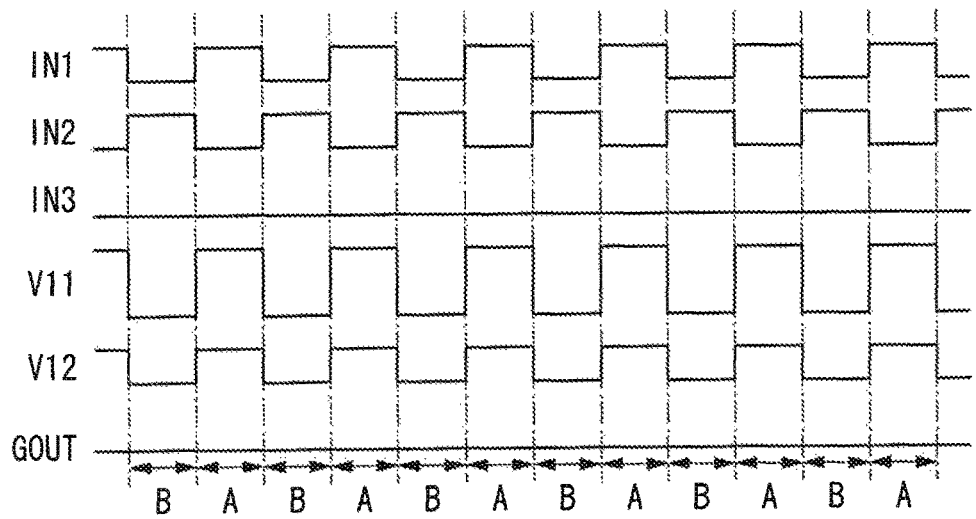
FIGS. 15A to 15C are timing charts for illustrating operation of the semiconductor device in Embodiment 2.

Next, the operation of the semiconductor device in FIG. 14A is described with reference to FIG. 15A. FIG. 15A illustrates a timing chart of a semiconductor device of this embodiment.

Note that a period A and a period B are provided in the timing chart in FIG. 15A. In addition, the period A and the period B alternately appear in the timing chart in FIG. 15A. A plurality of the periods A and a plurality of the periods B can alternately appear in the timing chart in FIG. 15A. Alternatively, in the timing chart in FIG. 15A, a period other than the period A and the period B can be provided or one of the period A and the period B can be omitted.

Note that the lengths of the period A and the period B are approximately the same. Alternatively, for example, when a clock signal is input to the semiconductor device of this embodiment, each of the lengths of the period A and the period B is approximately the same as the length of the half cycle of the clock signal. Alternatively, for example, when the semiconductor device of this embodiment is used for a gate driver, each of the lengths of the period A and the period B is approximately the same as the length of one gate selection period.

Figure 14B:
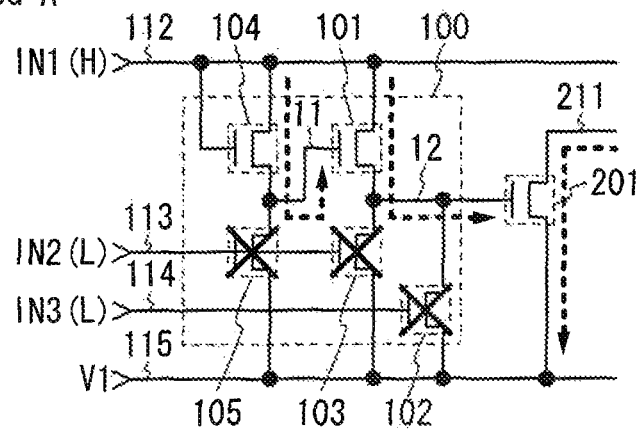

First, the operation of the semiconductor device in the period A is described with reference to a schematic view in FIG. 14B. In the period A, the signal IN1 is set at an H level, the signal IN2 is set at an L level, and the signal IN3 is set at an L level. Thus, the circuit 100 can perform the fourth operation in FIG. 3A, so that the potential of the node 12 (the signal OUT) is set at an H level. Accordingly, the transistor 201 is turned on, so that the wiring 115 and the wiring 211 are brought into conduction. Then, the potential of the wiring 115 (e.g., the voltage $V_1$) is supplied to the wiring 211, so that the potential of the wiring 211 (a signal GOUT) becomes an L level.

Figure 14C:
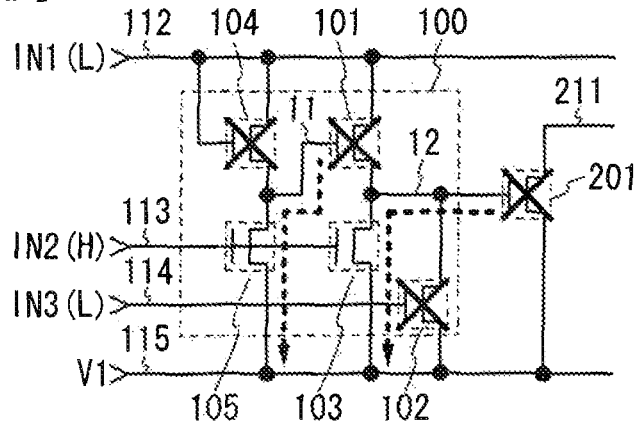

Next, the operation of the semiconductor device in the period B is described with reference to a schematic view in FIG. 14C. In the period B, the signal IN1 is set at an L level, the signal IN2 is set at an H level, and the signal IN3 is set at an L level. Thus, the circuit 100 can perform the sixth operation in FIG. 3C, so that the potential of the node 12 (the signal OUT) is set at an L level. Accordingly, the transistor 201 is turned off, so that the wiring 115 and the wiring 211 are brought out of conduction. Thus, the wiring 211 is made to be in a floating state, so that the potential of the wiring 211 is kept at approximately $V_1$.

As described above, the transistor 201 is turned on in the period A and is turned off in the period B. Thus, a period during which the transistor 201 is on can be shortened. Accordingly, deterioration of the transistor can be suppressed. Further, in the period A and the period B, the transistors 101, 102, 103, 104, 105, and 201 are not continuously on; thus, the length of time during which the transistors 101, 102, 103, 104, 105, and 201 are on or the number of times the transistors 101, 102, 103, 104, 105, and 201 are turned on can be reduced.

Next, the functions and features of the signals IN1 to IN3 are described.

The level of the signal IN1 is changed between an H level and an L level every period. Thus, the signal IN1 can function as a clock signal. The wiring 112 can function as a clock signal line (a clock line or a clock supply line).

The level of the signal IN2 is changed between an H level and an L level every period. The signal IN2 is a signal obtained by inversion of the signal IN1 or a signal which is 180° out of phase from the signal IN1. Thus, the signal IN2 can function as an inverted clock signal. The wiring 113 can function as a clock signal line.

When each of the signal IN1 and the signal IN2 functions as a clock signal, each of the signal IN1 and the signal IN2 can be either a balanced signal as illustrated in FIG. 15A or an unbalanced signal. The balanced signal is a signal whose period during which the signal is at an H level and whose period during which the signal is at an L level in one cycle have approximately the same length. The unbalanced signal is a signal whose period during which the signal is at an H level and whose period during which the signal is at an L level in one cycle have different lengths. Here, the term "different" include the range other than the range of the term "approximately the same".

Figure 15B:
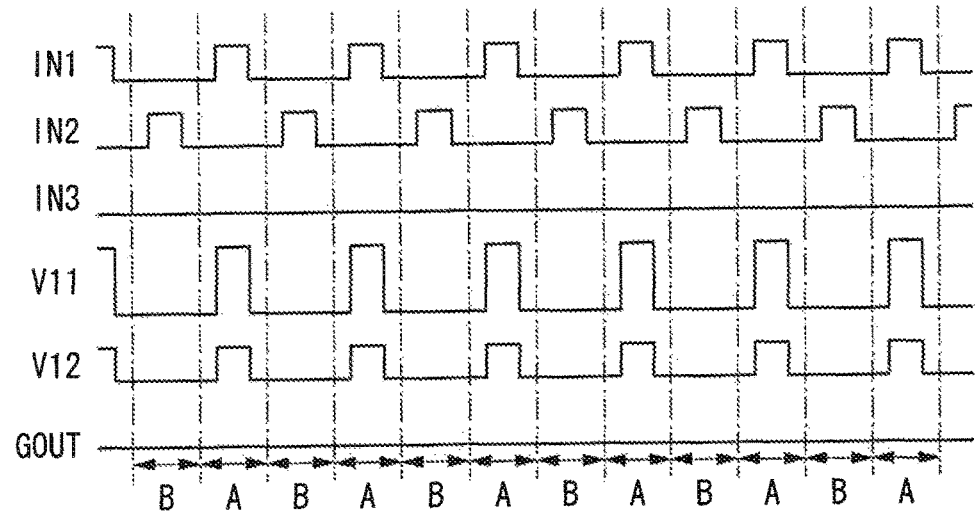

FIG. 15B illustrates a timing chart when each of the signal IN1 and the signal IN2 is an unbalanced signal in the timing chart in FIG. 15A.

N-phase clock signals can be input to the semiconductor device of this embodiment. Alternatively, some of the n-phase clock signals can be input to the semiconductor device of this embodiment. The n-phase clock signals are n pieces of clock signals whose cycles are different by 1/n cycle.

Figure 15C:
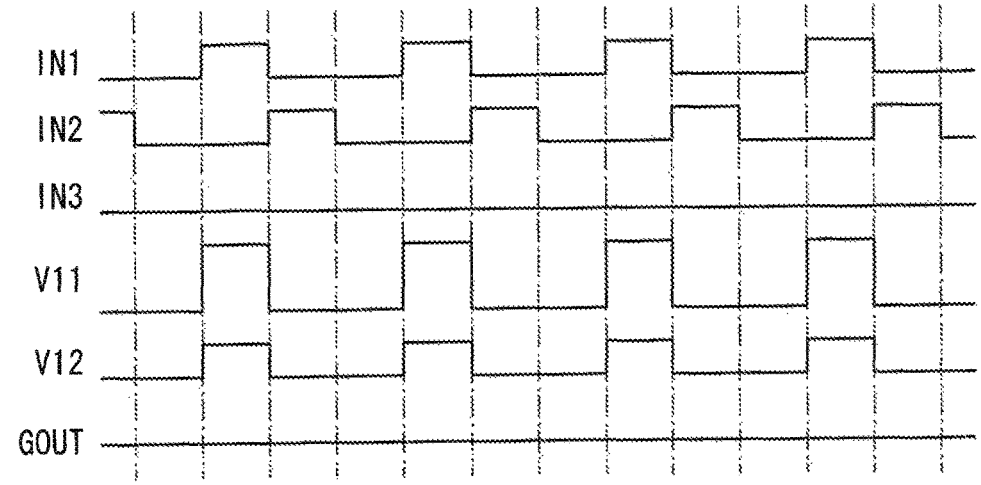

FIG. 15C illustrates a timing chart when one of three-phase clock signals is used as the signal IN1 and another three-phase clock signal is used as the signal IN2.

As described above, the signals IN1 to IN3 can have a variety of waveforms in addition to the waveforms illustrated in the timing chart in FIG. 15A.

Next, the ratio of the channel width of the transistor 201 to the channel width of the transistor 101 is described. For example, in the case where the wiring 211 functions as a gate signal line, the wiring 211 is provided so as to extend over a pixel portion and is connected to a pixel in some cases. That is, a large load is connected to the wiring 211. Thus, the channel width of the transistor 201 is larger than the channel width of each of the transistors included in the circuit 100. In such a case, the channel width of the transistor 201 is preferably ten times or less the channel width of the transistor 101. More preferably, the channel width of the transistor 201 is five times or less the channel width of the transistor 101. Further preferably, the channel width of the transistor 201 is three times or less the channel width of the transistor 101.

As described above, the ratio of the channel widths of the transistors is preferably set to an appropriate ratio. Note that considering the ratio of the channel widths of the transistors, the channel width of the transistor 201 is preferably 1000 to 5000 μm. More preferably, the channel width of the transistor 201 is 1500 to 4000 μm. Further preferably, the channel width of the transistor 201 is 2000 to 3000 μm.

Next, a semiconductor device with a structure which is different from that in FIG. 14A is described.

In the structure illustrated in FIG. 14A, the structure of the circuit 100 is not limited to the structure in FIG. 1A, and the variety of structures described in Embodiment 1 can be used. The structure of the circuit 100 can be different from the structures described in Embodiment 1 as long as a predetermined function can be realized.

Figure 10A:
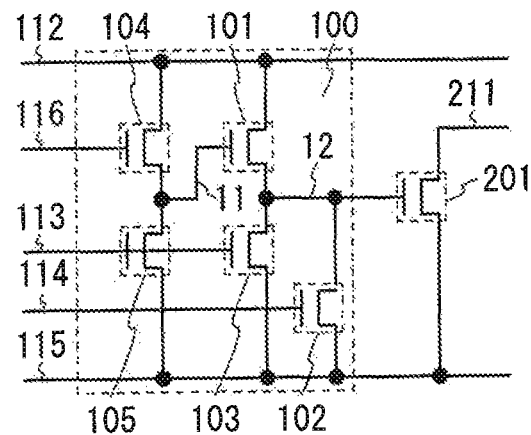
FIGS. 10A to 10C are circuit diagrams of a semiconductor device in Embodiment 2.

FIG. 10A illustrates a structure where the structure in FIG. 7B is used as the structure of the circuit 100 in FIG. 14A.

Figure 10B:
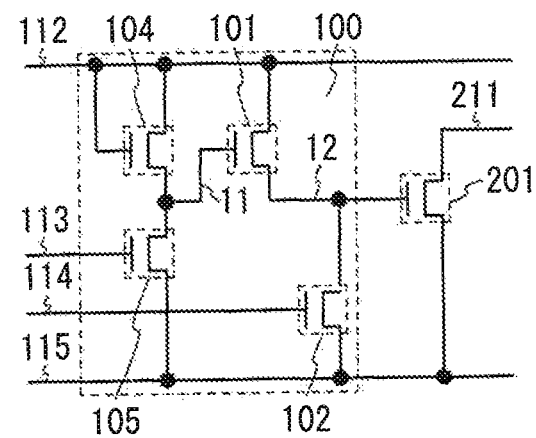

FIG. 10B illustrates a structure where the structure in FIG. 8D is used as the structure of the circuit 100 in FIG. 14A. Generation of noise in the node 12 through the transistor 103 can be prevented. Accordingly, malfunctions can be prevented.

Figure 10C:
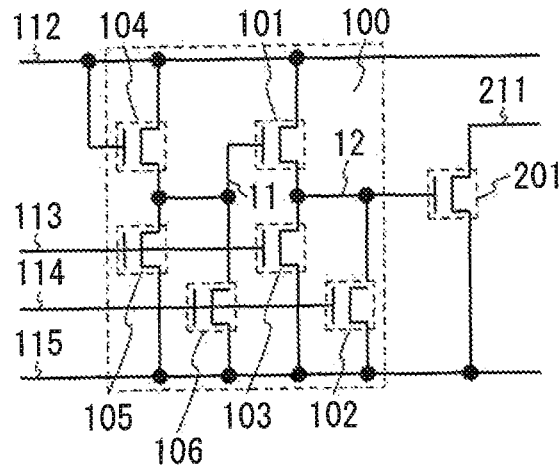

FIG. 10C illustrates a structure where the structure in FIG. 8C is used as the structure of the circuit 100 in FIG. 14A. The potential of the node 11 can be further lowered, so that the transistor 201 can be prevented from being turned on.

In the structures illustrated in FIGS. 10A to 10C and FIG. 14A, a transistor 202 can be additionally provided.

Figure 16A:
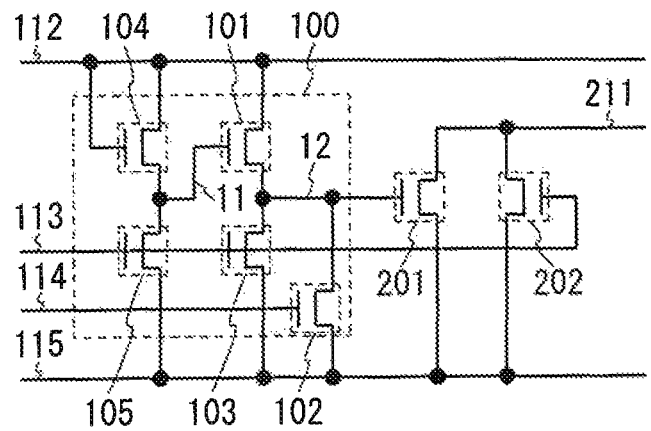
FIGS. 16A to 16C are a circuit diagram of the semiconductor device in Embodiment 2 and schematic views for illustrating operation of the semiconductor device.

FIG. 16A illustrates a structure where the transistor 202 is additionally provided in the semiconductor device in FIG. 14A. The transistor 202 is an n-channel transistor. However, this embodiment is not limited to this, and the transistor 202 can be a p-channel transistor. A first terminal of the transistor 202 is connected to the wiring 115. A second terminal of the transistor 202 is connected to the wiring 211. A gate of the transistor 202 is connected to the wiring 113. The gate of the transistor 202 can be connected to a wiring which is different from the wiring 113. Alternatively, the first terminal of the transistor 202 can be connected to a wiring which is different from the wiring 115.

The function of the transistor 202 is described. The transistor 202 has a function of controlling conduction between the wiring 115 and the wiring 211. Alternatively, the transistor 202 has a function of controlling timing of supplying the potential of the wiring 115 to the wiring 211. Alternatively, the transistor 202 has a function of controlling timing of supplying a signal or voltage which is to be input to the wiring 115 to the wiring 211 when the signal or voltage is input to the wiring 115. Alternatively, the transistor 202 has a function of controlling timing of supplying an L-level signal or the voltage $V_1$ to the wiring 211. Alternatively, the transistor 202 has a function of controlling timing of lowering the potential of the wiring 211. As described above, the transistor 202 can function as a switch. Note that the transistor 202 does not need to have all the above functions. The transistor 202 can be controlled by the potential of the wiring 113 (e.g., the signal IN2).

Figure 16B:
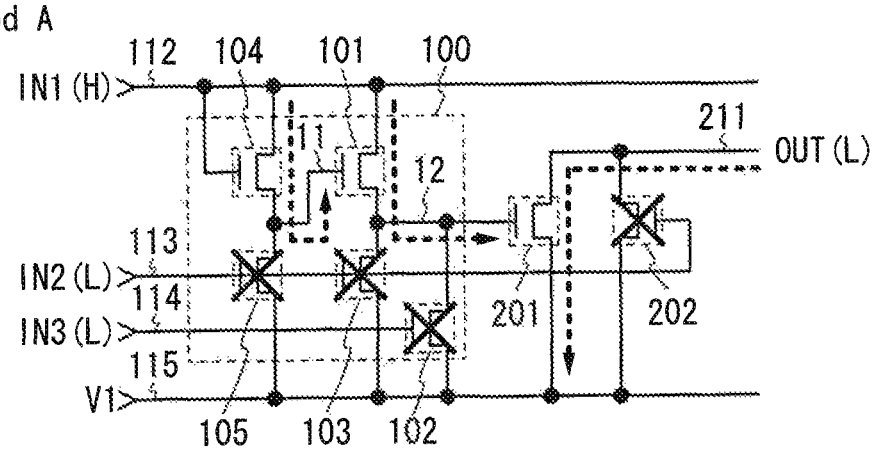
Figure 16C:
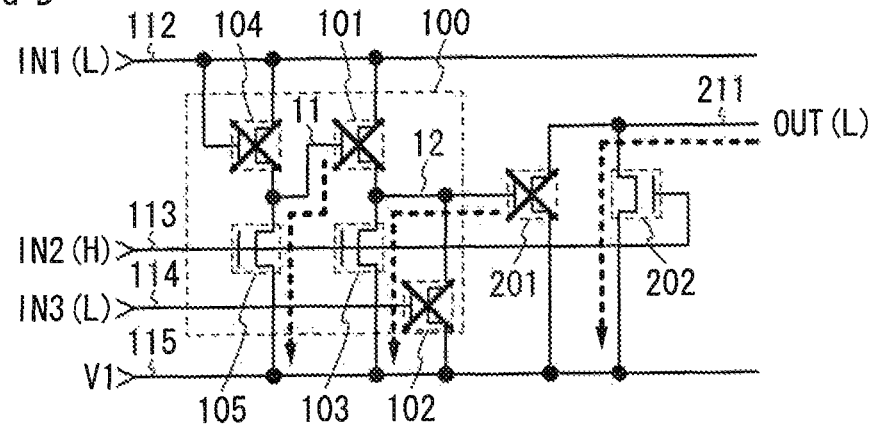

The operation of the semiconductor device in FIG. 16A is described. Since the signal IN2 is set at an L level in the period A, the transistor 202 is turned off, as illustrated in FIG. 16B. Since the signal IN2 is set at an H level in the period B, the transistor 202 is turned on, as illustrated in FIG. 16C. Thus, the wiring 115 and the wiring 211 are brought into conduction also in the period B, so that the potential of the wiring 115 (e.g., the voltage $V_1$) is supplied to the wiring 211. Therefore, noise of the wiring 211 can be reduced. For example, when the semiconductor device in FIG. 16A is used for a display device and the wiring 211 is connected to a gate of a pixel selection transistor, writing of a video signal, which is to be written to a pixel in a different row, to the pixel due to the noise of the wiring 211 can be prevented. Alternatively, changes in a video signal held in the pixel due to the noise of the wiring 211 can be prevented. Accordingly, display quality can be improved.

In the structures illustrated in FIGS. 10A to 10C, FIG. 14A, and FIG. 16A, a transistor 203 (a seventh transistor) can be additionally provided.

Figure 17A:
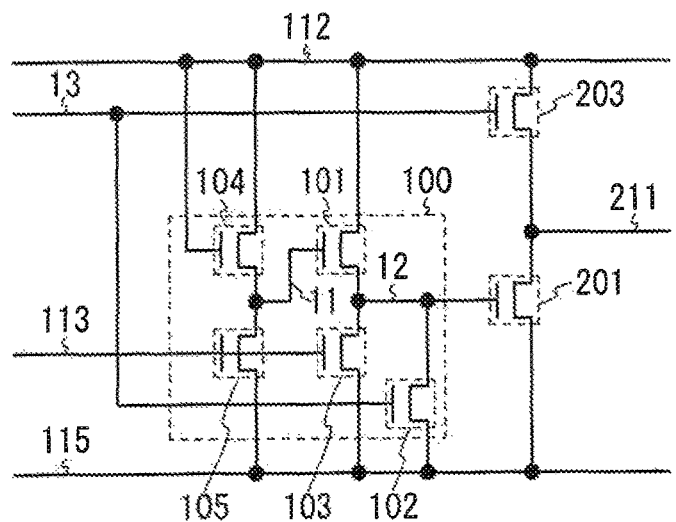
FIGS. 17A and 17B are a circuit diagram of the semiconductor device in Embodiment 2 and a timing chart for illustrating operation of the semiconductor device.

FIG. 17A illustrates a structure where the transistor 203 is additionally provided in the semiconductor device in FIG. 14A. The transistor 203 is an n-channel transistor. However, this embodiment is not limited to this, and the transistor 203 can be a p-channel transistor. A first terminal of the transistor 203 is connected to the wiring 112. A second terminal of the transistor 203 is connected to the wiring 211. Further, a gate of the transistor 203 is denoted by a node 13. Note that the gate of the transistor 102 can be connected to the node 13. Therefore, a potential of the node 13 ($V_{13}$) can be used as the signal IN3.

The function of the transistor 203 is described. The transistor 203 has a function of controlling conduction between the wiring 112 and the wiring 211. Alternatively, the transistor 203 has a function of controlling timing of supplying the potential of the wiring 112 to the wiring 211. Alternatively, the transistor 203 has a function of controlling timing of supplying a signal or voltage which is to be input to the wiring 112 to the wiring 211 when the signal or voltage is input to the wiring 112. Alternatively, the transistor 203 has a function of controlling timing of supplying an H-level signal or the voltage $V_2$ to the wiring 211. Alternatively, the transistor 203 has a function of controlling timing of supplying an L-level signal or the voltage $V_1$ to the wiring 211. Alternatively, the transistor 203 has a function of controlling timing of raising the potential of the wiring 211. Alternatively, the transistor 203 has a function of controlling timing of lowering the potential of the wiring 211. Alternatively, the transistor 203 has a function of performing bootstrap operation. Alternatively, the transistor 203 has a function of raising the potential of the node 13 by bootstrap operation. As described above, the transistor 203 functions as a switch or a buffer. Note that the transistor 203 does not need to have all the above functions. The transistor 203 can be controlled by the potential of the node 13, the potential of the wiring 112 (the signal IN1), and/or the potential of the wiring 211 (the signal GOUT).

Figure 17B:
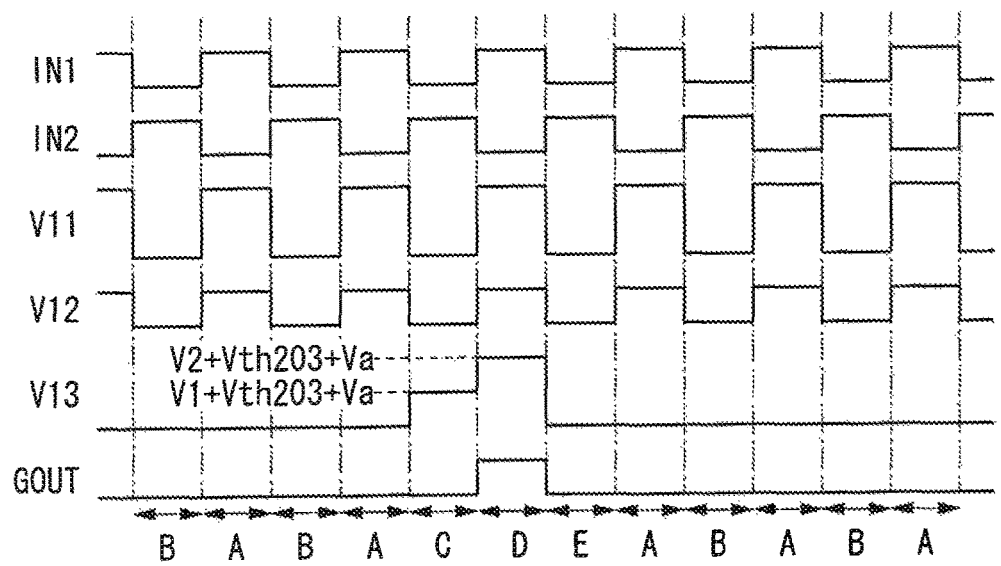

Next, the operation of the semiconductor device in FIG. 17A is described with reference to FIG. 17B. FIG. 17B illustrates a timing chart of the semiconductor device of this embodiment.

Note that periods A to E are provided in the timing chart in FIG. 17B. The periods C, D, and E sequentially appear in the timing chart in FIG. 17B. Other than the periods C, D, and E, the period A and the period B alternately appear. The periods A to E may be provided in different orders.

Figure 18A:
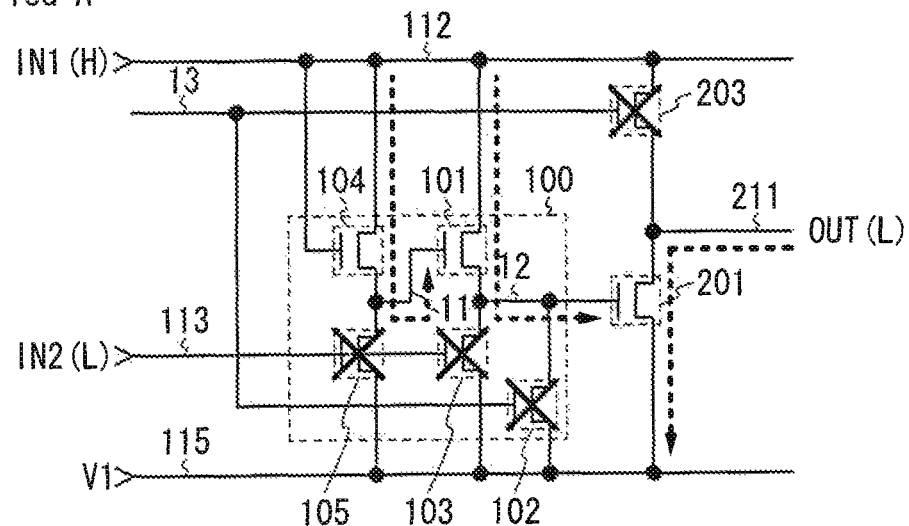
FIGS. 18A and 18B are schematic views for illustrating operation of the semiconductor device in Embodiment 2.

First, the operation of the semiconductor device in the period A is described with reference to a schematic view in FIG. 18A. In the period A, the signal IN1 is set at an H level, the signal IN2 is set at an L level, and the potential of the node 13 (the signal IN3) is set at an L level. Thus, the circuit 100 can perform the fourth operation in FIG. 3A, so that the potential of the node 12 (the signal OUT) is set at an H level. Then, the transistor 201 is turned on, so that the wiring 115 and the wiring 211 are brought into conduction. Thus, the potential of the wiring 115 (e.g., the voltage $V_1$) is supplied to the wiring 211. In this case, the potential of the node 13 becomes an L level, so that the transistor 203 is turned off. Then, the wiring 112 and the wiring 211 are brought out of conduction. Accordingly, the potential of the wiring 115 (e.g., the voltage $V_1$) is supplied to the wiring 211, so that the signal GOUT is set at an L level.

Figure 18B:
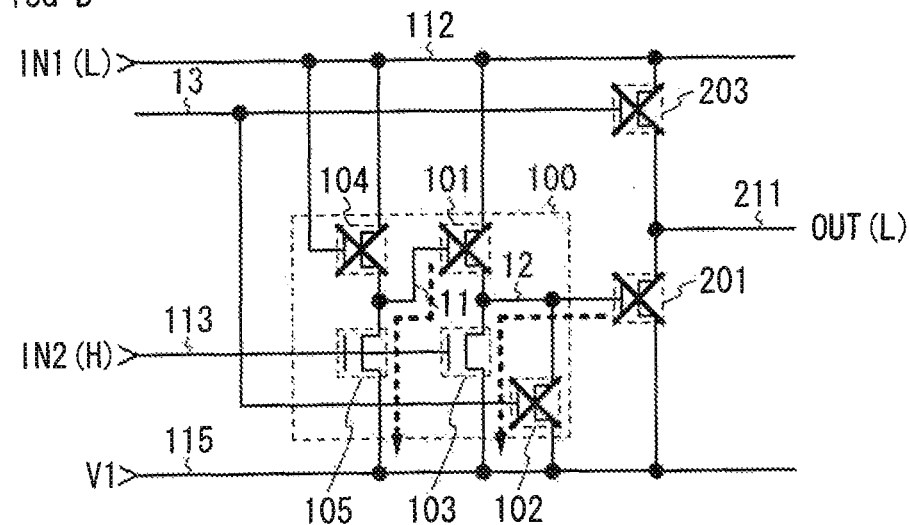

Next, the operation of the semiconductor device in the period B is described with reference to a schematic view in FIG. 18B. In the period B, the signal IN1 is set at an L level, the signal IN2 is set at an H level, and the potential of the node 13 (the signal IN3) is kept at an L level. Thus, the circuit 100 can perform the sixth operation in FIG. 3C, so that the potential of the node 12 (the signal OUT) is set at an L level. Then, the transistor 201 is turned off, so that the wiring 115 and the wiring 211 are brought out of conduction. In this case, the potential of the node 13 becomes an L level, so that the transistor 203 is turned off. Then, the wiring 112 and the wiring 211 are brought out of conduction. Accordingly, the wiring 211 is made to be in a floating state, so that the potential of the wiring 211 is kept at approximately $V_1$.

Figure 19A:
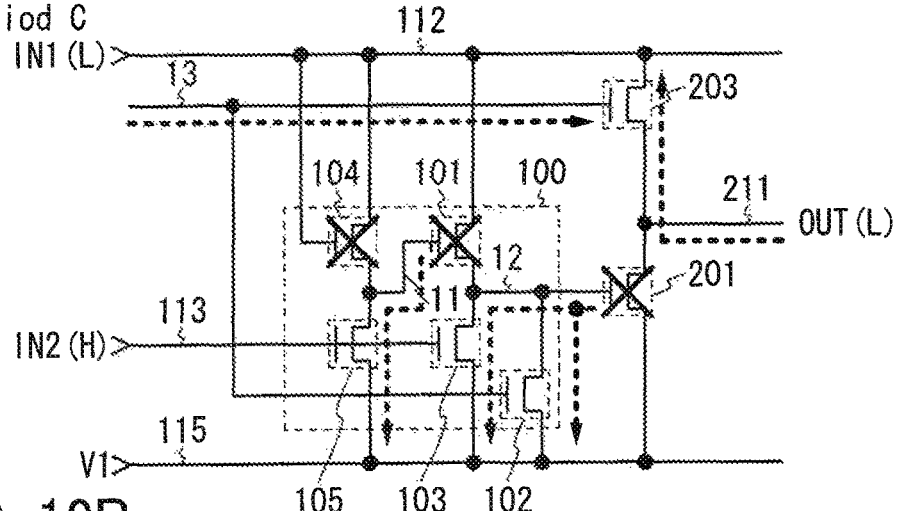
FIGS. 19A to 19C are schematic views for illustrating operation of the semiconductor device in Embodiment 2.

Next, the operation of the semiconductor device in the period C is described with reference to a schematic view in FIG. 19A. In the period C, the signal IN1 is set at an L level, the signal IN2 is set at an H level, and the potential of the node 13 (the signal IN3) is set at an H level. Thus, the circuit 100 can perform the fifth operation in FIG. 3B, so that the potential of the node 12 (the signal OUT) is set at an L level. Then, the transistor 201 is turned off, so that the wiring 115 and the wiring 211 are brought out of conduction. In this case, the potential of the node 13 becomes an H level, so that the transistor 203 is turned on. Then, the wiring 112 and the wiring 211 are brought into conduction, so that the potential of the wiring 112 (the signal IN1 at an L level) is supplied to the wiring 211. Accordingly, the potential of the wiring 112 (the signal IN1 at an L level) is supplied to the wiring 211, so that the signal GOUT is set at an L level.

Figure 19B:
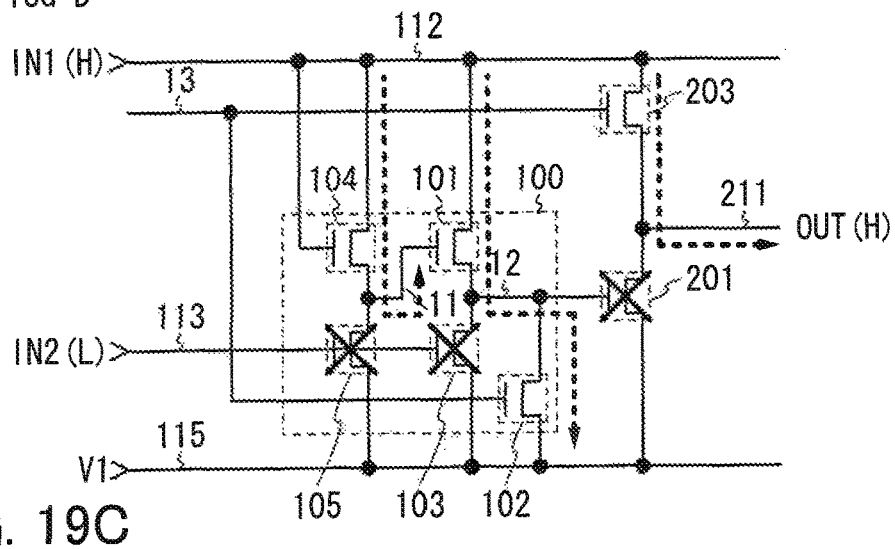

The operation of the semiconductor device in the period D is described with reference to a schematic view in FIG. 19B. In the period D, the signal IN1 is set at an H level, the signal IN2 is set at an L level, and the potential of the node 13 (the signal IN3) is set at an H level. Thus, the circuit 100 can perform the third operation in FIG. 2C, so that the potential of the node 12 (the signal OUT) is set at an L level. Then, the transistor 201 is turned off, so that the wiring 115 and the wiring 211 are brought out of conduction. In this case, the potential of the node 13 becomes an H level, so that the transistor 203 is turned off. Then, the wiring 112 and the wiring 211 are brought into conduction, so that the potential of the wiring 112 (the signal IN1 at an H level) is supplied to the wiring 211. Accordingly, the potential of the wiring 112 (the signal IN1 at an H level) is supplied to the wiring 211, so that the potential of the wiring 211 starts to rise. In this case, the node 13 is in a floating state. Then, the potential of the node 13 is raised by capacitive coupling between the gate of the transistor 203 and the second terminal of the transistor 203. Accordingly, the potential of the node 13 becomes $V_2+V_{th}203+V_a$. This is so-called bootstrap operation. Thus, the potential of the wiring 211 becomes $V_2$, so that the signal GOUT is set at an H level.

Figure 19C:
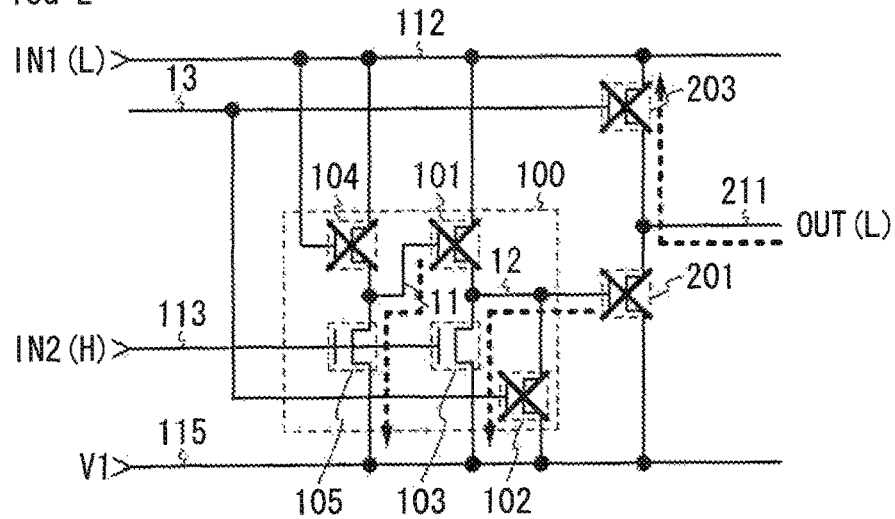

The operation of the semiconductor device in the period E is described with reference to a schematic view in FIG. 19C. In the period E, the signal IN1 is set at an L level, the signal IN2 is set at an H level, and the potential of the node 13 (the signal IN3) is set at an L level. Thus, the circuit 100 can perform the sixth operation in FIG. 3C, so that the potential of the node 12 (the signal OUT) is set at an L level. Then, the transistor 201 is turned off, so that the wiring 115 and the wiring 211 are brought out of conduction. In this case, the potential of the node 13 becomes an L level. Then, the transistor 203 is turned off, so that the wiring 112 and the wiring 211 are brought out of conduction. Note that timing of when the signal IN1 is set at an L level from an H level can be faster than timing of when the potential of the node 13 is changed from an H level to an L level. In this case, when the transistor 203 is on, that is, the wiring 112 and the wiring 211 are conducting, the signal IN1 is set at an L level. Thus, the signal IN1 at an L level is supplied to the wiring 211, so that the signal GOUT is set at an L level.

Figure 47A:
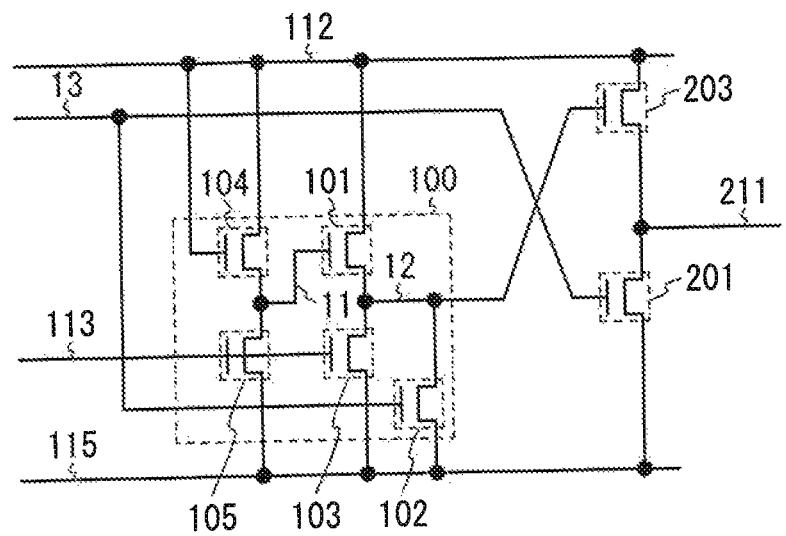
FIGS. 47A and 47B are circuit diagrams of the semiconductor device in Embodiment 2.

Note that in the structures illustrated in FIGS. 10A to 10C, FIG. 14A, FIG. 16A, and FIG. 17A, the gate of the transistor 203 can be connected to the node 12. The gate of the transistor 201 can be connected to the node 13 (FIG. 47A).

Figure 47B:
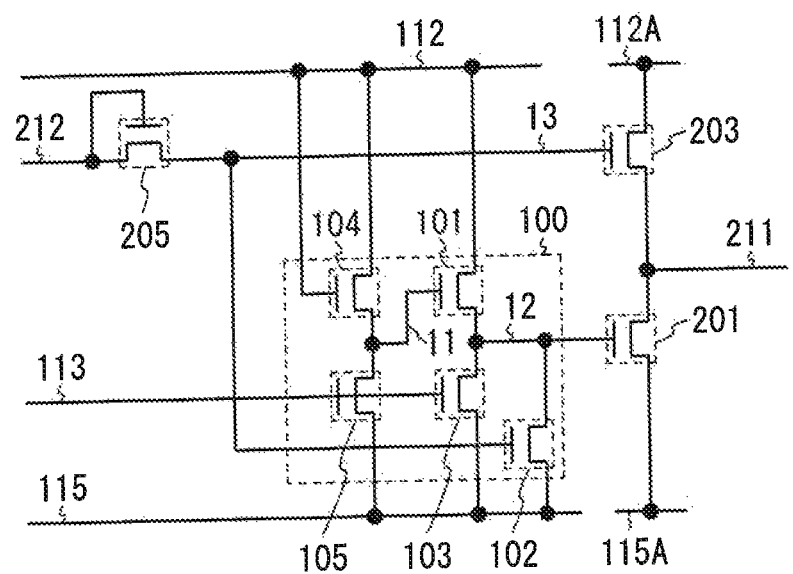

Note that in the structures illustrated in FIGS. 10A to 10C, FIG. 14A, FIG. 16A, FIG. 17A, and FIG. 47A, the circuit 100 and other transistors can be connected to different wirings. For example, as illustrated in FIG. 47B, the first terminal of the transistor 203 can be connected to a wiring which is different from the wiring 112 (e.g., the wiring 112A). The first terminal of the transistor 201 can be connected to a wiring which is different from the wiring 115 (e.g., the wiring 115A).

In the structures illustrated in FIGS. 10A to 10C, FIG. 14A, FIG. 16A, FIG. 17A, and FIGS. 47A and 47B, a transistor 204 can be additionally provided.

Figure 20A:
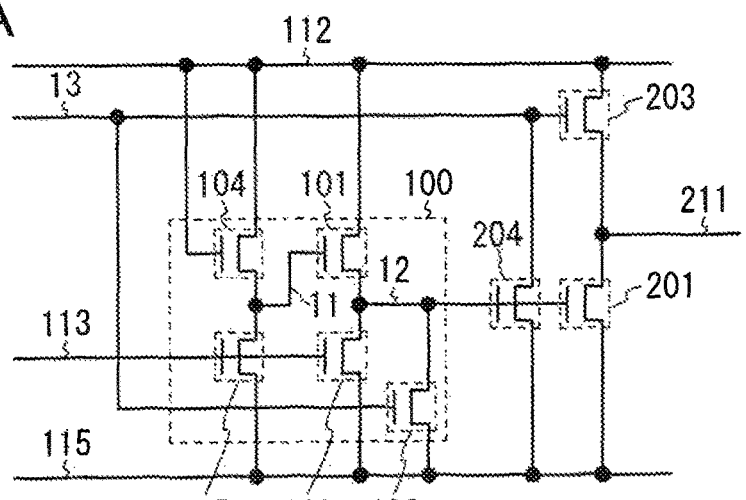
FIGS. 20A to 20C are a circuit diagram of the semiconductor device in Embodiment 2 and schematic views for illustrating operation of the semiconductor device.

FIG. 20A illustrates a structure where the transistor 204 is additionally provided in the semiconductor device in FIG. 17A. The transistor 204 is an n-channel transistor. However, this embodiment is not limited to this, and the transistor 204 can be a p-channel transistor. A first terminal of the transistor 204 is connected to the wiring 115. A second terminal of the transistor 204 is connected to the node 13. A gate of the transistor 204 is connected to the node 12.

The function of the transistor 204 is described. The transistor 204 has a function of controlling conduction between the wiring 115 and the node 13. Alternatively, the transistor 204 has a function of controlling timing of supplying the potential of the wiring 115 to the node 13. Alternatively, the transistor 204 has a function of controlling timing of supplying a signal or voltage which is to be input to the wiring 115 to the node 13 when the signal or voltage is input to the wiring 115. Alternatively, the transistor 204 has a function of controlling timing of supplying an L-level signal or the voltage $V_1$ to the node 13. Alternatively, the transistor 204 has a function of controlling timing of lowering the potential of the node 13. As described above, the transistor 204 can function as a switch. Note that the transistor 204 does not need to have all the above functions. The transistor 204 can be controlled by the potential of the node 12 (e.g., the signal OUT).

Figure 20B:
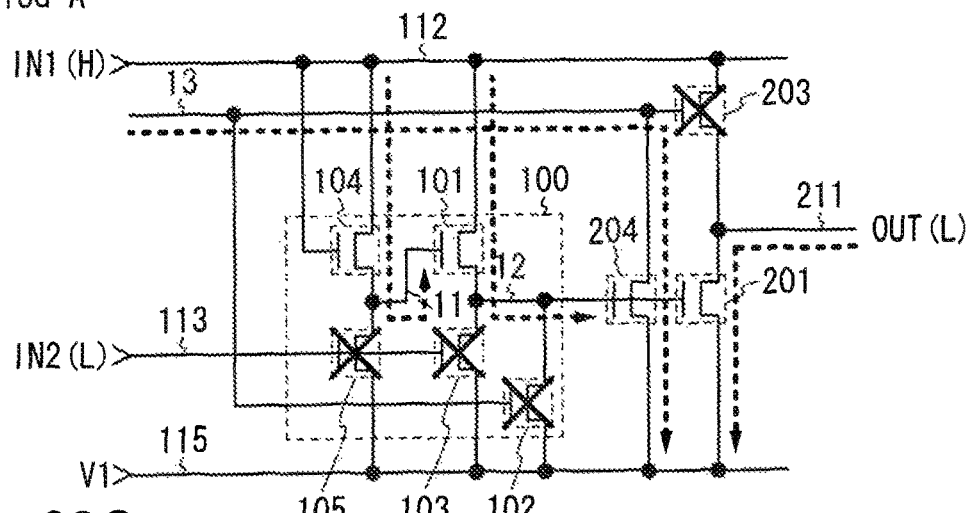
Figure 20C:
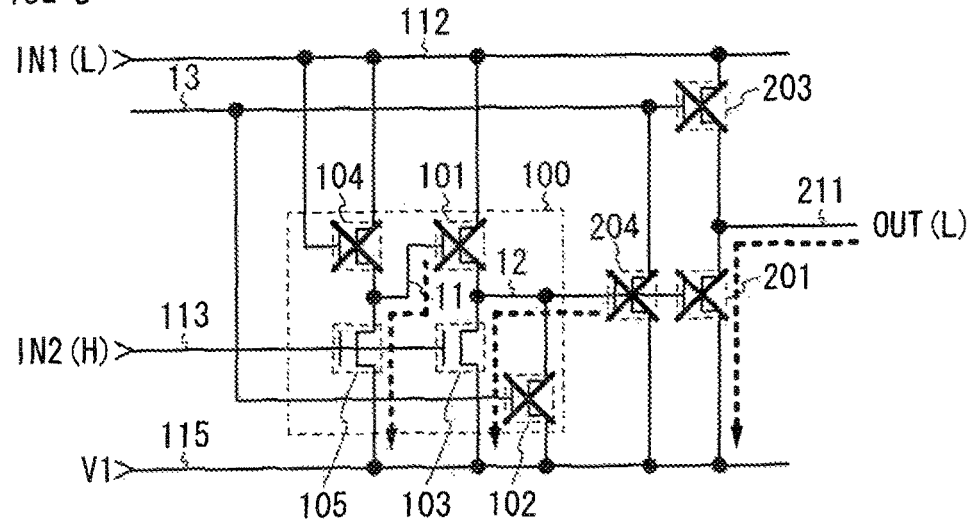

The operation of the semiconductor device in FIG. 20A is described. In a period A, an H-level signal is output from the circuit 100 as illustrated in FIG. 20B, so that the transistor 204 is turned on. Then, the wiring 115 and the node 13 are brought into conduction, so that the potential of the wiring 115 (e.g., the voltage $V_1$) is supplied to the node 13. In periods B to E, an L-level signal is output from the circuit 100, so that the transistor 204 is turned off. Thus, the wiring 115 and the node 13 are brought out of conduction. Note that FIG. 20C illustrates a schematic view of the semiconductor device in FIG. 20A in the period B.

In the structures illustrated in FIGS. 10A to 10C, FIG. 14A, FIG. 16A, FIG. 17A, FIG. 20A, and FIGS. 47A and 47B, a transistor 205 can be additionally provided.

Figure 21A:
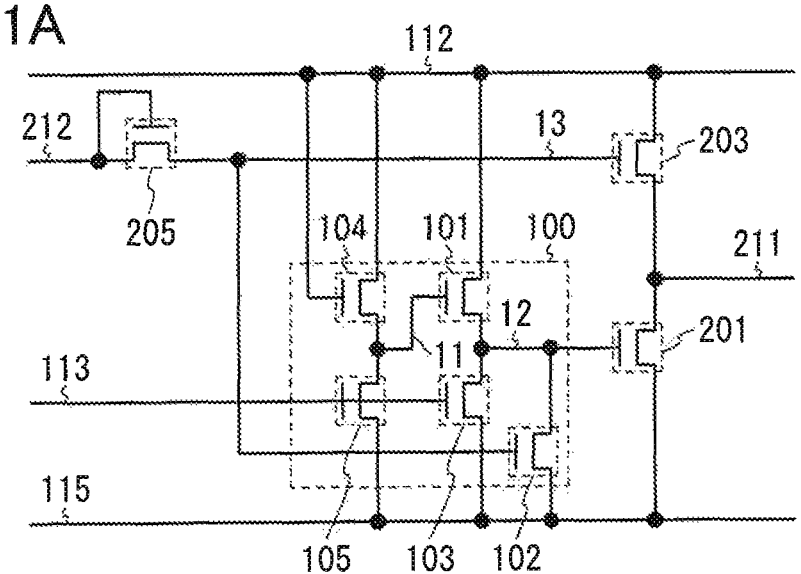
FIGS. 21A and 21B are a circuit diagram of the semiconductor device in Embodiment 2 and a timing chart for illustrating operation of the semiconductor device.

FIG. 21A illustrates a structure where the transistor 205 is additionally provided in the semiconductor device in FIG. 17A. The transistor 205 is an n-channel transistor. However, this embodiment is not limited to this, and the transistor 205 can be a p-channel transistor. A first terminal of the transistor 205 is connected to a wiring 212. A second terminal of the transistor 205 is connected to the node 13. A gate of the transistor 205 is connected to the wiring 212.

A signal which is input to the wiring 212 and the function of the wiring 212 are described. A signal IN4 is input to the wiring 212. The signal IN4 can function as a start pulse. Thus, the wiring 212 can function as a signal line. Constant voltage can be supplied to the wiring 212. Thus, the wiring 212 can function as a power supply line.

Note that when a plurality of semiconductor devices are connected, the wiring 212 is connected to the wiring 211 provided in a different semiconductor device (e.g., a semiconductor device in the preceding stage). Thus, the wiring 212 can function as a gate signal line, a scan line, a selection line, a capacitor line, or a power supply line. Further, the signal IN4 can function as a gate signal or a scan signal.

The function of the transistor 205 is described. The transistor 205 has a function of controlling conduction between the wiring 212 and the node 13. Alternatively, the transistor 205 has a function of controlling timing of supplying a potential of the wiring 212 to the node 13. Alternatively, the transistor 205 has a function of controlling timing of supplying a signal or voltage which is to be input to the wiring 212 to the node 13 when the signal or voltage is input to the wiring 212. Alternatively, the transistor 205 has a function of controlling timing of supplying an H-level signal or the voltage $V_2$ to the node 13. Alternatively, the transistor 205 has a function of stopping the supply of a signal or voltage to the node 13. Alternatively, the transistor 205 has a function of controlling timing of raising the potential of the node 13. Alternatively, the transistor 205 has a function of making the node 13 be in a floating state. As described above, the transistor 205 can function as a switch, a diode, a diode-connected transistor, or the like. Note that the transistor 205 does not need to have all the above functions. The transistor 205 can be controlled by the potential of the wiring 212 (the signal IN4) and/or the potential of the node 13.

Figure 21B:
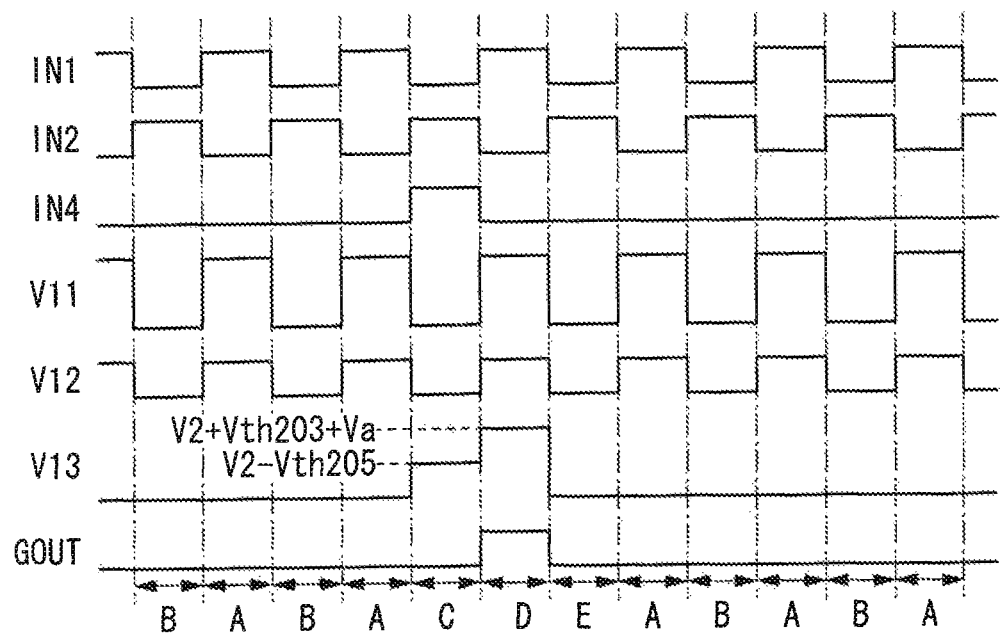
Figure 22A:
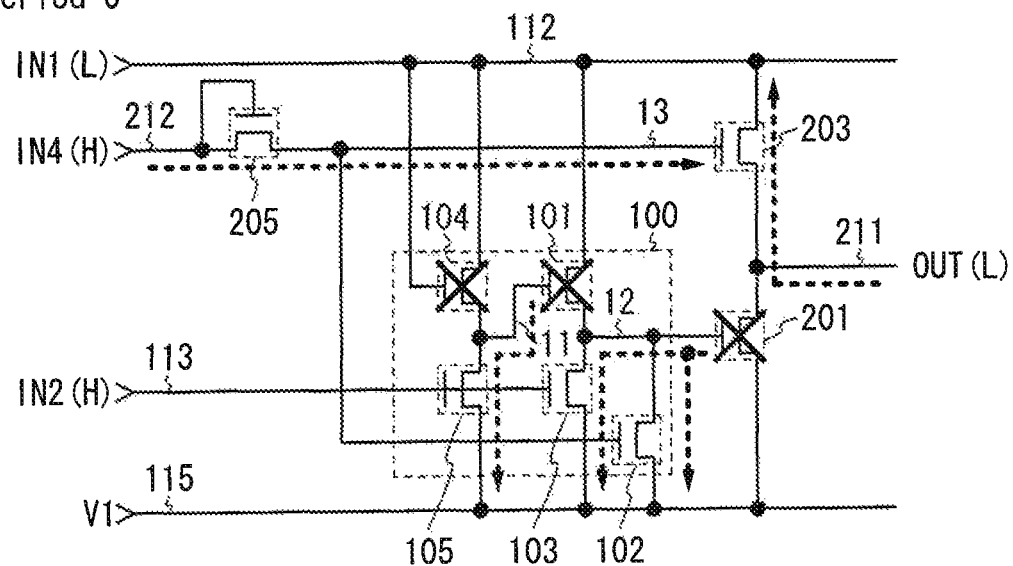
FIGS. 22A and 22B are schematic views for illustrating operation of the semiconductor device in Embodiment 2.
Figure 22B:
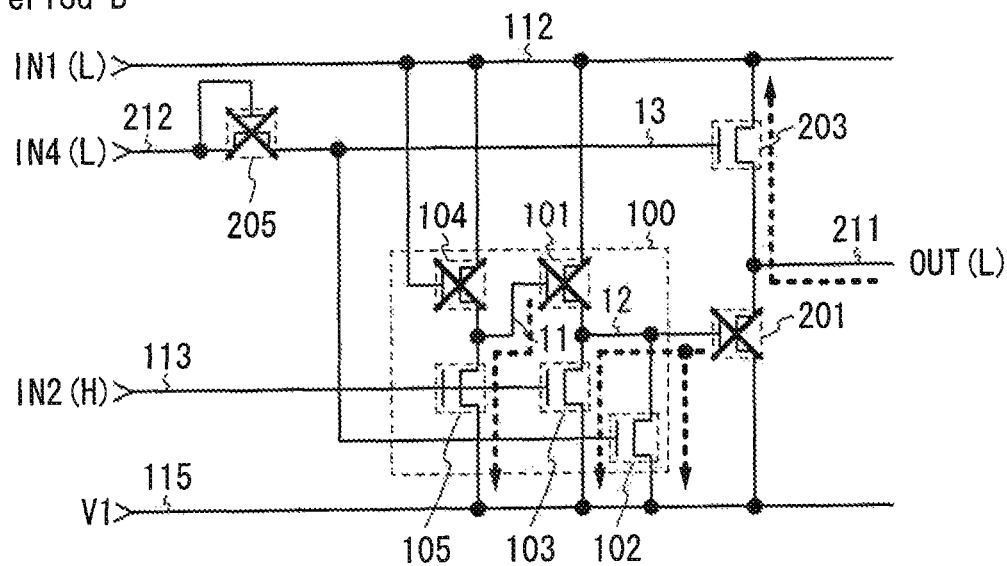

Next, the operation of the semiconductor device in FIG. 21A is described with reference to FIG. 21B. FIG. 21B illustrates a timing chart which can be applied to the semiconductor device of this embodiment. In a period C, the signal IN4 is set at an H level, as illustrated in FIG. 22A. Thus, the transistor 205 is turned on, so that the wiring 212 and the node 13 are brought into conduction. Then, the potential of the wiring 212 (e.g., the signal IN4 at an H level) is supplied to the node 13. Accordingly, the potential of the node 13 starts to rise. After that, when the potential of the node 13 becomes $V_2-V_{th}205$ (which is obtained by subtraction of the threshold voltage of the transistor 205 ($V_{th}205$) from a potential of the gate of the transistor 205 (e.g., $V_2$), the transistor 205 is turned off. Thus, the node 13 is made to be in a floating state, so that the potential of the node 13 is kept at $V_2-V_{th}205$. In periods A to B and D to E, the signal IN4 is set at an L level. Therefore, the transistor 205 is turned off, so that the wiring 212 and the node 13 are brought out of conduction. Note that FIG. 22B illustrates a schematic view of the operation of the semiconductor device in FIG. 21A in the period B.

In the structures illustrated in FIGS. 10A to 10C, FIG. 14A, FIG. 16A, FIG. 17A, FIG. 20A, FIG. 21A, and FIGS. 47A and 47B, a transistor 206 can be additionally provided.

Figure 23A:
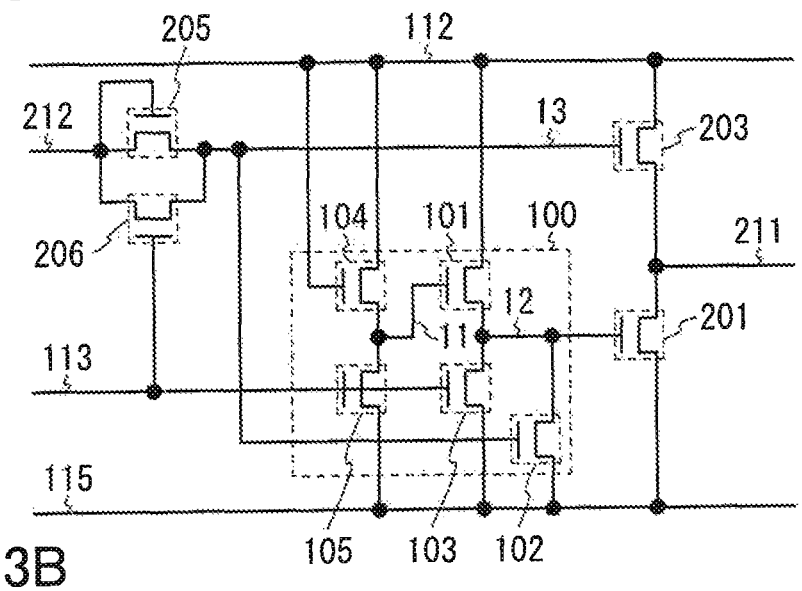
FIGS. 23A and 23B are a circuit diagram of the semiconductor device in Embodiment 2 and a schematic view for illustrating operation of the semiconductor device.

FIG. 23A illustrates a structure where the transistor 206 is additionally provided in the semiconductor device in FIG. 21A. The transistor 206 is an n-channel transistor. However, this embodiment is not limited to this, and the transistor 206 can be a p-channel transistor. A first terminal of the transistor 206 is connected to the wiring 212. A second terminal of the transistor 206 is connected to the node 13. A gate of the transistor 206 is connected to the wiring 113.

The function of the transistor 206 is described. The transistor 206 has a function of controlling conduction between the wiring 212 and the node 13. Alternatively, the transistor 206 has a function of controlling timing of supplying the potential of the wiring 212 to the node 13. Alternatively, the transistor 206 has a function of controlling timing of supplying a signal or voltage which is to be input to the wiring 212 to the node 13 when the signal or voltage is input to the wiring 212. Alternatively, the transistor 206 has a function of controlling timing of supplying an L-level signal or the voltage $V_1$ to the node 13. Alternatively, the transistor 206 has a function of controlling timing of supplying an H-level signal or the voltage $V_2$ to the node 13. Alternatively, the transistor 206 has a function of controlling timing of lowering the potential of the node 13. Alternatively, the transistor 206 has a function of controlling timing of raising the potential of the node 13. As described above, the transistor 206 can function as a switch. Note that the transistor 206 does not need to have all the above functions. The transistor 206 can be controlled by the potential of the wiring 113 (e.g., the signal IN2).

Figure 23B:
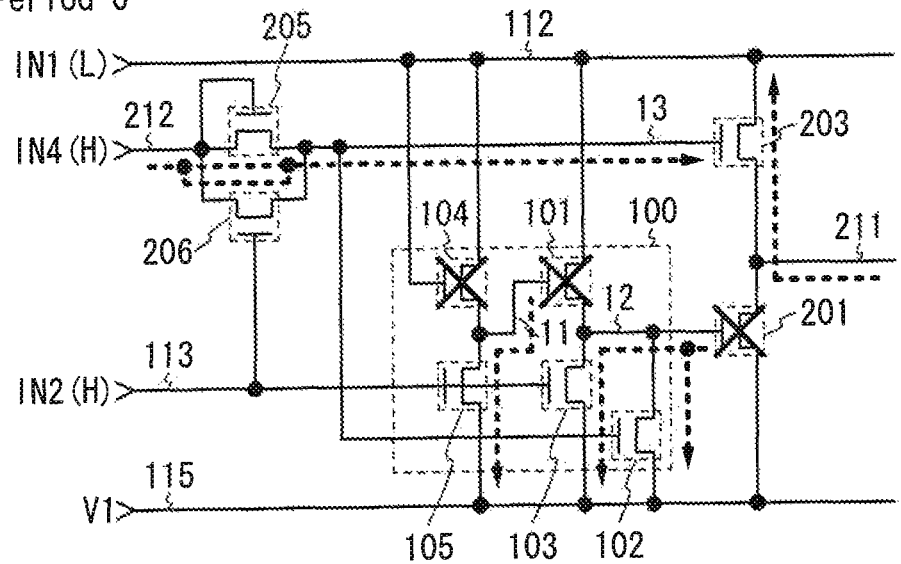

The operation of the semiconductor device in FIG. 23A is described. In a period C, the signal IN2 is set at an H level as illustrated in FIG. 23B, so that the transistor 206 is turned on. Thus, the wiring 212 and the node 13 are brought into conduction, so that the potential of the wiring 212 (e.g., the signal IN4 at an H level) is supplied to the node 13. In this manner, changes in the potential of the node 13 can be steep in the period C, so that the drive frequency of the semiconductor device can be increased.

Figure 24A:
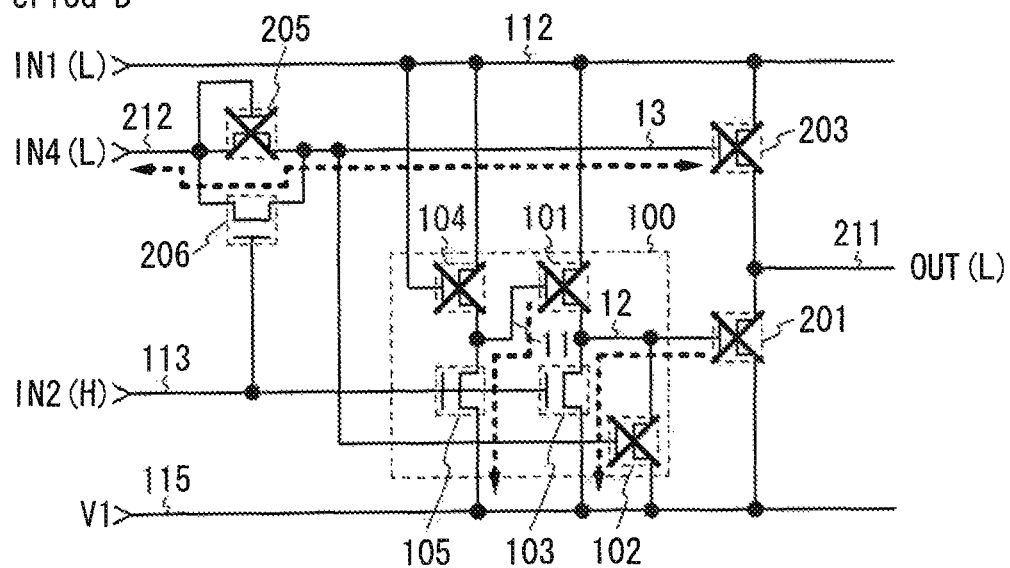
FIGS. 24A and 24B are schematic views for illustrating operation of the semiconductor device in Embodiment 2.

As in the period C, the signal IN2 is set at an H level in periods B and E, so that the transistor 206 is turned on. Thus, the wiring 212 and the node 13 are brought into conduction, so that the potential of the wiring 212 (e.g., the signal IN4 at an L level) is supplied to the node 13. In this manner, the potential of the node 13 can be fixed at a certain potential in the period B, so that a noise-resistant semiconductor device can be obtained. Alternatively, the potential of the node 13 can be lowered in the period E, so that the transistor 203 is turned off. Note that FIG. 24A illustrates a schematic view of the semiconductor device in FIG. 23A in the period B.

Figure 24B:
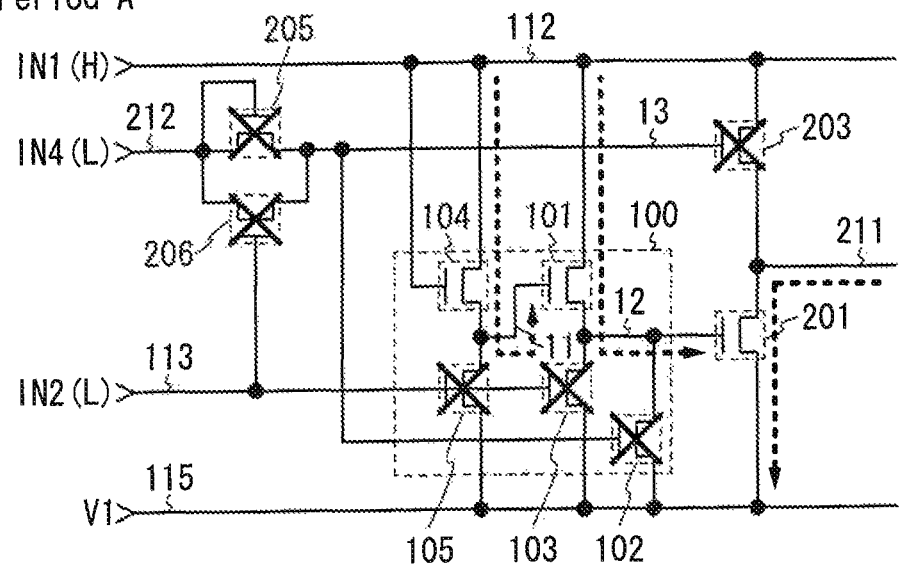

In a period A, the signal IN2 is set at an L level as illustrated in FIG. 24B, so that the transistor 206 is turned off. Thus, the wiring 212 and the node 13 are brought out of conduction. In this manner, the transistor 206 is off, so that deterioration of the transistor 206 can be suppressed.

In the structures illustrated in FIGS. 10A to 10C, FIG. 14A, FIG. 16A, FIG. 17A, FIG. 20A, FIG. 21A, FIG. 23A, and FIGS. 47A and 47B, a transistor 207 can be additionally provided.

Figure 25A:
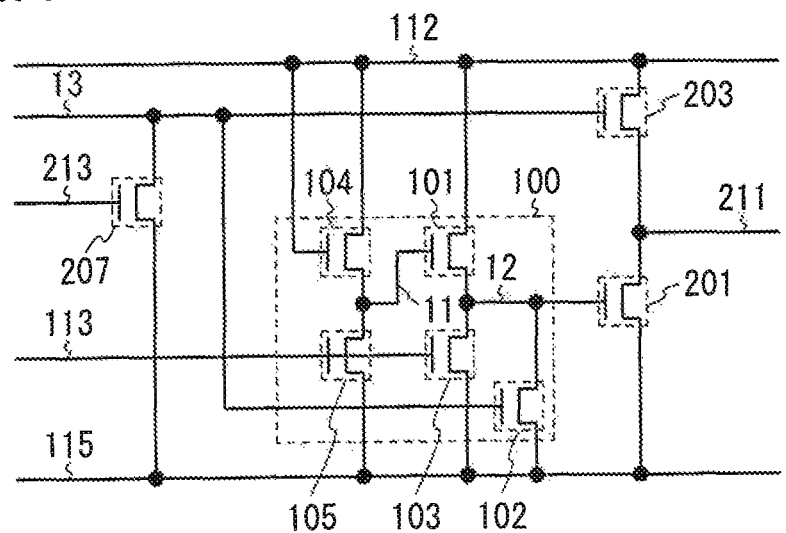
FIGS. 25A and 25B are a circuit diagram of the semiconductor device in Embodiment 2 and a timing chart for illustrating operation of the semiconductor device.

FIG. 25A illustrates a structure where the transistor 207 is additionally provided in the semiconductor device in FIG. 17A. The transistor 207 is an n-channel transistor. However, this embodiment is not limited to this, and the transistor 207 can be a p-channel transistor. A first terminal of the transistor 207 is connected to the wiring 115. A second terminal of the transistor 207 is connected to the node 13. A gate of the transistor 207 is connected to a wiring 213.

A signal which is input to the wiring 213 and the function of the wiring 213 are described. A signal IN5 is input to the wiring 213. The signal IN5 can function as a reset signal. Thus, the wiring 213 can function as a signal line. Constant voltage can be supplied to the wiring 213. Thus, the wiring 213 can function as a power supply line.

Note that when a plurality of semiconductor devices are connected, the wiring 213 is connected to the wiring 211 provided in a different semiconductor device (e.g., a semiconductor device in the next stage). Thus, the wiring 213 can function as a gate signal line, a scan line, a selection line, a capacitor line, or a power supply line. Further, the signal IN5 can function as a gate signal or a scan signal.

The function of the transistor 207 is described. The transistor 207 has a function of controlling conduction between the wiring 115 and the node 13. Alternatively, the transistor 207 has a function of controlling timing of supplying the potential of the wiring 115 to the node 13. Alternatively, the transistor 207 has a function of controlling timing of supplying a signal or voltage which is to be input to the wiring 115 to the node 13 when the signal or voltage is input to the wiring 115. Alternatively, the transistor 207 has a function of controlling timing of supplying an L-level signal or the voltage $V_1$ to the node 13. Alternatively, the transistor 207 has a function of controlling timing of lowering the potential of the node 13. As described above, the transistor 207 can function as a switch. Note that the transistor 207 does not need to have all the above functions. The transistor 207 can be controlled by a potential of the wiring 213 (e.g., the signal IN5).

Figure 25B:
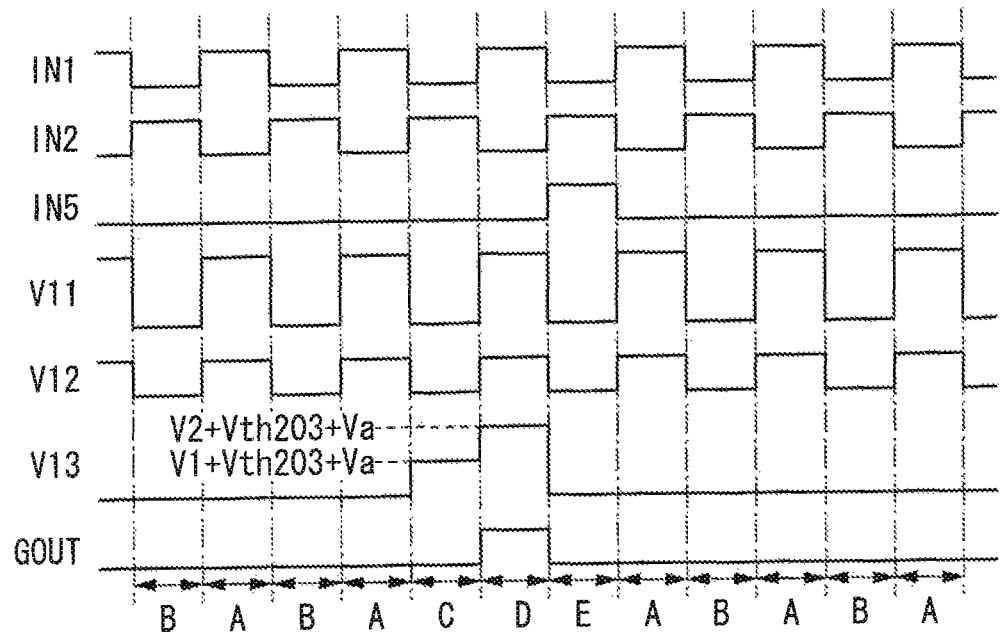
Figure 26A:
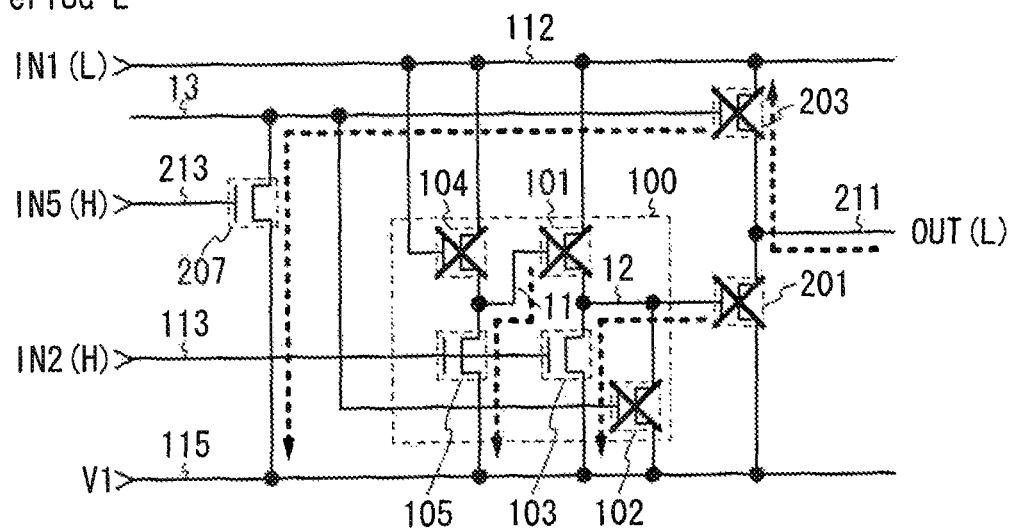
FIGS. 26A and 26B are schematic views for illustrating operation of the semiconductor device in Embodiment 2.
Figure 26B:
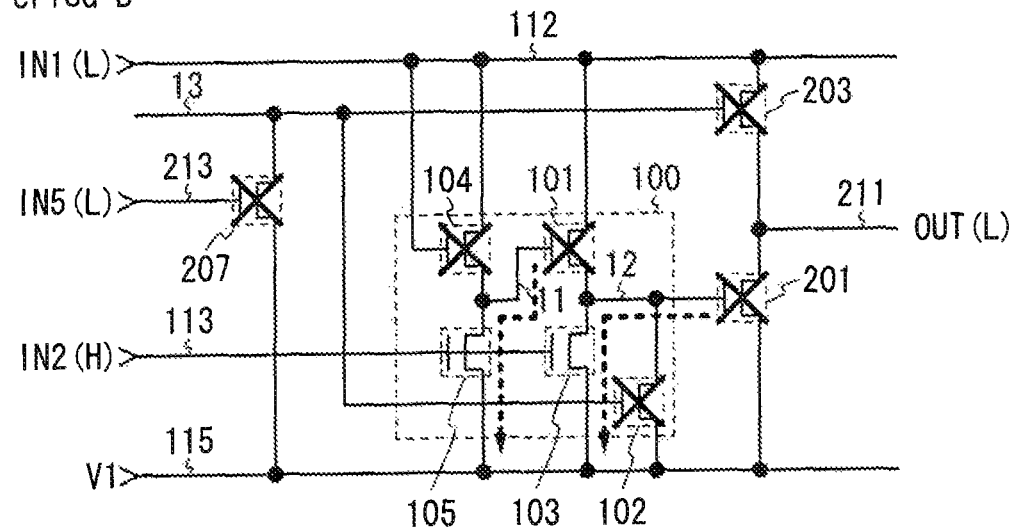

The operation of the semiconductor device in FIG. 25A is described with reference to FIG. 25B. FIG. 25B illustrates a timing chart which can be applied to the semiconductor device of this embodiment. In a period E, the signal IN5 is set at an H level, as illustrated in FIG. 26A. Thus, the transistor 207 is turned on, so that the wiring 115 and the node 13 are brought into conduction. Then, the potential of the wiring 115 (e.g., the voltage $V_1$) is supplied to the node 13. Accordingly, the potential of the node 13 is lowered. In periods A to D, the signal IN5 is set at an L level. Therefore, the transistor 207 is turned off, so that the wiring 115 and the node 13 are brought out of conduction. Note that FIG. 26B illustrates a schematic view of the operation of the semiconductor device in FIG. 25A in the period B.

In the structures illustrated in FIGS. 10A to 10C, FIG. 14A, FIG. 16A, FIG. 17A, FIG. 20A, FIG. 21A, FIG. 23A, FIG. 25A, and FIGS. 47A and 47B, the gate of the transistor 102 can be connected to a wiring which is different from the node 13 (e.g., the wiring 211).

Figure 27A:
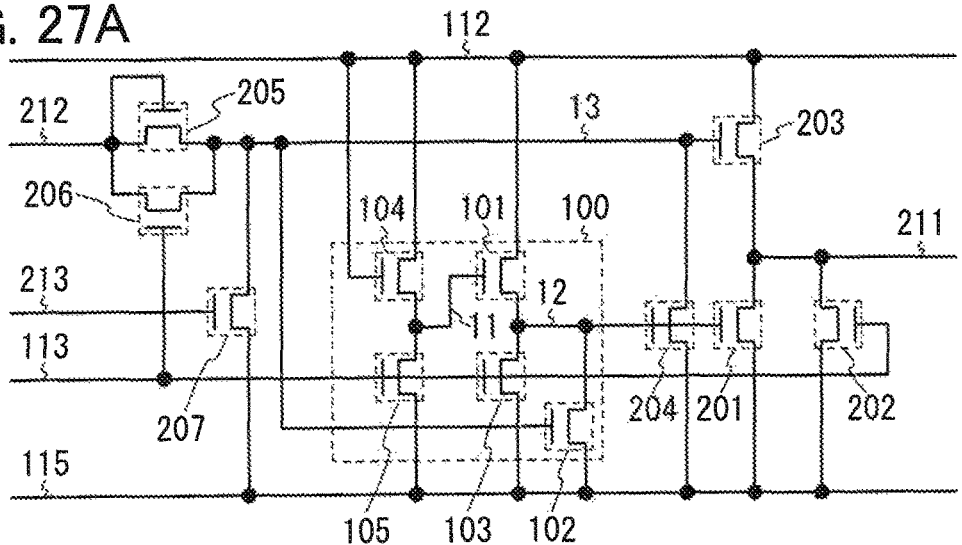
FIGS. 27A to 27C are circuit diagrams of the semiconductor device in Embodiment 2.
Figure 27B:
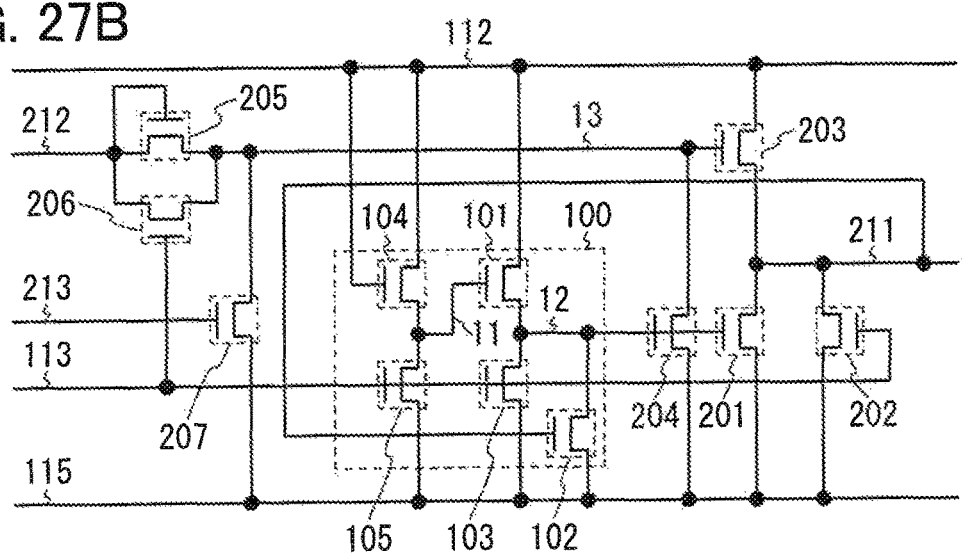

FIG. 27B illustrates a structure where the gate of the transistor 102 is connected to the wiring 211 in a semiconductor device in FIG. 27A. By application of high voltage to the gate of the transistor 102, dielectric breakdown or deterioration of the transistor 102 can be prevented.

Note that the semiconductor device in FIG. 27A corresponds to a semiconductor device in which the transistors 201 to 207 are additionally provided in the semiconductor device in FIG. 14A.

In the structures in FIGS. 10A to 10C, FIG. 14A, FIG. 16A, FIG. 17A, FIG. 20A, FIG. 21A, FIG. 23A, FIG. 25A, FIGS. 27A and 27B, and FIGS. 47A and 47B, the first terminal of the transistor 204 can be connected to a wiring which is different from the wiring 115 (e.g., the wiring 113, the wiring 212, the wiring 213, the node 12, or the node 13).

The gate of the transistor 204 can be connected to a wiring which is different from the node 12 (e.g., the wiring 112).

Figure 27C:
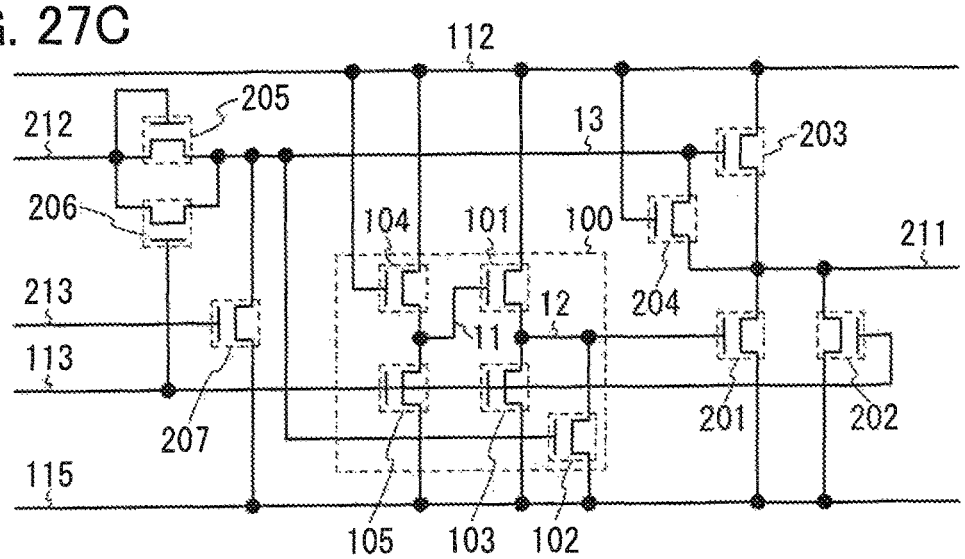

FIG. 27C illustrates a structure where the first terminal of the transistor 204 is connected to the wiring 211 and the gate of the transistor 204 is connected to the wiring 112 in the semiconductor device in FIG. 27A. Thus, in a period D, the potential of the node 13 can be lowered. Therefore, dielectric breakdown or deterioration of the transistor connected to the node 13 (e.g., the transistor 102, the transistor 203, the transistor 205, or the transistor 206) can be prevented.

In the structures illustrated in FIGS. 10A to 10C, FIG. 14A, FIG. 16A, FIG. 17A, FIG. 20A, FIG. 21A, FIG. 23A, FIG. 25A, FIGS. 27A to 27C, and FIGS. 47A and 47B, the first terminal of the transistor 205 can be connected to a wiring which is different from the wiring 212 (e.g., the wiring 113 or the wiring 116). The gate of the transistor 205 can be connected to a wiring which is different from the wiring 212 (e.g., the wiring 113 or the wiring 116).

Figure 28A:
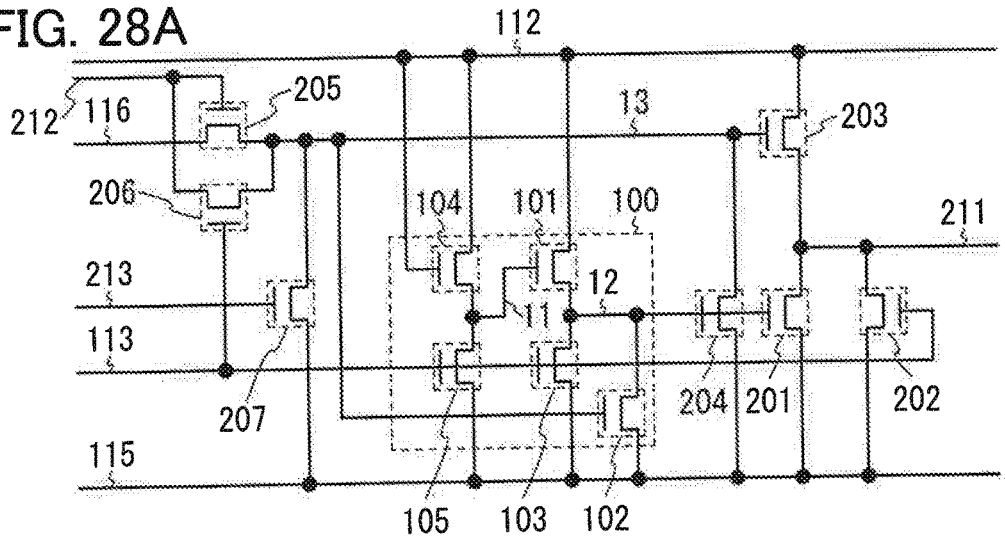
FIGS. 28A to 28C are circuit diagrams of the semiconductor device in Embodiment 2.

FIG. 28A illustrates a structure where the first terminal of the transistor 205 is connected to the wiring 116 in the semiconductor device in FIG. 27A.

In the structures illustrated in FIGS. 10A to 10C, FIG. 14A, FIG. 16A, FIG. 17A, FIG. 20A, FIG. 21A, FIG. 23A, FIG. 25A, FIGS. 27A to 27C, FIG. 28A, and FIGS. 47A and 47B, the second terminal of the transistor 207 can be connected to a wiring which is different from the node 13 (e.g., the wiring 211, the node 11, or the node 12). Alternatively, the first terminal of the transistor 207 can be connected to a wiring which is different from the wiring 115 (e.g., the wiring 112, the wiring 116, the node 11, or the node 12).

Figure 28B:
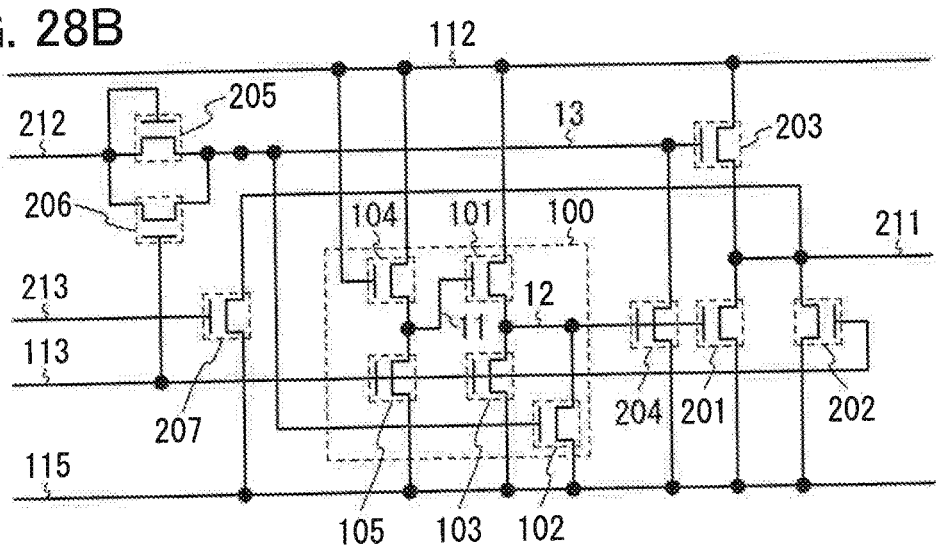

FIG. 28B illustrates a structure where the second terminal of the transistor 207 is connected to the wiring 211 in the semiconductor device in FIG. 27A. In a period E, the potential of the wiring 115 (e.g., the voltage $V_1$) can be supplied to the wiring 211 through the transistor 207. Accordingly, the fall time of the signal GOUT can be shortened.

In the structures illustrated in FIGS. 10A to 10C, FIG. 14A, FIG. 16A, FIG. 17A, FIG. 20A, FIG. 21A, FIG. 23A, FIG. 25A, FIGS. 27A to 27C, FIGS. 28A and 28B, and FIGS. 47A and 47B, the first terminal of the transistor 201 can be connected to a wiring which is different from the wiring 115 (e.g., the wiring 113, the wiring 212, the wiring 213, the node 12, or the node 13). The first terminal of the transistor 202 can be connected to a wiring which is different from the wiring 115 (e.g., the wiring 112 or the node 12). The first terminal of the transistor 204 can be connected to a wiring which is different from the wiring 115 (e.g., the wiring 113, the wiring 212, the wiring 213, the node 12, or the node 13). The first terminal of the transistor 207 can be connected to a wiring which is different from the wiring 115 (e.g., the wiring 112, the wiring 116, the wiring 212, or the node 12). The terminals of the transistors can be connected to a variety of different wirings, without limitation to the connection relationships illustrated in drawings.

Figure 28C:
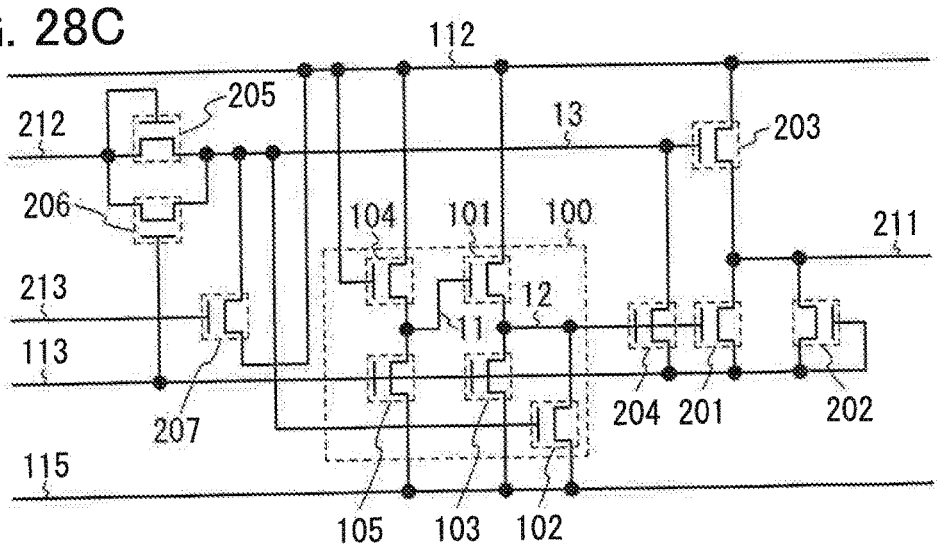

FIG. 28C illustrates a structure where the first terminal of the transistor 201, the first terminal of the transistor 202, and the first terminal of the transistor 204 are connected to the wiring 113 and the first terminal of the transistor 207 is connected to the wiring 112 in the semiconductor device in FIG. 27A. H-level signals can be input to the first terminals of the transistors 201, 202, 204, and 207, so that deterioration of these transistors can be suppressed.

In the structures illustrated in FIGS. 10A to 10C, FIG. 14A, FIG. 16A, FIG. 17A, FIG. 20A, FIG. 21A, FIG. 23A, FIG. 25A, FIGS. 27A to 27C, FIGS. 28A to 28C, and FIGS.

47A and 47B, the transistors can be replaced with diodes. For example, the transistors can be diode-connected.

Figure 29A:
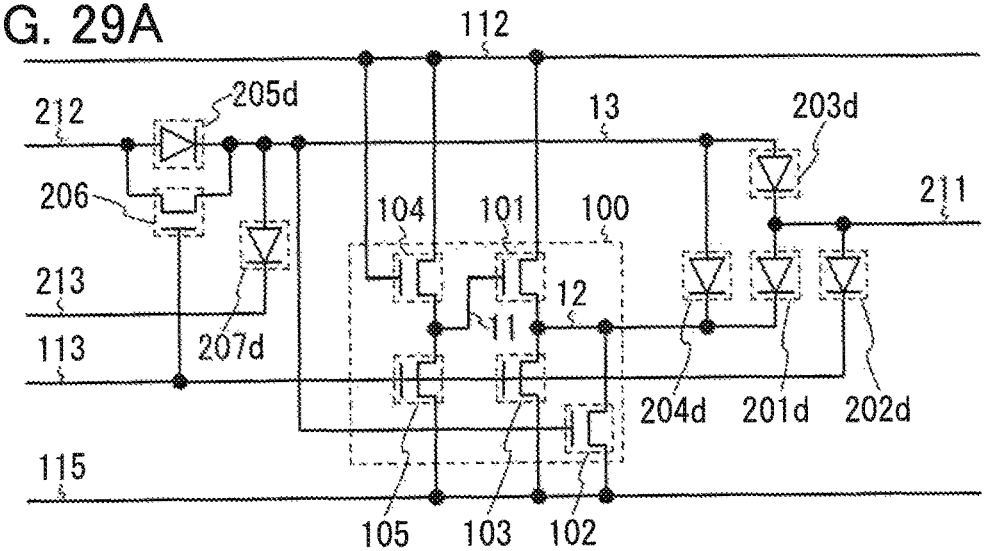
FIGS. 29A to 29C are circuit diagrams of the semiconductor device in Embodiment 2.

FIG. 29A illustrates a structure where the transistors are replaced with diodes in the semiconductor device in FIG. 27A. The transistor 201 can be replaced with a diode 201*d*. One of electrodes (e.g., an input terminal) of the diode 201*d* is connected to the wiring 211, and the other of the electrodes (e.g., an output terminal) of the diode 201*d* is connected to the node 12. The transistor 202 can be replaced with a diode 202*d*. One of electrodes (e.g., an input terminal) of the diode 202*d* is connected to the wiring 211, and the other of the electrodes (e.g., an output terminal) of the diode 202*d* is connected to the wiring 113. The transistor 203 can be replaced with a diode 203*d*. One of electrodes (e.g., an input terminal) of the diode 203*d* is connected to the node 13, and the other of the electrodes (e.g., an output terminal) of the diode 203*d* is connected to the wiring 211. The transistor 204 can be replaced with a diode 204*d*. One of electrodes (e.g., an input terminal) of the diode 204*d* is connected to the node 13, and the other of the electrodes (e.g., an output terminal) of the diode 204*d* is connected to the node 12. The transistor 205 can be replaced with a diode 205*d*. One of electrodes (e.g., an input terminal) of the diode 205*d* is connected to the wiring 212, and the other of the electrodes (e.g., an output terminal) of the diode 205*d* is connected to the node 13. The transistor 207 can be replaced with a diode 207*d*. One of electrodes (e.g., an input terminal) of the diode 207*d* is connected to the node 13, and the other of the electrodes (e.g., an output terminal) of the diode 207*d* is connected to the wiring 213. In this manner, the number of signals or power sources can be reduced. That is, the number of wirings can be reduced. Therefore, the number of connections between a substrate over which the semiconductor device of this embodiment is formed and a substrate for supplying signals to the substrate can be reduced, so that improvement in reliability, improvement in yield, reduction in manufacturing cost, or the like can be achieved. Some of the plurality of transistors in this embodiment can be replaced with diodes.

Figure 29B:
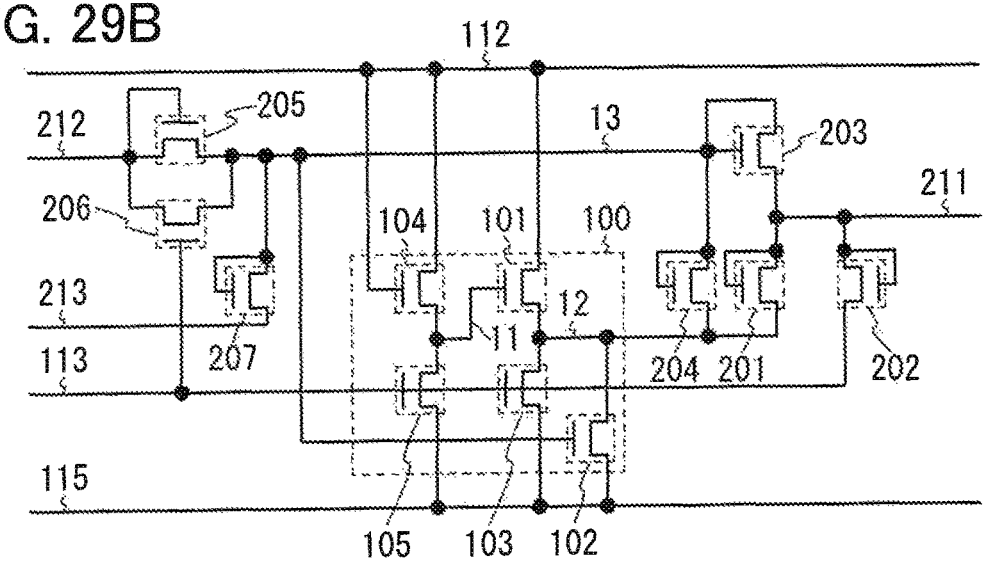

FIG. 29B illustrates a structure where the transistors are diode-connected in the semiconductor device in FIG. 27A. For example, the first terminal of the transistor 201 is connected to the node 12, and the gate of the transistor 201 is connected to the wiring 211. For example, the first terminal of the transistor 202 is connected to the wiring 113, and the gate of the transistor 202 is connected to the wiring 211. For example, the first terminal of the transistor 203 is connected to the node 13, and the gate of the transistor 203 is connected to the node 13. For example, the first terminal of the transistor 204 is connected to the node 12, and the gate of the transistor 204 is connected to the node 13. For example, the first terminal of the transistor 207 is connected to the wiring 213, and the gate of the transistor 207 is connected to the node 13. In this manner, the number of signals or power sources can be reduced. That is, the number of wirings can be reduced. Therefore, the number of connections between the substrate over which the semiconductor device of this embodiment is formed and the substrate for supplying signals to the substrate can be reduced, so that improvement in reliability, improvement in yield, reduction in manufacturing cost, or the like can be achieved. Some of the plurality of transistors of this embodiment can be diode-connected.

Figure 29C:
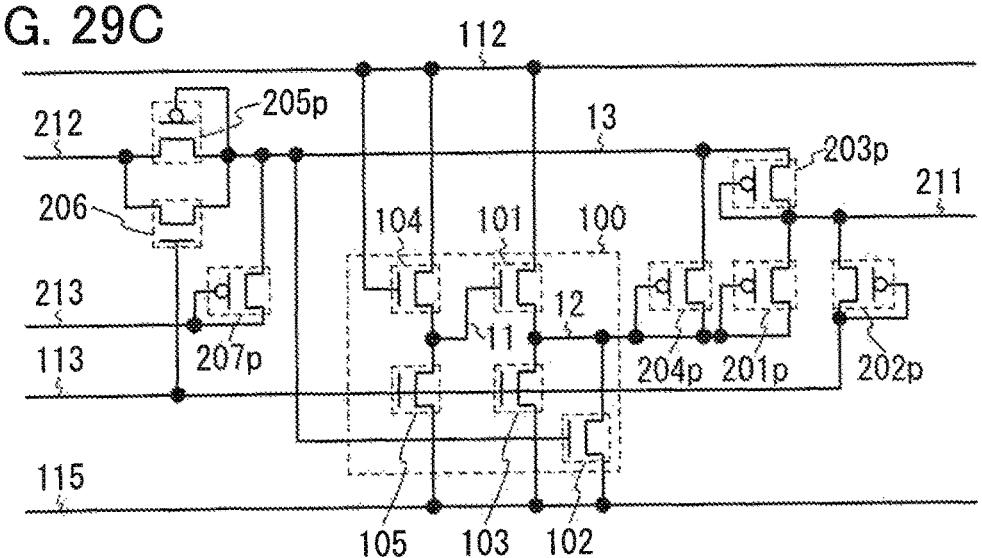

FIG. 29C illustrates a structure where p-channel transistors are diode-connected in the semiconductor device in FIG. 27A. A transistor 201*p*, a transistor 202*p*, a transistor 203*p*, a transistor 204*p*, a transistor 205*p*, and a transistor 207*p* are p-channel transistors having functions which are similar to the functions of the transistor 201, the transistor 202, the transistor 203, the transistor 204, the transistor 205, and the transistor 207, respectively. The semiconductor device in FIG. 29C has the same connection relation as the semiconductor device in FIG. 29B. Note that since the transistors are diode-connected, the semiconductor device in FIG. 29C differs from the semiconductor device in FIG. 29B in that a gate of the transistor 201*p* is connected to the node 12, a gate of the transistor 202*p* is connected to the wiring 113, a gate of the transistor 203*p* is connected to the wiring 211, a gate of the transistor 204*p* is connected to the node 12, a gate of the transistor 205*p* is connected to the node 13, and a gate of the transistor 207*p* is connected to the wiring 213. In this manner, the number of signals or power sources can be reduced. That is, the number of wirings can be reduced. Therefore, the number of connections between the substrate over which the semiconductor device of this embodiment is formed and the substrate for supplying signals to the substrate can be reduced, so that improvement in reliability, improvement in yield, reduction in manufacturing cost, or the like can be achieved. Some of the plurality of transistors in this embodiment can be diode-connected.

In the structures illustrated in FIGS. 10A to 10C, FIG. 14A, FIG. 16A, FIG. 17A, FIG. 20A, FIG. 21A, FIG. 23A, FIG. 25A, FIGS. 27A to 27C, FIGS. 28A to 28C, FIGS. 29A to 29C, and FIGS. 47A and 47B, terminals or electrodes of the transistors do not need to be connected to the same wiring. For example, the first terminal of the transistor 101, the first terminal of the transistor 104, and the first terminal of the transistor 203 can be connected to different wirings. For example, the gate of the transistor 103, the gate of the transistor 105, and the gate of the transistor 202 can be connected to different wirings. For example, the first terminal of the transistor 102, the first terminal of the transistor 105, the first terminal of the transistor 201, the first terminal of the transistor 202, the first terminal of the transistor 204, and the first terminal of the transistor 207 can be connected to different wirings. For example, the first terminal of the transistor 205 and the first terminal of the transistor 206 can be connected to different wirings. In order to realize this structure, one wiring can be divided into a plurality of wirings.

Figure 30A:
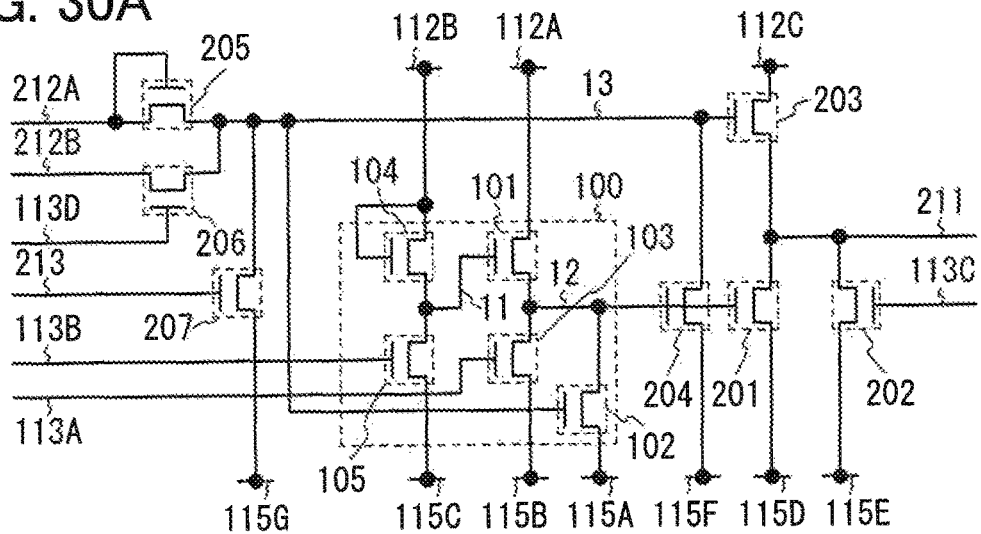
FIGS. 30A to 30C are circuit diagrams of the semiconductor device in Embodiment 2.

FIG. 30A illustrates a structure where the wiring 112 is divided into a plurality of wirings 112A to 112C, the wiring 113 is divided into a plurality of wirings 113A to 113D, the wiring 115 is divided into a plurality of wirings 115A to 115G, and the wiring 212 is divided into a plurality of wirings 212A and 212B in the semiconductor device in FIG. 27A. The first terminal of the transistor 201 is connected to the wiring 115D. The first terminal of the transistor 202 is connected to the wiring 115E, and the gate of the transistor 202 is connected to the wiring 113C. The first terminal of the transistor 203 is connected to the wiring 112C. The first terminal of the transistor 204 is connected to the wiring 115F. The first terminal and the gate of the transistor 205 are connected to the wiring 212A. The first terminal of the transistor 206 is connected to the wiring 212B. The gate of the transistor 206 is connected to the wiring 113D. The first terminal of the transistor 207 is connected to the wiring 115G.

Note that the wirings 112A to 112C can have functions which are similar to that of the wiring 112. The wirings 113A to 113D can have functions which are similar to that of the wiring 113. The wirings 115A to 115G can have functions which are similar to that of the wiring 115. The wirings 212A and 212B can have functions which are similar to that of the wiring 212. Therefore, the signal IN1 can be input to the wirings 112A to 112C. The signal IN2 can be input to the wirings 113A to 113D. The voltage $V_1$ can be supplied to the wirings 115A to 115G. The signal IN4 can be input to the wirings 212A and 212B. Different voltages or signals can be supplied to the wirings 112A to 112C. Different voltages or signals can be supplied to the wirings 113A to 113D. Different voltages or signals can be supplied to the wirings 115A to 115G. Different voltages or signals can be supplied to the wirings 212A and 212B.

In the structures illustrated in FIGS. 10A to 10C, FIG. 14A, FIG. 16A, FIG. 17A, FIG. 20A, FIG. 21A, FIG. 23A, FIG. 25A, FIGS. 27A to 27C, FIGS. 28A to 28C, FIGS. 29A to 29C, FIG. 30A, and FIGS. 47A and 47B, some of the transistors can be eliminated. For example, one of the transistor 201 and the transistor 204 can be eliminated. Alternatively, for example, when the semiconductor device includes the transistor 206, one or both of the transistor 205 and the transistor 207 can be eliminated. Some of the other transistors can be eliminated as necessary.

Figure 30B:
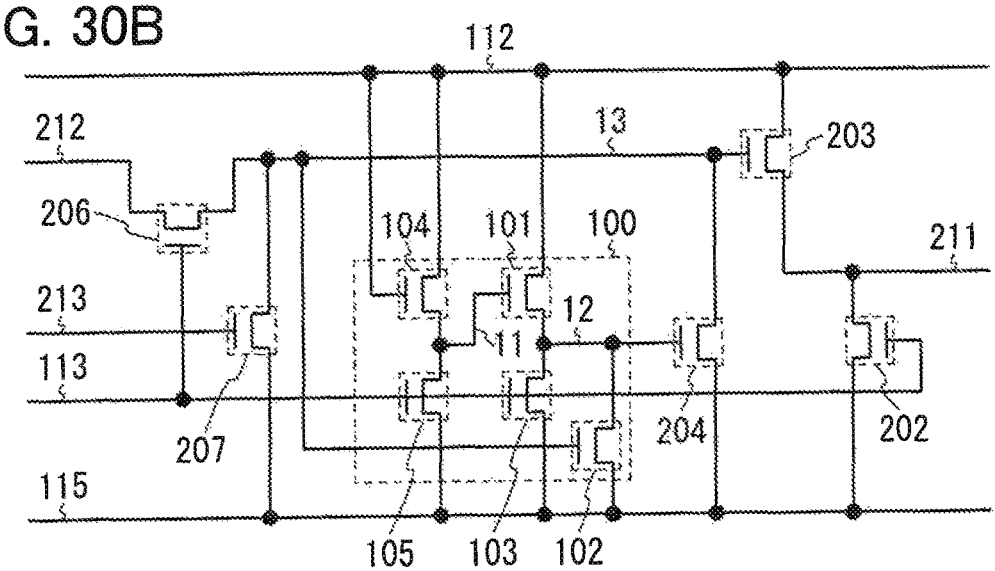

FIG. 30B illustrates a structure where the transistors 201 and 205 are eliminated from the semiconductor device in FIG. 27A. The number of transistors is reduced, so that a layout area can be decreased. Further, power consumption can be reduced.

In the structures FIGS. 10A to 10C, FIG. 14A, FIG. 16A, FIG. 17A, FIG. 20A, FIG. 21A, FIG. 23A, FIG. 25A, FIGS. 27A to 27C, FIGS. 28A to 28C, FIGS. 29A to 29C, FIGS. 30A and 30B, and FIGS. 47A and 47B, a capacitor 220 which is connected between the node 13 and the wiring 211 can be additionally provided.

Figure 30C:
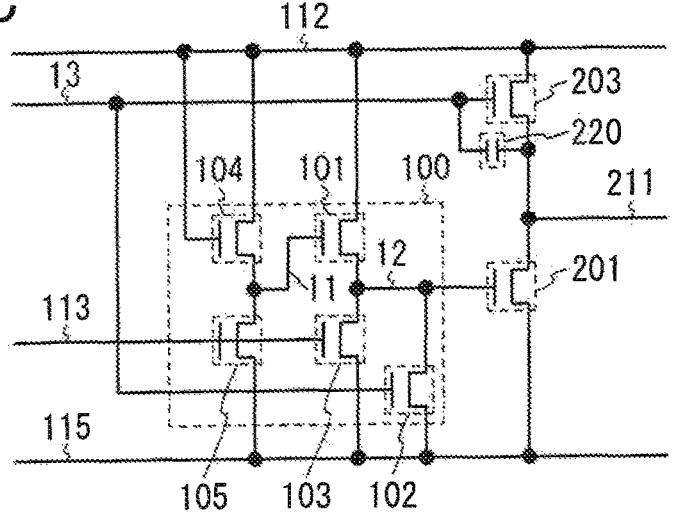

FIG. 30C illustrates a structure where the capacitor 220 which is connected between the node 13 and the wiring 211 is additionally provided in the semiconductor device in FIG. 17A. With this structure, the potential of the node 13 is likely to rise in bootstrap operation. Thus, $V_{gs}$ of the transistor 203 can be increased. Accordingly, the channel width of the transistor 203 can be made small. Alternatively, the fall time or rise time of the signal GOUT can be shortened. A MOS capacitor can be used as the capacitor, for example.

In the structures illustrated in FIGS. 10A to 10C, FIG. 14A, FIG. 16A, FIG. 17A, FIG. 20A, FIG. 21A, FIG. 23A, FIG. 25A, FIGS. 27A to 27C, FIGS. 28A to 28C, FIGS. 29A to 29C, FIGS. 30A to 30C, and FIGS. 47A and 47B, a signal which is different from the signal GOUT can be generated. For example, in the semiconductor device of this embodiment, when a signal SOUT is generated in addition to the signal GOUT and a plurality of semiconductor devices are connected, the signal SOUT is not output to the wiring 211 but can be input to a semiconductor device in a different stage as a start pulse. Thus, the degree of delay or distortion of the signal SOUT is lower than that of the signal GOUT. Therefore, the semiconductor device can be driven with a signal which does not easily cause delay or distortion, delay of an output signal of the semiconductor device can be reduced. In order to realize this, in the structures illustrated in FIG. 14A, FIG. 16A, FIG. 17A, FIG. 20A, FIG. 21A, FIG. 23A, FIG. 25A, FIGS. 27A to 27C, FIGS. 28A to 28C, FIGS. 29A to 29C, FIGS. 30A to 30C, and FIGS. 47A and 47B, a transistor 208 can be additionally provided.

Figure 31A:
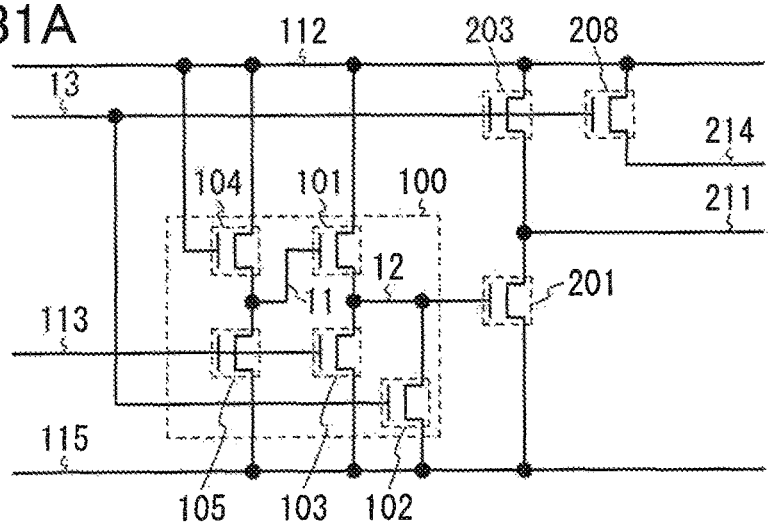
FIGS. 31A to 31C are circuit diagrams of the semiconductor device in Embodiment 2 and a timing chart for illustrating operation of the semiconductor device.
Figure 31B:
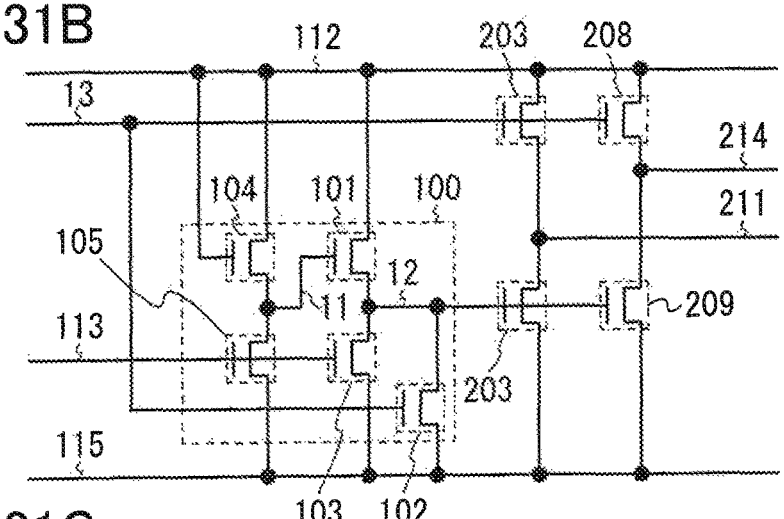
Figure 31C:
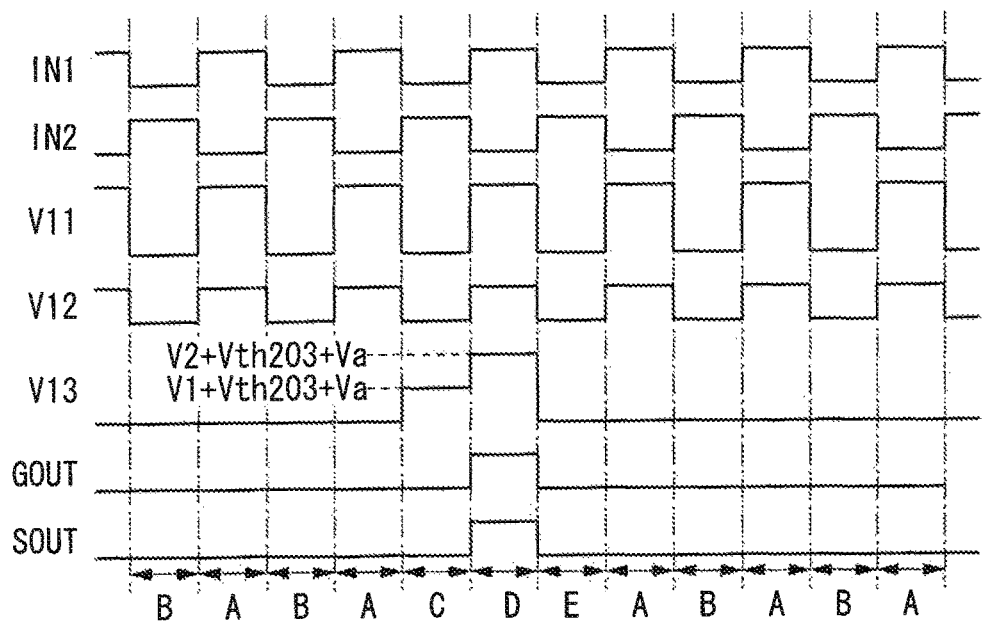

FIG. 31A illustrates a structure where the transistor 208 is additionally provided in the semiconductor device in FIG. 17A. The transistor 208 can have the same function and polarity as the transistor 203. A first terminal of the transistor 208 is connected to the wiring 112. A second terminal of the transistor 208 is connected to a wiring 214. A gate of the transistor 208 is connected to the node 13. The wiring 214 can have a function which is similar to that of the wiring 211. For example, when a plurality of semiconductor devices are connected, the wiring 211 is connected to the wiring 212 provided in a different semiconductor device (e.g., a semiconductor device in the next stage). For example, as illustrated in FIG. 31B, a transistor 209 can be additionally provided. The transistor 209 can have the same function and polarity as the transistor 203. A first terminal of the transistor 209 is connected to the wiring 115. A second terminal of the transistor 209 is connected to the wiring 214. A gate of the transistor 209 is connected to the node 12. Note that FIG. 31C illustrates a timing chart when the signal SOUT is generated in addition to the signal GOUT.

As described above, this embodiment is not limited to the structure illustrated in FIG. 14A, and a variety of different structures can be used.

In the structures illustrated in FIGS. 10A to 10C, FIG. 14A, FIG. 16A, FIG. 17A, FIG. 20A, FIG. 21A, FIG. 23A, FIG. 25A, FIGS. 27A to 27C, FIGS. 28A to 28C, FIGS. 29A to 29C, FIGS. 30A to 30C, FIGS. 31A and 31B, and FIGS. 47A and 47B, p-channel transistors can be used as the transistors. Only some of the plurality of transistors included in the semiconductor devices can be p-channel transistors. That is, a CMOS circuit can be employed in the semiconductor device of this embodiment.

Figure 32A:
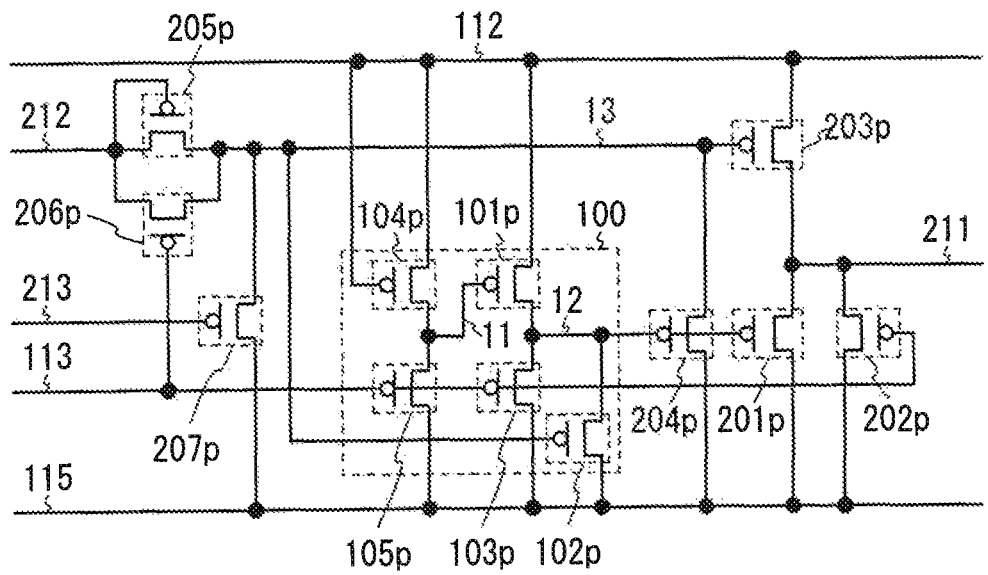
FIGS. 32A and 32B are a circuit diagram of the semiconductor device in Embodiment 2 and a timing chart for illustrating operation of the semiconductor device.
Figure 32B:
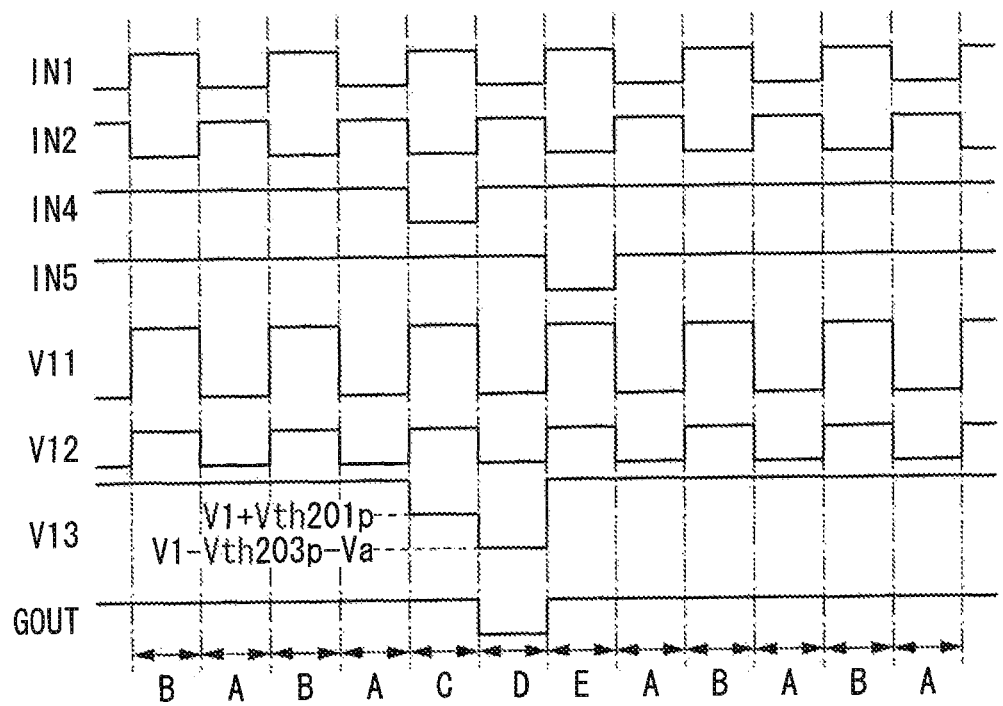

FIG. 32A illustrates a structure where p-channel transistors are used as the transistors in the semiconductor device in FIG. 27A. Transistors 201p to 207p are p-channel transistors having functions which are similar to those of the transistors 201 to 207. In such a case, the voltage $V_2$ is supplied to the wiring 115. Note that as illustrated in the timing chart in FIG. 32B, the signal IN1, the signal IN2, the signal IN4, the signal INS, the potential of the node 11, the potential of the node 12, the potential of the node 13, and the signal GOUT can be inverted.

Next, the ratio of the channel widths of the transistors 201 to 209 and the size of the transistors are described.

First, the transistor 201 supplies a potential to the wiring 211. Further, the load of the wiring 211 is larger than that of the node 12. Thus, the channel width of the transistor 201 is larger than the channel width of each of the transistors included in the circuit 100. In such a case, the channel width of the transistor 201 is preferably ten times or less the channel width of the transistor 101. More preferably, the channel width of the transistor 201 is five times or less the channel width of the transistor 101. Further preferably, the channel width of the transistor 201 is three times or less the channel width of the transistor 101.

The potential of the gate of the transistor 202 is changed more steeply than the potential of the gate of the transistor 201. Thus, the channel width of the transistor 202 is preferably smaller than the channel width of the transistor 201. In such a case, the channel width of the transistor 201 is preferably ten times or less the channel width of the transistor 202. More preferably, the channel width of the transistor 201 is seven times or less the channel width of the transistor 202. Further preferably, the channel width of the transistor 201 is five times or less the channel width of the transistor 202.

The transistor 203 changes the potential of the wiring 211 by supply of a potential to the wiring 211. Further, a large load (e.g., a gate signal line, a pixel, a transistor, or a capacitor) is connected to the wiring 211. Thus, the channel width of the transistor 203 is the largest in the transistors included in the semiconductor device of this embodiment. For example, the channel width of the transistor 203 is preferably ten times or less the channel width of the transistor 201. Much preferably, the channel width of the transistor 203 is five times or less the channel width of the transistor 201. Much preferably, the channel width of the transistor 203 is three times or less the channel width of the transistor 201.

The transistor 204 supplies a potential to the node 13. Further, the load of the node 13 is larger than that of the node 12. Thus, the channel width of the transistor 204 is smaller than the channel width of the transistor 201. In such a case, the channel width of the transistor 201 is preferably five times or less the channel width of the transistor 204. More preferably, the channel width of the transistor 201 is three times or less the channel width of the transistor 204. Further preferably, the channel width of the transistor 201 is twice or less the channel width of the transistor 204.

Since changes in the potential of the node 13 can be steep in a period A by making the channel width of the transistor 205 larger, the drive frequency of the semiconductor device can be increased. Thus, the channel width of the transistor 205 is larger than the channel width of the transistor 201 or the channel width of each of the transistors included in the circuit 100. Alternatively, the channel width of the transistor 205 is smaller than the channel width of the transistor 203. In such a case, the channel width of the transistor 203 is preferably ten times or less the channel width of the transistor 205. More preferably, the channel width of the transistor 203 is five times or less the channel width of the transistor 205. Further preferably, the channel width of the transistor 203 is twice or less the channel width of the transistor 205.

The transistor 206 keeps the potential of the node 13 by supply of a potential to the node 13. Thus, the channel width of the transistor 206 is smaller than the channel width of the transistor 205. In such a case, the channel width of the transistor 205 is preferably three times or less the channel width of the transistor 206. More preferably, the channel width of the transistor 205 is twice or less the channel width of the transistor 206. Further preferably, the channel width of the transistor 205 is 1.8 times or less the channel width of the transistor 206.

The transistor 207 decreases the potential of the node 13 by supply of a potential to the node 13. Note that the transistor 203 can be turned on in a period E by making the decrease in the potential of the node 13 slower. In this manner, the transistor 203 can supply a potential to the wiring 211 in the period E, so that the potential of the wiring 211 can be quickly decreased. Thus, the channel width of the transistor 207 is preferably smaller than the channel width of the transistor 205. In such a case, the channel width of the transistor 205 is preferably ten times or less the channel width of the transistor 207. More preferably, the channel width of the transistor 205 is seven times or less the channel width of the transistor 207. Further preferably, the channel width of the transistor 205 is five times or less the channel width of the transistor 207.

The transistor 208 supplies a potential to the wiring 214. Further, the load of the wiring 214 is smaller than that of the wiring 211. Thus, the channel width of the transistor 208 is smaller than the channel width of the transistor 203. In such a case, the channel width of the transistor 203 is preferably ten times or less the channel width of the transistor 208. More preferably, the channel width of the transistor 203 is seven times or less the channel width of the transistor 208. Further preferably, the channel width of the transistor 203 is four times or less the channel width of the transistor 208.

The transistor 209 supplies a potential to the wiring 214. Further, the load of the wiring 214 is smaller than that of the wiring 211. Thus, the channel width of the transistor 209 is smaller than the channel width of the transistor 203. In such a case, the channel width of the transistor 203 is preferably seven times or less the channel width of the transistor 209. More preferably, the channel width of the transistor 203 is four times or less the channel width of the transistor 209. Further preferably, the channel width of the transistor 203 is 2.5 times or less the channel width of the transistor 209.

Note that considering the ratio of the channel widths of the transistors, the channel width of the transistor 201 is preferably 1000 to 5000 µm. More preferably, the channel width of the transistor 201 is 1500 to 4000 µm. Further preferably, the channel width of the transistor 201 is 2000 to 3000 µm. The channel width of the transistor 202 is preferably 200 to 3000 µm. More preferably, the channel width of the transistor 202 is 300 to 2000 µm.

Further preferably, the channel width of the transistor 202 is 400 to 1000 µm. The channel width of the transistor 203 is preferably 2000 to 30000 µm. More preferably, the channel width of the transistor 203 is 3000 to 15000 µm. Further preferably, the channel width of the transistor 203 is 4000 to 10000 µm. The channel width of the transistor 204 is preferably 200 to 2500 µm. More preferably, the channel width of the transistor 204 is 400 to 2000 µm. Further preferably, the channel width of the transistor 204 is 700 to 1500 µm. The channel width of the transistor 205 is preferably 500 to 3000 µm. More preferably, the channel width of the transistor 205 is 1000 to 2500 µm. Further preferably, the channel width of the transistor 205 is 1500 to 2000 µm. The channel width of the transistor 206 is preferably 300 to 2000 µm. More preferably, the channel width of the transistor 206 is 500 to 1500 µm. Further preferably, the channel width of the transistor 206 is 800 to 1300 µm. The channel width of the transistor 207 is preferably 100 to 1500 µm. More preferably, the channel width of the transistor 207 is 300 to 1000 µm. Further preferably, the channel width of the transistor 207 is 400 to 800 µm. The channel width of the transistor 208 is preferably 300 to 5000 µm. More preferably, the channel width of the transistor 208 is 500 to 2000 µm. Further preferably, the channel width of the transistor 208 is 800 to 1500 µm. The channel width of the transistor 209 is preferably 200 to 2000 µm. More preferably, the channel width of the transistor 209 is 400 to 1500 µm. Further preferably, the channel width of the transistor 209 is 500 to 1000 µm.

(Embodiment 3)

In this embodiment, a display device, a pixel included in the display device and a shift register circuit included in the display device are described. Note that the shift register circuit can include the semiconductor device in Embodiment 1 or 2.

First, a display device is described with reference to FIGS. 33A to 33D. The display device includes a circuit 1001, a circuit 1002, a circuit 1003_1, a pixel portion 1004, and a terminal 1005. A plurality of wirings can be arranged so as to extend over the pixel portion 1004 from the circuit 1003_1. The wirings can function as gate signal lines or scan lines. Alternatively, a plurality of wirings can be arranged so as to extend over the pixel portion 1004 from the circuit 1002. The wirings have functions as video signal lines or data lines. Pixels are provided so as to correspond to the wirings extending from the circuit 1003_1 and to the wirings extending from the circuit 1002. For example, a variety of different wirings can be provided in the pixel portion 1004. The wirings can functions as gate signal lines, data lines, power supply lines, capacitor lines, or the like.

Note that the circuit 1001 has a function of supplying a signal, voltage, current, or the like to the circuits 1002 and 1003. Alternatively, the circuit 1001 has a function of controlling the circuits 1002 and 1003. As described above, the circuit 1001 can function as a controller, a control circuit, a timing generator, a power supply circuit, a regulator, or the like.

Note that the circuit 1002 has a function of supplying a video signal to the pixel portion 1004. Alternatively, the circuit 1002 has a function of controlling the luminance, transmittance, or the like of a pixel included in the pixel portion 1004. As described above, the circuit 1002 functions as a driver circuit, a source driver, a signal line driver circuit, or the like.

Note that the circuits 1003_1 and 1003_2 have a function of supplying a scan signal or a gate signal to the pixel portion 1004. Alternatively, the circuits 1003_1 and 1003_2 have a function of selecting a pixel included in the pixel portion 1004. As described above, the circuits 1003_1 and 1003_2 each functions as a driver circuit, a gate driver, or a scan line driver circuit. Note that the circuits 1003_1 and 1003_2 can drive either the same wiring or different wirings. For example, the circuit 1003_1 can drive a gate signal line in an odd-numbered stage, and the circuit 1003_2 can drive a gate signal line in an even-numbered stage.

Note that the circuits 1001, 1002, 1003_1, and 1003_2 can be formed over the same substrate as the pixel portion 1004 or can be formed over a substrate which is different from the substrate over which the pixel portion 1004 is formed (e.g., a semiconductor substrate or an SOI substrate).

Figure 33A:
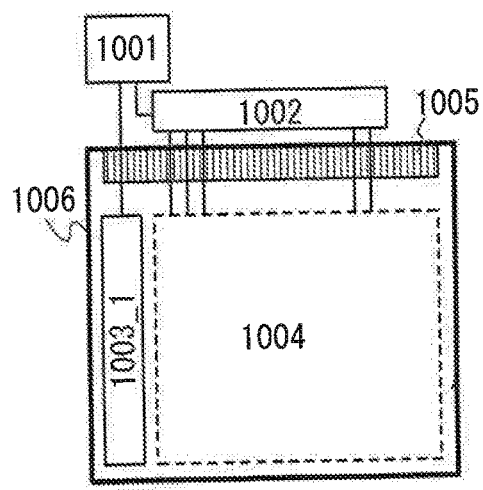
FIGS. 33A to 33E are block diagrams of a display device in Embodiment 3 and a circuit diagram of a pixel.

FIG. 33A illustrates a structure where the circuit 1003_1 is formed over the same substrate 1006 as the pixel portion 1004 and the circuits 1001 and 1002 are formed over a substrate which is different from the substrate over which the pixel portion 1004 is formed. The drive frequency of the circuit 1003_1 is lower than that of the circuit 1001 or 1002. Thus, a non-single-crystal semiconductor, an amorphous semiconductor, a microcrystalline semiconductor, an oxide semiconductor, an organic semiconductor, or the like can be easily used for a semiconductor layer of a transistor. Accordingly, the display device can be made larger and manufactured at low cost.

Figure 33B:
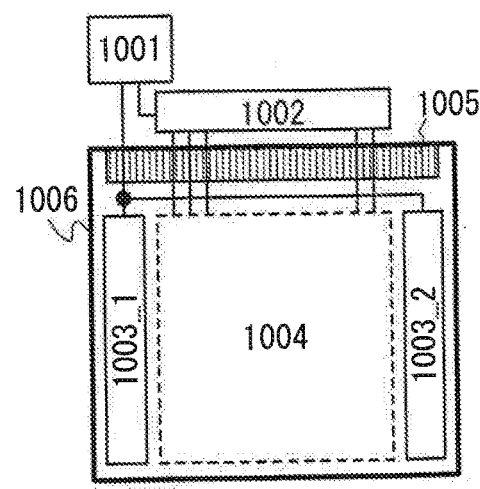

FIG. 33B illustrates a structure where the circuits 1003_1 and 1003_2 are formed over the same substrate 1006 as the pixel portion 1004, while the circuits 1001 and 1002 are formed over a substrate which is different from the substrate over which the pixel portion 1004 is formed. The drive frequency of each of the circuits 1003_1 and 1003_2 is lower than that of the circuit 1001 or 1002. Thus, a non-single-crystal semiconductor, an amorphous semiconductor, a microcrystalline semiconductor, an oxide semiconductor, an organic semiconductor, or the like can be easily used for a semiconductor layer of a transistor. Accordingly, the display device can be made larger and manufactured at low cost.

Figure 33C:
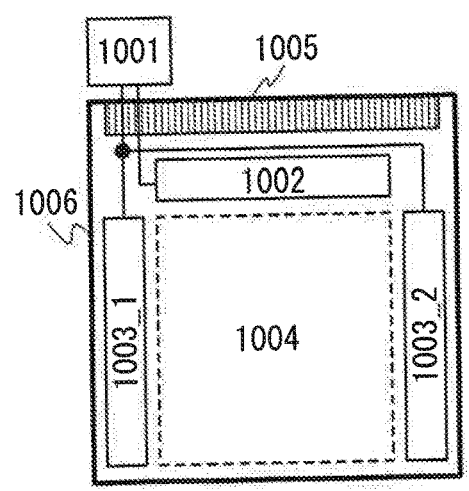
Figure 33D:
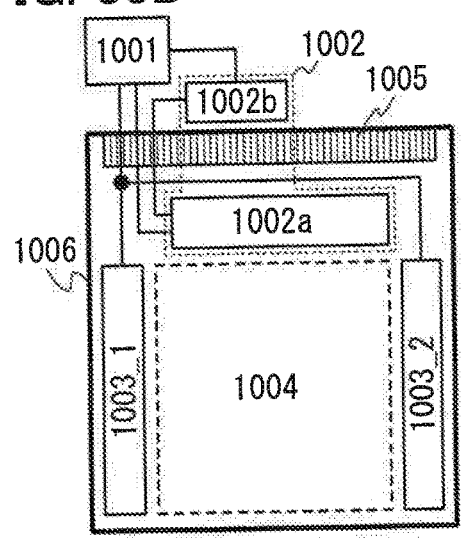

FIG. 33C illustrates a structure where the circuits 1002, 1003_1, and 1003_2 are formed over the same substrate 1006 as the pixel portion 1004, while the circuit 1001 is formed over a substrate which is different from the substrate over which the pixel portion 1004 is formed.

FIG. 33C illustrates a structure where a circuit 1002a, which is part of the circuit 1002, and the circuits 1003_1 and 1003_2 are formed over the same substrate 1006 as the pixel portion 1004, while the circuit 1001 and a circuit 1002b, which is another part of the circuit 1002, are formed over a substrate which is different from the substrate over which the pixel portion 1004 is formed. In this case, as the circuit 1002a, a circuit with low drive frequency, such as a switch, a shift register, and/or a selector can be used.

Figure 33E:
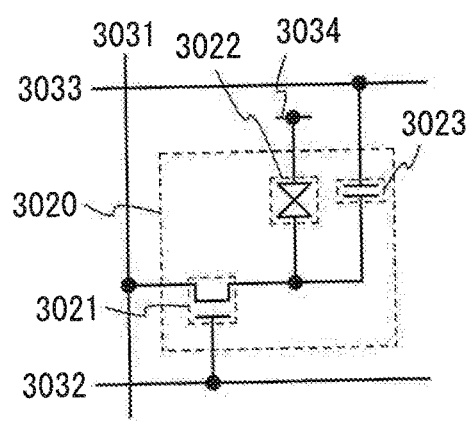

Next, a pixel included in the pixel portion 1004 is described with reference to FIG. 33E. A pixel 3020 includes a transistor 3021, a liquid crystal element 3022, and a capacitor 3023. A first terminal of the transistor 3021 is connected to a wiring 3031. A second terminal of the transistor 3021 is connected to one of the two electrodes of the liquid crystal element 3022 and one of the two electrodes of the capacitor 3023. A gate of the transistor 3021 is connected to a wiring 3032. The other of the electrodes of the liquid crystal element 3022 is connected to an electrode 3034. The other of the electrodes of the capacitor 3023 is connected to a wiring 3033.

A video signal is input from the circuit 1002 in FIGS. 33A to 33D to the wiring 3031. Thus, the wiring 3031 can function as a signal line, a video signal line, or a source signal line. A scan signal, a selection signal, or a gate signal is input from the circuits 1003_1 and 1003_2 in FIGS. 33A to 33D to the wiring 3032. Thus, the wiring 3032 can function as a signal line, a scan line, or a gate signal line. Constant voltage can be supplied from the circuit 1001 in FIGS. 33A to 33D to the wiring 3033 and the electrode 3034. Thus, the wiring 3033 can function as a power supply line or a capacitor line. Alternatively, the electrode 3034 can function as a common electrode or a counter electrode. For example, precharge voltage can be supplied to the wiring 3031. The level of the precharge voltage is approximately equal to the level of the voltage supplied to the electrode 3034. As another example, a signal can be input to the wiring 3033. In this manner, voltage applied to the liquid crystal element 3022 can be controlled, so that the amplitude of a video signal can be decreased or inversion driving can be performed. As another example, a signal can be input to the electrode 3034. In this manner, frame inversion driving can be performed.

The transistor 3021 has a function of controlling conduction between the wiring 3031 and one of the electrodes of the liquid crystal element 3022. Alternatively, the transistor 3021 has a function of controlling timing of writing a video signal to a pixel. In this manner, the transistor 3021 functions as a switch. The capacitor 3023 has a function of holding a difference between a potential of one of the electrodes of the liquid crystal element 3022 and a potential of the wiring 3033. Alternatively, the capacitor 3023 has a function of holding voltage applied to the liquid crystal element so that the level of the voltage is constant. In this manner, the capacitor 3023 functions as a storage capacitor.

Next, a shift register circuit is described with reference to FIG. 34. The shift register circuit can be included in the circuit 1002, the circuit 1003_1, and/or the circuit 1003_2.

A shift register circuit 1100 includes a plurality of flip-flop circuits 1101_1 to 1101_N (N is a natural number). Note that the semiconductor device described in Embodiment 1 or 2 can be used for each of the flip-flop circuits 1101_1 to 1101_N.

The shift register circuit 1100 is connected to wirings 1111_1 to 1111_N, a wiring 1112, a wiring 1113, a wiring 1114, a wiring 1115, and a wiring 1116. In a flip-flop circuit 1101_i (i is a natural number of any one of 1 to N), the wiring 211 is connected to the wiring 1111_1; the wiring 112 is connected to the wiring 1112; the wiring 113 is connected to the wiring 1113; the wiring 212 is connected to a wiring 1111_i−1; the wiring 213 is connected to a wiring 1111_i+1; and the wiring 115 is connected to the wiring 1115. Note that in a flip-flop circuit in an odd-numbered stage and a flip-flop circuit in an even-numbered stage, portions to which the wiring 112 and the wiring 113 are connected are inversed. Note that in the flip-flop circuit 1101_1, the wiring 212 is connected to the wiring 1114. In the flip-flop circuit 1101_N, the wiring 213 is connected to the wiring 116.

Next, an example of a signal or voltage which is input to or output from each wiring and the function of each wiring are described. Signals GOUT_1 to GOUT_N are output from the wirings 1111_1 to 1111_N. The signals GOUT_1 to GOUT_N are signals often output from the flip-flop circuits 1101_1 to 1101_N and can have functions which are similar to that of the signal GOUT. Thus, the wirings 1111_1 and 1111_N can have functions which are similar to those of the wiring 211. A signal GCK1 is input to the wiring 1112, and a signal GCK2 is input to the wiring 1113. The signal GCK1 can have a function which is similar to that of the signal IN2 or IN3, and the signal GCK2 can have a function which is similar to that of the signal IN2 or IN3. Thus, the wiring 1112 can have a function which is similar to that of the wiring 112 or 113, and the wiring 1113 can have a function which is similar to that of the wiring 112 or 113. A signal GSP is input to the wiring 1114. The signal GSP can have a function which is similar to that of the signal IN4. Thus, the wiring 1114 can have a function which is similar to that of the wiring 212. The voltage $V_1$ is supplied to the wiring 1115. Thus, the wiring 1115 can have a function which is similar to that of the wiring 115. A signal GRE is input to the wiring 1116. The signal GRE can have a function which is similar to that of the signal IN5. Thus, the wiring 1116 can have a function which is similar to that of the wiring 213.

Figure 34:
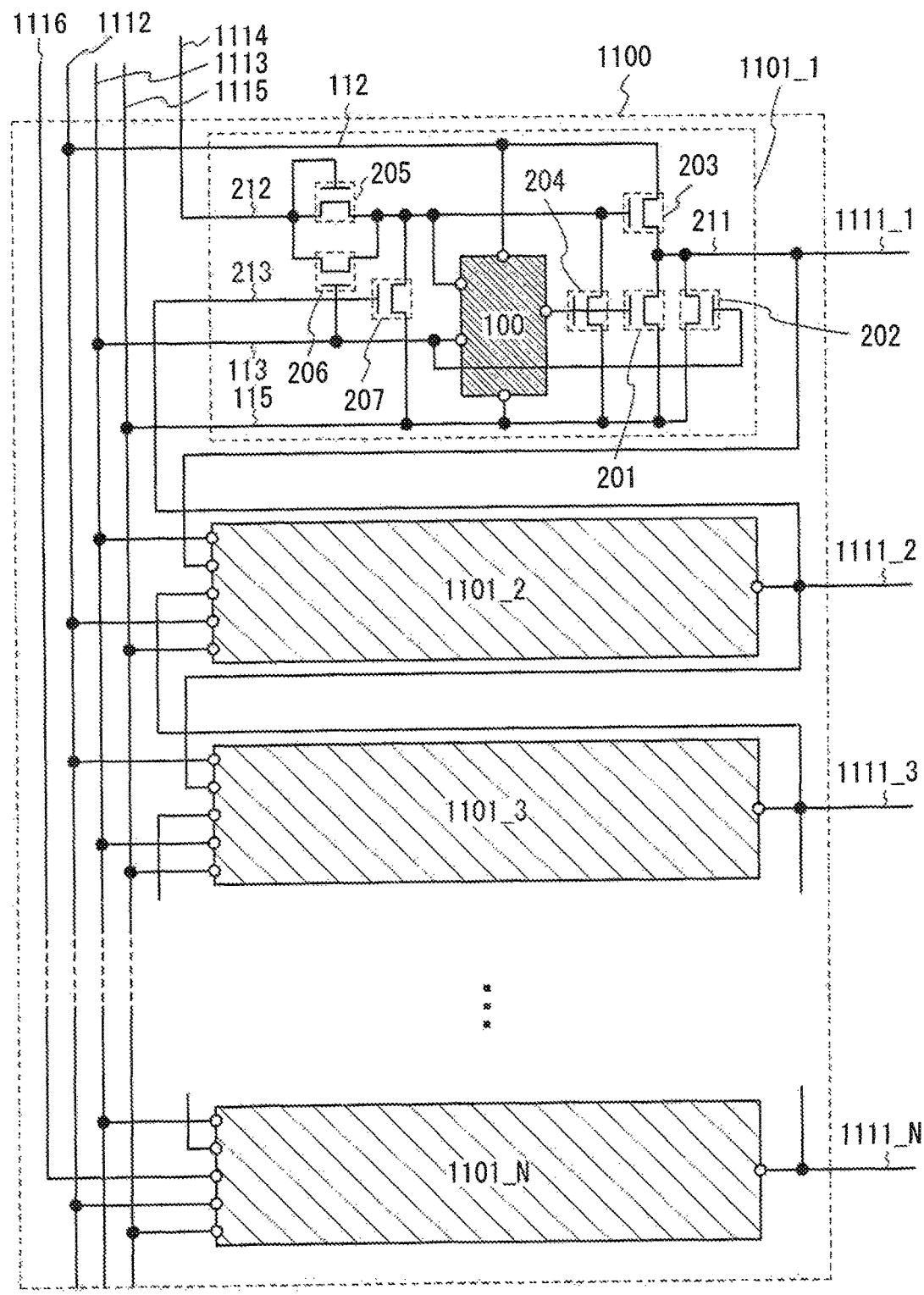
FIG. 34 is a circuit diagram of a shift register in Embodiment 3.
Figure 35:
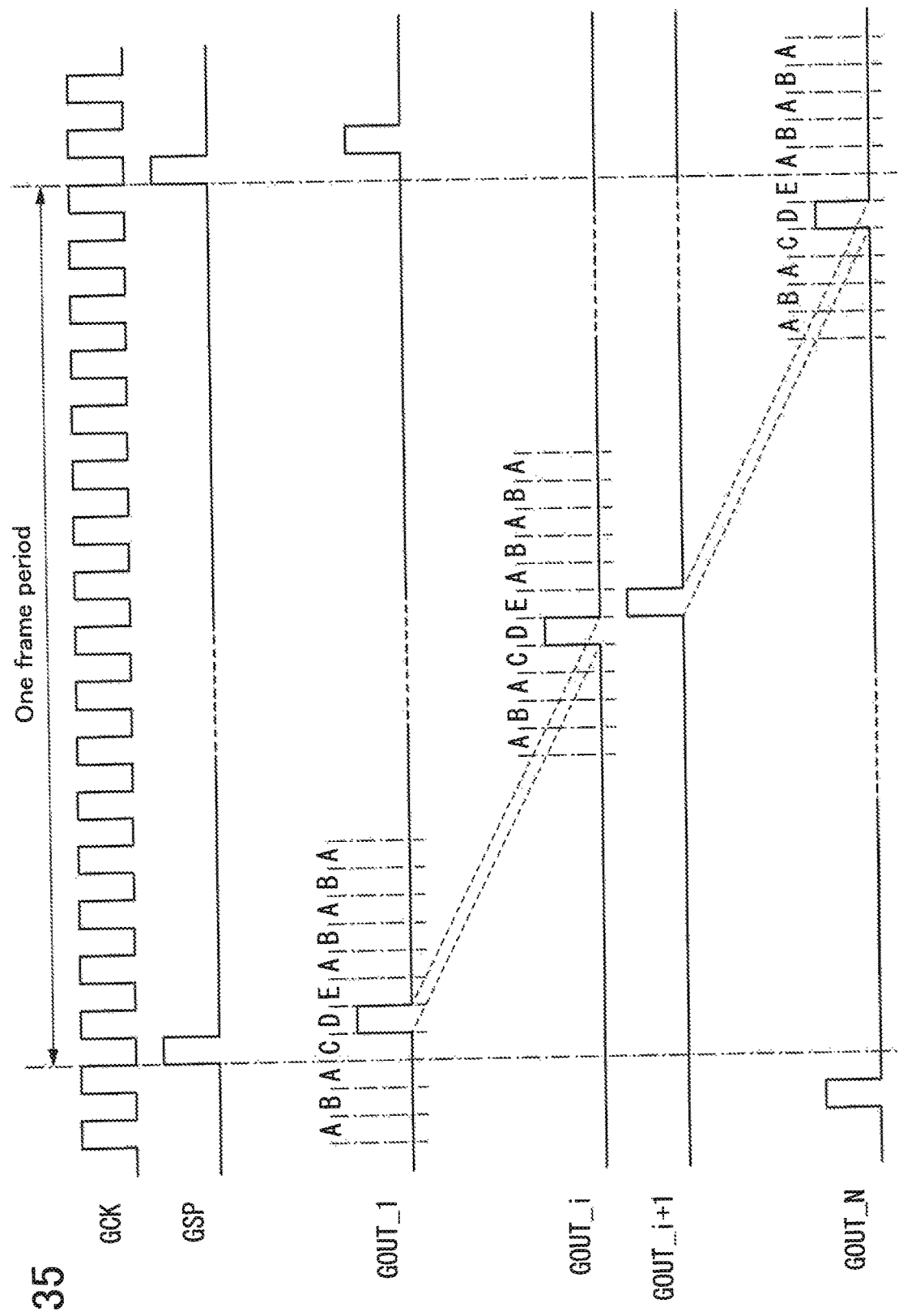
FIG. 35 is a timing chart for illustrating operation of the shift register in Embodiment 3.

Next, the operation of the shift register circuit in one flame period in FIG. 34 is described with reference to a timing chart in FIG. 35.

For example, a signal GOUT_i−1 is set at an H level. Then, the flip-flop circuit 1101_i starts operation in a period C. After the signal GCK1 and the signal GCK2 are inverted, the flip-flop circuit 1101_i starts operation in a period D. Thus, the signal GOUT_i is set at an H level. Since the signal GOUT_i is input to a flip-flop circuit 1101_i+1, the flip-flop circuit 1101_i+1 starts operation in the period C. After the signal GCK1 and the signal GCK2 are inverted, the flip-flop circuit 1101_i+1 starts operation in the period D. Then, a signal GOUT_i+1 is set at an H level. Since the signal GOUT_i+1 is input to the flip-flop circuit 1101_i, the flip-flop circuit 1101_i starts operation in a period E. Thus, the signal GOUT_i is set at an L level. Then, every time the signal GCK1 and the signal GCK2 are inverted, the flip-flop circuit 1101_i repeats operation in a period A and operation in a period B. Thus, the signal GOUT_i is kept at an L level. Note that in FIG. 35, one of the signal GCK1 and the signal GCK2 is shown as GCK.

Note that the semiconductor device described in Embodiment 1 or 2 can be used for the shift register in this embodiment. Therefore, the H level of the signals GOUT_1 to GOUT_N can be increased to $V_2$, so that the length of a time during which the transistor included in the pixel is on can be longer. Accordingly, a time for writing a video signal to the pixel can be adequately secured, so that display quality can be improved. Alternatively, since the fall time and the rise time of the signals GOUT_1 to GOUT_N can be shortened, a video signal for a pixel in a selected row can be prevented from being written to a pixel in a different row. Therefore, display quality can be improved. Alternatively, since variation in the fall time of the signals GOUT_1 to GOUT_N can be suppressed, variation in the influence of feedthrough for the video signal held in the pixel can be suppressed. Thus, display unevenness due to crosstalk or the like can be suppressed. Alternatively, since the size of the transistor can be made small, a load on the shift register (e.g., parasitic capacitance) can be reduced. Therefore, the current supply capability of an external circuit having a function of supplying a signal, voltage, or the like to the shift register can be decreased, the size of the external circuit or the size of a display device including the external circuit can be made small.

(Embodiment 4)

In this embodiment, a signal line driver circuit is described. Note that the signal line driver circuit can be referred to as a semiconductor device or a signal generation circuit.

First, the structure of a signal line driver circuit is described with reference to FIG. 36A. The signal line driver circuit includes a circuit 2001 and a circuit 2002. The circuit 2002 includes a plurality of circuits 2002_1 to 2002_N (N is a natural number). The circuits 2002_1 to 2002_N each include a plurality of transistors 2003_1 to 2003_k (k is a natural number). The transistors 2003_1 to 2003_k are n-channel transistors. However, this embodiment is not limited to this. The transistors 2003_1 to 2003_k can be either p-channel transistors or CMOS switches.

The connection relation of the signal line driver circuit is described taking the circuit 2002_1 as an example. First terminals of the transistors 2003_1 to 2003_k are connected to wirings 2004_1 to 2004_k, respectively. Second terminals of the transistors 2003_1 to 2003_k are connected to wirings S1 to Sk, respectively. Gates of the transistors 2003_1 to 2003_k are connected to the wiring 2004_1.

The circuit 2001 has a function of controlling timing of sequentially outputting H-level signals to wirings 2005_1 to 2005_N or a function of sequentially selecting the circuits 2002_1 to 2002_N. In this manner, the circuit 2001 functions as a shift register. The circuit 2001 can output H-level signals to the wirings 2005_1 to 2005_N in different orders. Alternatively, the circuit 2001 can select the circuits 2002_1 to 2002_N in different orders. In this manner, the circuit 2001 can function as a decoder.

The circuit 2002_1 has a function of controlling timing of when the wirings 2004_1 to 2004_k and the wirings S1 to Sk are brought into conduction. Alternatively, the circuit 2001_1 has a function of controlling timing of supplying potentials of the wirings 2004_1 to 2004_k to the wirings S1 to Sk. In this manner, the circuit 2002_1 can function as a selector. Note that each of the circuits 2002_2 to 2002_N can have a function which is similar to the function of the circuit 2002_1.

Each of the transistors 2003_1 to 2003_N has a function of controlling timing of when the wirings 2004_1 to 2004_k and the wirings S1 to Sk are brought into conduction. Alternatively, each of the transistors 2003_1 to 2003_N has a function of controlling timing of supplying the potentials of the wirings 2004_1 to 2004_k to the wirings S1 to Sk. For example, the transistor 2003_1 has a function of controlling timing of when the wiring 2004_1 and the wiring S1 are brought into conduction. Alternatively, the transistor 2003_1 has a function of controlling timing of supplying the potential of the wiring 2004_1 to the wiring S1. In this manner, each of the transistors 2003_1 to 2003_N can function as a switch.

Note that signals are supplied to the wirings 2004_1 to 2004_k. The signals are analog signals corresponding to image data or image signals. In this manner, the signals can function as video signals. Therefore, the wirings 2004_1 to 2004_k can function as signal lines. For example, depending on the pixel structure, the signals can be digital signals, analog voltage, or analog current.

Figure 36A:
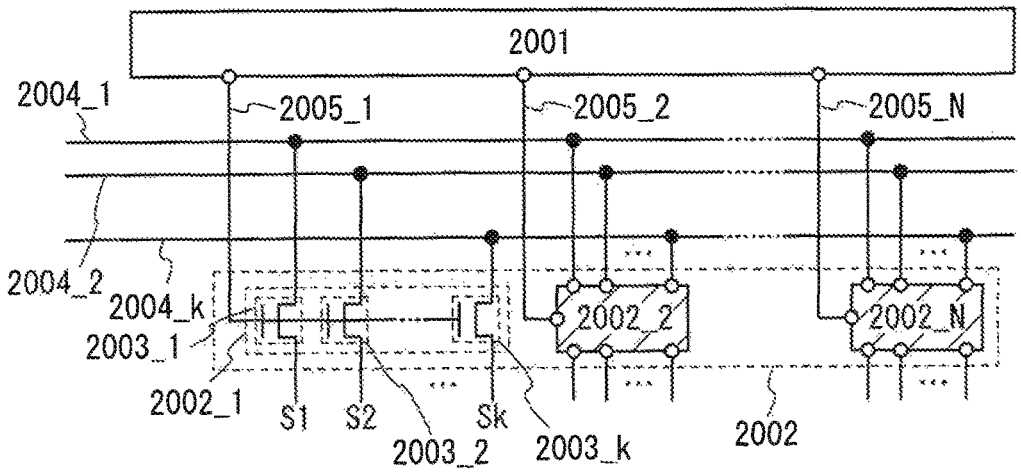
FIGS. 36A to 36D are a circuit diagram of a signal line driver circuit in Embodiment 4, a timing chart for illustrating operation of the signal line driver circuit, and block diagrams of display devices.
Figure 36B:
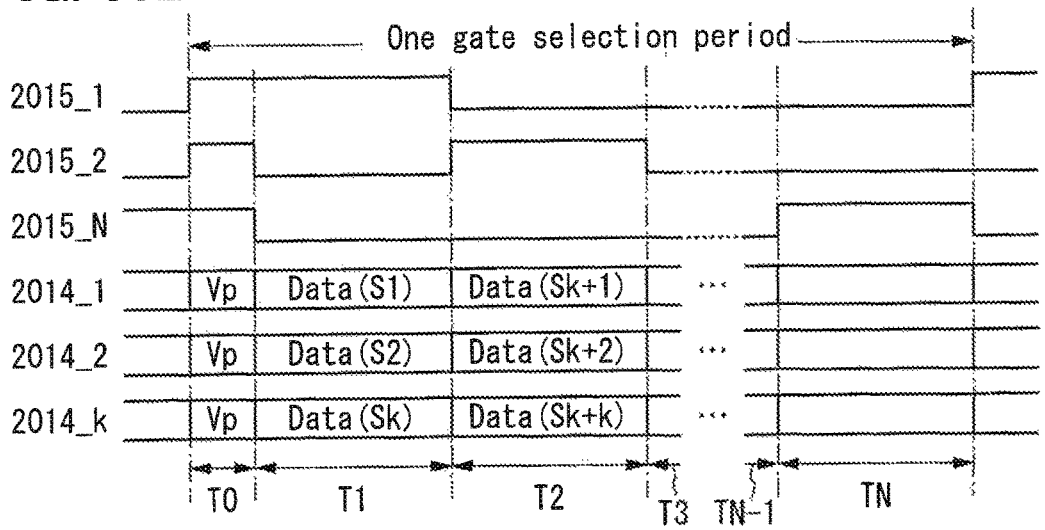

Next, the operation of the signal line driver circuit in FIG. 36A is described with reference to a timing chart in FIG. 36B. FIG. 36B illustrates signals 2015_1 to 2015_N and signals 2014_1 to 2014_k. The signals 2015_1 to 2015_N are output signals in the circuit 2001. The signals 2014_1 to 2014_k are signals which are input to the wirings 2004_1 to 2004_k. Note that one operation period of the signal line driver circuit corresponds to one gate selection period in a display device. One gate selection period is divided into a period T0 to TN. The period T0 is a period for applying precharge voltage to pixels in a selected row concurrently and can serve as a precharge period. Each of the periods T1 to TN is a period during which video signals are written to pixels in the selected row and can serve as a writing period.

First, in the period T0, the circuit 2001 supplies H-level signals to the wirings 2005_1 to 2005_N. Then, for example, the transistors 2003_1 to 2003_k are turned on in the circuit 2002_1, so that the wirings 2004_1 to 2004_k and the wirings S1 to Sk are brought into conduction. In this case, precharge voltage Vp is applied to the wirings 2004_1 to 2004_k. Thus, the precharge voltage Vp is output to the wirings S1 to Sk through the transistors 2003_1 to 2003_k. Thus, the precharge voltage Vp is written to the pixels in the selected row, so that the pixels in the selected row are precharged.

In the periods T1 to TN, the circuit 2001 sequentially outputs H-level signals to the wirings 2005_1 to 2005_N. For example, in the period T1, the circuit 2001 outputs an H-level signal to the wiring 2005_1. Then, the transistors 2003_1 to 2003_k are turned on, so that the wirings 2004_1 to 2004_k and the wirings S1 to Sk are brought into conduction. In this case, Data (S1) to Data (Sk) are input to the wirings 2004_1 to 2004_k, respectively. The Data (S1) to Data (Sk) are input to pixels in a selected row in first to k-th columns through the transistors 2003_1 to 2003_k, respectively. Therefore, in the periods T1 to TN, video signals are sequentially written to the pixels in the selected row by k columns.

By writing video signals to pixels by a plurality of columns as described above, the number of video signals or the number of wirings can be reduced. Therefore, the number of connections to an external circuit can be reduced, so that improvement in yield, improvement in reliability, reduction in the number of components, and/or reduction in cost can be achieved. Alternatively, by writing video signals to pixels by a plurality of columns, writing time can be extended. Therefore, shortage of writing of video signals can be prevented, so that display quality can be improved.

Note that by increasing k, the number of connections to the external circuit can be reduced. However, if k is too large, time to write signals to pixels would be shortened. Therefore, it is preferable that k≤6. It is much preferable that k≤3. It is much more preferable that k=2.

In particular, in the case where the number of color elements of a pixel is n (n is a natural number), k=n or k=n×d (d is a natural number) is preferable. For example, in the case where the pixel is divided into color elements of red (R), green (G), and blue (B), k=3 or k=3×d is preferable. For example, in the case where the pixel is divided into m (m is a natural number) pieces of subpixels, k=m or k=m×d is preferable. For example, in the case where the pixel is divided into two subpixels, k=2 is preferable. Alternatively, in the case where the number of color elements of the pixel is n, k=m×n or k=m×n×d is preferable.

For example, this embodiment is applied to a display device. In this case, the signal line driver circuit in this embodiment can be formed over the same substrate as a pixel portion or can be formed over a substrate which is different from a substrate over which the pixel portion is formed (e.g., a silicon substrate or an SOI substrate). Alternatively, part of the signal line driver circuit in this embodiment (e.g., the circuit 2002) can be formed over the same substrate as the pixel portion and another part of the signal line driver circuit in this embodiment (e.g., the circuit 2001) can be formed over a substrate which is different from the substrate over which the pixel portion is formed.

Figure 36C:
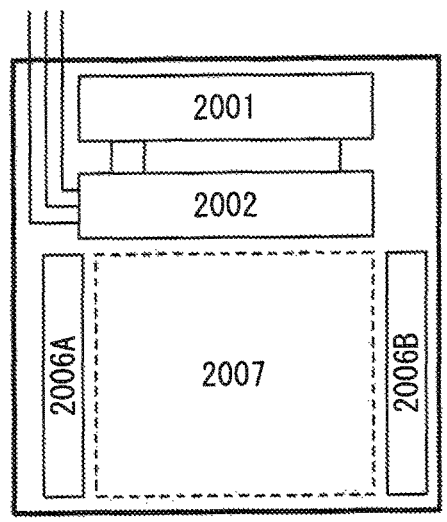

FIG. 36C illustrates a structure where the circuit 2001 and the circuit 2002 are formed over the same substrate as a pixel portion 2007. Therefore, the number of connections between the substrate over which the pixel portion is formed and an external circuit can be reduced, so that improvement in yield, improvement in reliability, reduction in the number of components, or reduction in cost can be achieved, for example In particular, when a scan line driver circuit 2006A and a scan line driver circuit 2006B are formed over the same substrate as the pixel portion 2007, the number of connections to the external circuit can be further reduced.

Figure 36D:
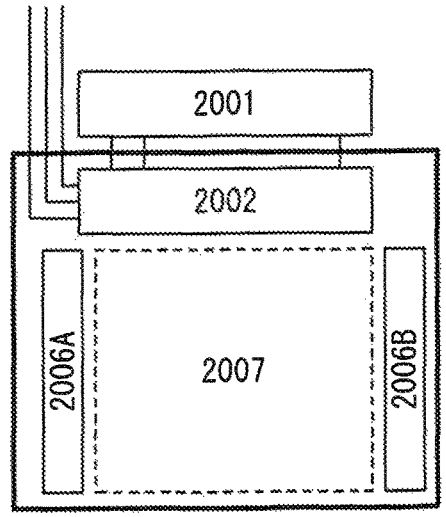

FIG. 36D illustrates a structure where the circuit 2002 is formed over the same substrate as the pixel portion 2007 and the circuit 2001 is formed over a substrate which is different from the substrate over which the pixel portion 2007 is formed. Also in this case, the number of connections between the substrate over which the pixel portion is formed and the external circuit can be reduced, so that improvement in yield, improvement in reliability, reduction in the number of components, or reduction in cost can be achieved, for example Alternatively, since the number of circuits which are formed over the same substrate as the pixel portion 2007 is made smaller, the size of a frame can be reduced.

Note that the shift register circuit in Embodiment 3 can be used for the circuit 2001. In this case, all the transistors included in the circuit 2001 can be n-channel transistors, so that the number of manufacturing steps can be reduced. Alternatively, since deterioration of the transistor can be suppressed, the life of the signal line driver circuit can be extended.

(Embodiment 5)

In this embodiment, examples of protection circuits are described. A protection circuit is provided in order to prevent a semiconductor device (e.g., a transistor, a capacitor, or a circuit) which is connected to a wiring, or the like from being damaged by ESD (electrostatic discharge).

First, a protection circuit is described with reference to FIG. 37A. A protection circuit 3000 includes a transistor 3001 and a transistor 3002. The transistor 3001 and the transistor 3002 are n-channel transistors. However, this embodiment is not limited to this. The transistor 3001 and the transistor 3002 can be p-channel transistors.

The connection relation of the protection circuit 3000 is described. A first terminal of the transistor 3001 is connected to a wiring 3012. A second terminal of the transistor 3001 is connected to a wiring 3011. A gate of the transistor 3001 is connected to the wiring 3011. A first terminal of the transistor 3002 is connected to a wiring 3013. A second terminal of the transistor 3002 is connected to the wiring 3011. A gate of the transistor 3002 is connected to the wiring 3013.

Examples of signals or voltages supplied to the wirings 3011 to 3013 and the functions of the wirings 3011 to 3013 are described. A signal (e.g., a scan signal, a video signal, a clock signal, a start signal, a reset signal, or a selection signal) or voltage (e.g., negative power supply voltage, ground voltage, or positive power supply voltage) is supplied to the wiring 3011. Therefore, the wiring 3011 can function as a signal line, a power supply line, or the like.

Positive power supply voltage ($V_{DD}$) is supplied to the wiring 3012. Therefore, the wiring 3012 can function as a power supply line. Negative power supply voltage ($V_{ss}$), ground voltage, or the like is supplied to the wiring 3013. Therefore, the wiring 3013 can function as a power supply line.

The operation of the protection circuit 3000 is described. When a potential of the wiring 3011 is substantially between $V_{ss}$ and $V_{DD}$, the transistor 3001 and the transistor 3002 are turned off. Thus, voltage, a signal, or the like supplied to the wiring 3011 is supplied to the semiconductor device which is connected to the wiring 3011. Note that due to the adverse effect of static electricity, a potential which is higher or lower than power supply voltage is supplied to the wiring 3011. Then, the semiconductor device which is connected to the wiring 3011 might be broken by the potential which is higher or lower than the power supply voltage. In order to prevent such a semiconductor device from being damaged by electrostatic discharge, change in the wiring 3011 is suppressed by turning on the transistor 3001 or the transistor 3002. For example, the transistor 3001 is turned on in the case where the potential which is higher than the power supply voltage is supplied to the wiring 3011. Then, since electric charge accumulated in the wiring 3011 is transferred to the wiring 3012 through the transistor 3001, the potential of the wiring 3011 is lowered. Accordingly, the semiconductor device can be prevented from being damaged by electrostatic discharge. In contrast, for example, in the case where the potential which is lower than the power supply voltage is supplied to the wiring 3011, the transistor 3002 is turned on. Then, since the electric charge accumulated in the wiring 3011 is transferred to the wiring 3013 through the transistor 3002, the potential of the wiring 3011 is raised. Accordingly, the semiconductor device which is connected to the wiring 3011 can be prevented from being damaged by electrostatic discharge.

Figure 37A:
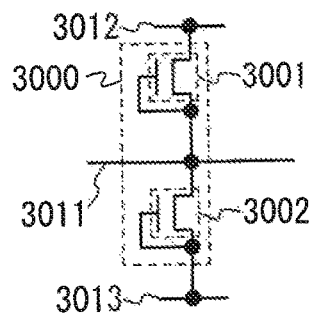
FIGS. 37A to 37G are circuit diagrams of a protection circuit in Embodiment 5.
Figure 37B:
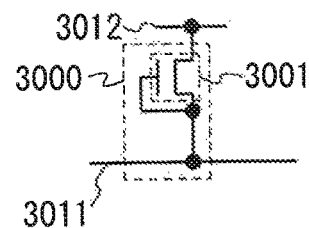
Figure 37C:
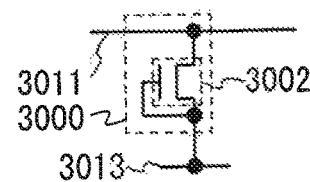

Note that in the structure illustrated in FIG. 37A, one of the transistor 3001 and the transistor 3002 can be eliminated. FIG. 37B illustrates a structure where the transistor 3002 is eliminated from the protection circuit illustrated in FIG. 37A. FIG. 37C illustrates a structure where the transistor 3002 is eliminated from the protection circuit illustrated in FIG. 37A.

Figure 37D:
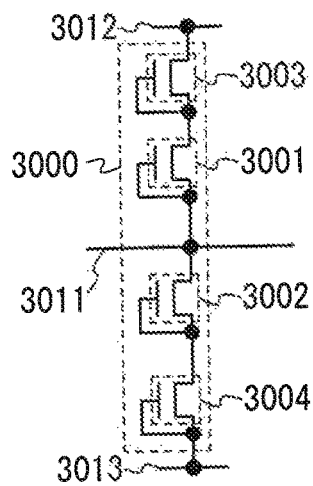
Figure 37E:
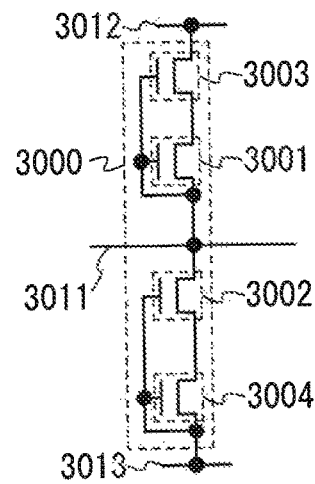

Note that in the structures illustrated in FIGS. 37A to 37C, a plurality of transistors can be connected in series between the wiring 3011 and the wiring 3012. Alternatively, a plurality of transistors can be connected in series between the wiring 3011 and the wiring 3013. FIG. 37D illustrates a structure where the transistor 3001 and a transistor 3003 are connected in series between the wiring 3011 and the wiring 3012 in the protection circuit in FIG. 37A. Further, FIG. 37D illustrates a structure where the transistor 3002 and a transistor 3004 are connected in series between the wiring 3011 and the wiring 3013. A first terminal of the transistor 3003 is connected to the wiring 3012. A second terminal of the transistor 3003 is connected to the first terminal of the transistor 3001. A gate of the transistor 3003 is connected to the first terminal of the transistor 3001. A first terminal of the transistor 3004 is connected to the wiring 3013. A second terminal of the transistor 3004 is connected to the first terminal of the transistor 3002. A gate of the transistor 3004 is connected to the first terminal of the transistor 3004. For example, as illustrated in FIG. 37E, the gate of the transistor 3001 and the gate of the transistor 3003 can be connected to each other. Alternatively, the gate of the transistor 3002 and the gate of the transistor 3004 can be connected to each other. Alternatively, a plurality of transistors can be connected in series between the wiring 3011 and the wiring 3012 or the wiring 3011 and the wiring 3013.

Figure 37F:
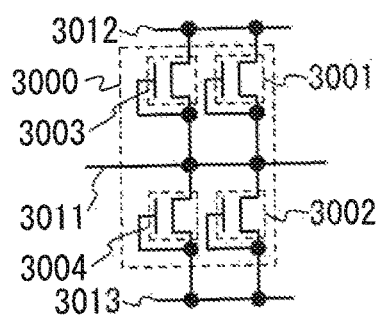

Note that in the structures illustrated in FIGS. 37A to 37E, a plurality of transistors can be connected in parallel between the wiring 3011 and the wiring 3012. Alternatively, a plurality of transistors can be connected in parallel between the wiring 3011 and the wiring 3013. FIG. 37F illustrates a structure where the transistor 3001 and the transistor 3003 are connected in parallel between the wiring 3011 and the wiring 3012 in the protection circuit in FIG. 37A. Further, FIG. 37F illustrates a structure where the transistor 3002 and the transistor 3004 are connected in parallel between the wiring 3011 and the wiring 3013. The first terminal of the transistor 3003 is connected to the wiring 3012. The second terminal of the transistor 3003 is connected to the wiring 3011. The gate of the transistor 3003 is connected to the wiring 3011. The first terminal of the transistor 3004 is connected to the wiring 3013. The second terminal of the transistor 3004 is connected to the wiring 3011. The gate of the transistor 3004 is connected to the wiring 3013.

Figure 37G:
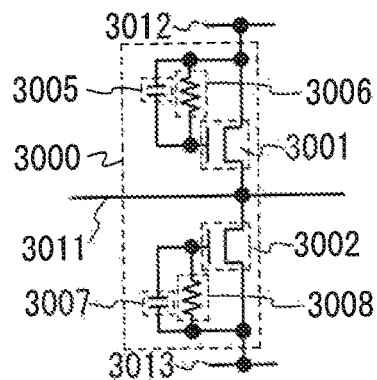

Note that in the structures illustrated in FIGS. 37A to 37F, a capacitor and a resistor can be connected in parallel between the gate of the transistor and the first terminal of the transistor. Only one of a capacitor and a resistor can be connected between the gate of the transistor and the first terminal of the transistor. FIG. 37G illustrates a structure where a capacitor 3005 and a resistor 3006 are connected in parallel between the gate of the transistor 3001 and the first terminal of the transistor 3001 in the protection circuit in FIG. 37A. Further, FIG. 37G illustrates a structure where a capacitor 3007 and a resistor 3008 are connected in parallel between the gate of the transistor 3002 and the first terminal of the transistor 3002. Thus, breakage or deterioration of the protection circuit 3000 itself can be prevented. For example, in the case where a potential which is higher than power supply voltage is supplied to the wiring 3011, $V_{gs}$ of the transistor 3001 is raised. Thus, the transistor 3001 is turned on, so that the potential of the wiring 3011 is lowered. However, since high voltage is applied between the gate of the transistor 3001 and the second terminal of the transistor 3001, the transistor might be damaged or deteriorate. In order to prevent damage or deterioration of the transistor, a potential of the gate of the transistor 3001 is raised and $V_{gs}$ of the transistor 3001 is lowered. The capacitor 3005 is used for realizing this operation. When the transistor 3001 is turned on, a potential of the first terminal of the transistor 3001 is raised instantaneously. Then, with capacitive coupling of the capacitor 3005, the potential of the gate of the transistor 3001 is raised. In this manner, $V_{gs}$ of the transistor 3001 can be lowered, and breakage or deterioration of the transistor 3001 can be suppressed. Similarly, in the case where a potential which is lower than the power supply voltage is supplied to the wiring 3011, a potential of the first terminal of the transistor 3002 is lowered instantaneously. Then, with capacitive coupling of the capacitor 3007, the potential of the gate of the transistor 3002 is lowered. In this manner, $V_{gs}$ of the transistor 3002 can be lowered, so that breakage or deterioration of the transistor 3002 can be suppressed.

Note that parasitic capacitance between the gate of the transistor and the first terminal of the transistor can be used as the capacitor. Therefore, an area where a material used for the gate of the transistor and a material used for the first terminal of the transistor overlap with each other is preferably larger than an area where the material used for the gate of the transistor and the second terminal of the transistor overlap with each other.

Note that for the resistor, a material whose conductivity is lower than that of a material used for the wiring 3011 or the material used for the gate of the transistor (e.g., the same material as a pixel electrode, a light-transmitting electrode, or a semiconductor layer to which an impurity is added) can be used.

Figure 38A:
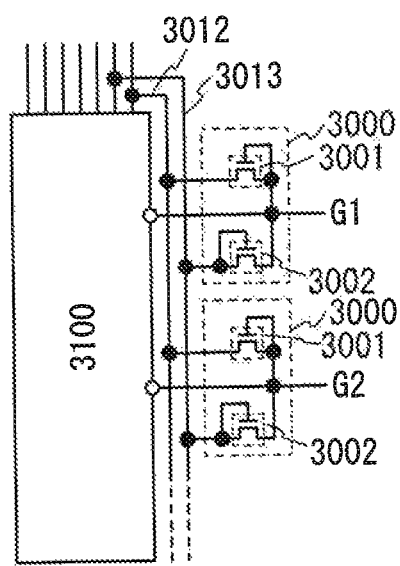
FIGS. 38A and 38B are circuit diagrams of the protection circuit in Embodiment 5.
Figure 38B:
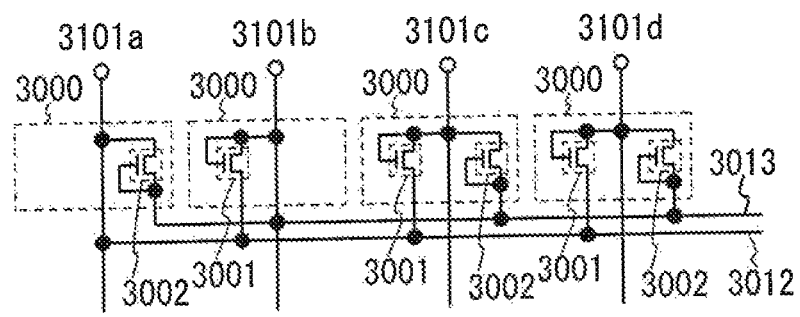

Here, the protection circuits illustrated in FIGS. 37A to 37G can be used for a variety of circuits or wirings (e.g., a signal line driver circuit, a scan line driver circuit, a level shift circuit, a gate signal line, a source signal line, a power supply line, and a capacitor line). FIG. 38A illustrates a structure when a protection circuit is provided in a gate signal line. In this case, the wiring 3012 and the wiring 3013 can be connected to any of wirings connected to a gate driver 3100. Thus, the number of power sources and the number of wirings can be reduced. FIG. 38B illustrates a structure when a protection circuit is provided in a terminal to which a signal or voltage is supplied from the outside such as an FPC. In this case, the wiring 3012 and the wiring 3013 can be connected to any of external terminals. For example, the wiring 3012 is connected to a terminal 3101a, and the wiring 3013 is connected to a terminal 3101b. In this case, in a protection circuit provided in the terminal 3101a, the transistor 3001 can be eliminated. Similarly, in a protection circuit provided in the terminal 3101b, the transistor 3002 can be eliminated. Thus, the number of transistors can be reduced, so that a layout area can be reduced.

(Embodiment 6)

In this embodiment, transistors are described with reference to FIGS. 39A to 39C.

Figure 39A:
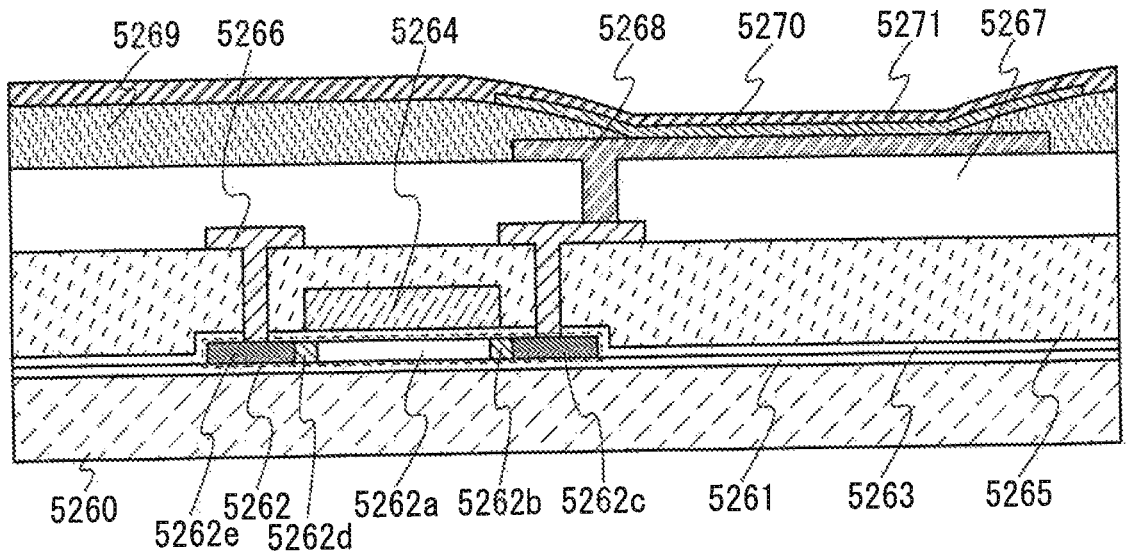
FIGS. 39A to 39C are cross-sectional views of a semiconductor device in Embodiment 6.

FIG. 39A illustrates a top-gate transistor and a display element formed over the transistor. FIG. 39B illustrates a bottom-gate transistor and a display element formed over the transistor.

The transistor in FIG. 39A includes a substrate 5260; an insulating layer 5261 formed over the substrate 5260; a semiconductor layer 5262 which is formed over the insulating layer 5261 and is provided with a region 5262a, a region 5262b, a region 5262c, a region 5262d, and a region 5262e; an insulating layer 5263 formed so as to cover the semiconductor layer 5262; a conductive layer 5264 formed over the semiconductor layer 5262 and the insulating layer 5263; an insulating layer 5265 which is formed over the insulating layer 5263 and the conductive layer 5264 and is provided with openings; and a conductive layer 5266 which is formed over the insulating layer 5265 and in the openings formed in the insulating layer 5265.

Figure 39B:
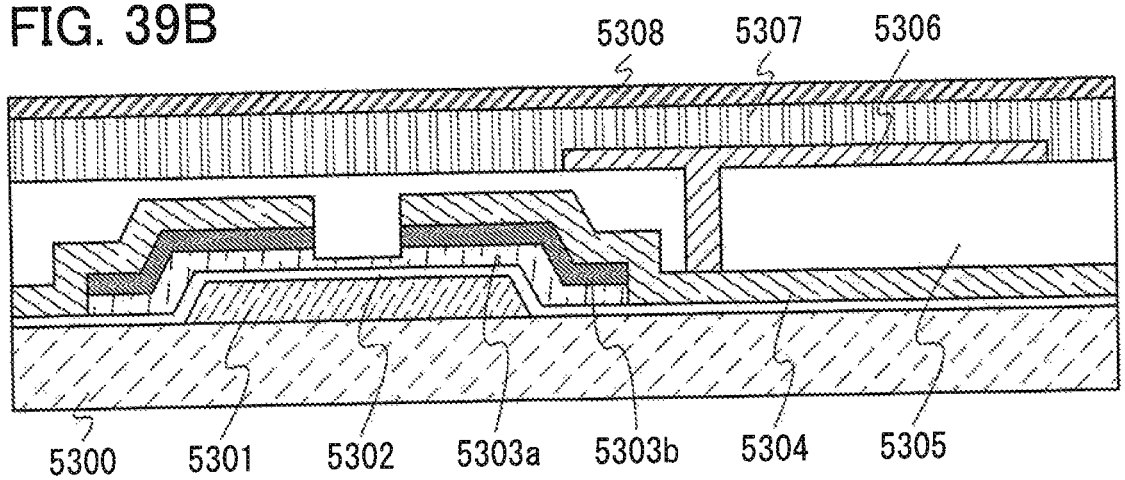

The transistor in FIG. 39B includes a substrate 5300; a conductive layer 5301 formed over the substrate 5300; an insulating layer 5302 formed so as to cover the conductive layer 5301; a semiconductor layer 5303a formed over the conductive layer 5301 and the insulating layer 5302; a semiconductor layer 5303b formed over the semiconductor layer 5303a; a conductive layer 5304 formed over the semiconductor layer 5303b and the insulating layer 5302; an insulating layer 5305 which is formed over the insulating layer 5302 and the conductive layer 5304 and is provided with an opening; and a conductive layer 5306 which is formed over the insulating layer 5305 and in the opening formed in the insulating layer 5305.

Figure 39C:
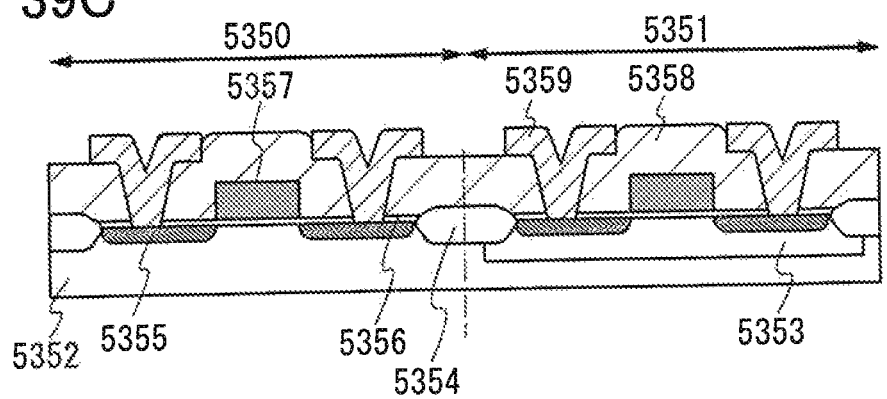

The transistor in FIG. 39C includes a semiconductor substrate 5352 including a region 5353 and a region 5355; an insulating layer 5356 formed over the semiconductor substrate 5352; an insulating layer 5354 formed over the semiconductor substrate 5352; a conductive layer 5357 formed over the insulating layer 5356; an insulating layer 5358 which is formed over the insulating layer 5354, the insulating layer 5356, and the conductive layer 5357 and is provided with openings; and a conductive layer 5359 which is formed over the insulating layer 5358 and in the openings formed in the insulating layer 5358. Thus, a transistor is formed in each of a region 5350 and a region 5351.

Note that in each of the transistors illustrated in FIGS. 39A to 39C, as illustrated in FIG. 39A, over the transistor, it is possible to form an insulating layer 5267 which is formed over the conductive layer 5266 and the insulating layer 5265 and is provided with an opening; a conductive layer 5268 which is formed over the insulating layer 5267 and in the opening formed in the insulating layer 5267; an insulating layer 5269 which is formed over the insulating layer 5267 and the conductive layer 5268 and is provided with an opening; a light-emitting layer 5270 which is formed over the insulating layer 5269 and in the opening formed in the insulating layer 5269; and a conductive layer 5271 formed over the insulating layer 5269 and the light-emitting layer 5270.

Note that in each of the transistors illustrated in FIGS. 39A to 39C, as illustrated in FIG. 39B, over the transistor, it is possible to form a liquid crystal layer 5307 which is formed over the insulating layer 5305 and the conductive layer 5306 and a conductive layer 5308 which is formed over the liquid crystal layer 5307.

The insulating layer 5261 can serve as a base film The insulating layer 5354 serves as an element isolation layer (e.g., a field oxide film). Each of the insulating layer 5263, the insulating layer 5302, and the insulating layer 5356 can serve as a gate insulating film. Each of the conductive layer 5264, the conductive layer 5301, and the conductive layer 5357 can serve as a gate electrode. Each of the insulating layer 5265, the insulating layer 5267, the insulating layer 5305, and the insulating layer 5358 can serve as an interlayer film or a planarization film. Each of the conductive layer 5266, the conductive layer 5304, and the conductive layer 5359 can serve as a wiring, an electrode of a transistor, an electrode of a capacitor, or the like. Each of the conductive layer 5268 and the conductive layer 5306 can serve as a pixel electrode, a reflective electrode, or the like. The insulating layer 5269 can serve as a partition wall. Each of the conductive layer 5271 and the conductive layer 5308 can serve as a counter electrode, a common electrode, or the like.

As each of the substrate 5260 and the substrate 5300, a glass substrate, a quartz substrate, a semiconductor substrate (e.g., a silicon substrate or a single crystal substrate), an SOI substrate, a plastic substrate, a metal substrate, a stainless steel substrate, a substrate including stainless steel foil, a tungsten substrate, a substrate including tungsten foil, a flexible substrate, or the like can be used. As a glass substrate, a barium borosilicate glass substrate, an aluminoborosilicate glass substrate, or the like can be used. For a flexible substrate, a flexible synthetic resin such as plastics typified by polyethylene terephthalate (PET), polyethylene naphthalate (PEN), or polyether sulfone (PES), or acrylic can be used. Alternatively, an attachment film (formed using polypropylene, polyester, vinyl, polyvinyl fluoride, polyvinyl chloride, or the like), paper including a fibrous material, a base material film (formed using polyester, polyamide, polyimide, an inorganic vapor deposition film, paper, or the like), or the like can be used.

As the semiconductor substrate 5352, a single crystal silicon substrate having n-type or p-type conductivity can be used. Note that this embodiment is not limited to this, and parts or all of the substrates that can be used as the semiconductor substrate 5352 can be used as the semiconductor substrate 5352. The region 5353 is a region where an impurity is added to the semiconductor substrate 5352 and serves as a well. For example, in the case where the semiconductor substrate 5352 has p-type conductivity, the region 5353 has n-type conductivity and serves as an n-well. On the other hand, in the case where the semiconductor substrate 5352 has n-type conductivity, the region 5353 has p-type conductivity and serves as a p-well. The region 5355 is a region where an impurity is added to the semiconductor substrate 5352 and serves as a source region or a drain region. Note that an LDD region can be formed in the semiconductor substrate 5352.

For the insulating layer 5261, a single-layer structure or a layered structure of an insulating film containing oxygen or nitrogen, such as silicon oxide ($SiO_x$), silicon nitride ($SiN_x$), silicon oxynitride ($SiO_xN_y$) (x>y>0), or silicon nitride oxide ($SiN_xO_y$) (x>y>0), can be used. In the case where the insulating layer 5261 has a two-layer structure, a silicon nitride film and a silicon oxide film can be formed as a first insulating layer and a second insulating layer, respectively. In the case where the insulating layer 5261 has a three-layer structure, a silicon oxide film, a silicon nitride film, and a silicon oxide film can be formed as a first insulating layer, a second insulating layer, and a third insulating layer, respectively.

For each of the semiconductor layer 5262, the semiconductor layer 5303a, and the semiconductor layer 5303b, a non-single-crystal semiconductor (e.g., amorphous silicon, polycrystalline silicon, or microcrystalline silicon), a single crystal semiconductor, a compound semiconductor or an oxide semiconductor (e.g., ZnO, InGaZnO, SiGe, GaAs, IZO (indium zinc oxide), ITO (indium tin oxide), SnO, TiO, or AlZnSnO (AZTO)), an organic semiconductor, a carbon nanotube, or the like can be used.

Note that for example, the region 5262a is an intrinsic region where an impurity is not added to the semiconductor layer 5262 and serves as a channel region. However, an impurity can be added to the region 5262a. The concentration of the impurity added to the region 5262a is preferably lower than the concentration of an impurity added to the region 5262b, the region 5262c, the region 5262d, or the region 5262e. Each of the region 5262b and the region 5262d is a region to which an impurity is added at lower concentration than the region 5262c or the region 5262e and serves as an LDD (lightly doped drain) region. Note that the region 5262b and the region 5262d can be eliminated. Each of the region 5262c and the region 5262e is a region to which an impurity is added at high concentration and serves as a source region or a drain region.

Note that the semiconductor layer 5303b is a semiconductor layer to which phosphorus or the like is added as an impurity element and has n-type conductivity.

Note that in the case where an oxide semiconductor or a compound semiconductor is used for the semiconductor layer 5303a, the semiconductor layer 5303b can be eliminated.

For each of the insulating layer 5263, the insulating layer 5302, and the insulating layer 5356, a single-layer structure or a layered structure of an insulating film containing oxygen or nitrogen, such as silicon oxide ($SiO_x$), silicon nitride ($SiN_x$), silicon oxynitride ($SiO_xN_y$) (x>y>0), or silicon nitride oxide ($SiN_xO_y$) (x>y>0), can be used.

As each of the conductive layer 5264, the conductive layer 5266, the conductive layer 5268, the conductive layer 5271, the conductive layer 5301, the conductive layer 5304, the conductive layer 5306, the conductive layer 5308, the conductive layer 5357, and the conductive layer 5359, a conductive film having a single-layer structure or a layered structure, or the like can be used. For the conductive film, the group consisting of aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), manganese (Mn), cobalt (Co), niobium (Nb), silicon (Si), iron (Fe), palladium (Pd), carbon (C), scandium (Sc), zinc (Zn), gallium (Ga), indium (In), tin (Sn), zirconium (Zr), and cerium (Ce); a single-layer film containing one element selected from the above group; a compound containing one or more elements selected from the above group; or the like can be used. Note that the single-layer film or the compound can contain phosphorus (P), boron (B), arsenic (As), and/or oxygen (O), for example.

A compound containing one or more elements selected from the above plurality of elements (e.g., an alloy), a compound containing nitrogen and one or more elements selected from the above plurality of elements (e.g., a nitride film), a compound containing silicon and one or more elements selected from the above plurality of elements (e.g., a silicide film), a nanotube material, or the like can be used as the compound. Indium tin oxide (ITO), indium zinc oxide (IZO), indium tin oxide containing silicon oxide (ITSO), zinc oxide (ZnO), tin oxide (SnO), cadmium tin oxide (CTO), aluminum-neodymium (Al—Nd), aluminum-tungsten (Al—W), aluminum-zirconium (Al—Zr), aluminum titanium (Al—Ti), aluminum-cerium (Al—Ce), magnesium-silver (Mg—Ag), molybdenum-niobium (Mo—Nb), molybdenum-tungsten (Mo—W), molybdenum-tantalum (Mo—Ta), or the like can be used as an alloy. Titanium nitride, tantalum nitride, molybdenum nitride, or the like can be used for a nitride film Tungsten silicide, titanium silicide, nickel silicide, aluminum silicon, molybdenum silicon, or the like can be used for a silicide film. A carbon nanotube, an organic nanotube, an inorganic nanotube, a metal nanotube, or the like can be used as a nanotube material.

For each of the insulating layer 5265, the insulating layer 5267, the insulating layer 5269, the insulating layer 5305, and the insulating layer 5358, an insulating layer having a single-layer structure or a layered structure, or the like can be used. As the insulating layer, a film containing oxygen or nitrogen, such as silicon oxide ($SiO_x$), silicon nitride ($SiN_x$), silicon oxynitride ($SiO_xN_y$) (x>y>0) film, or silicon nitride oxide ($SiN_xO_y$) (x>y>0); a film containing carbon such as diamond-like carbon (DLC); an organic material such as a siloxane resin, epoxy, polyimide, polyamide, polyvinyl phenol, benzocyclobutene, or acrylic; or the like can be used.

For the light-emitting layer 5270, an organic EL element, an inorganic EL element, or the like can be used. For the organic EL element, a single-layer structure or a layered structure of a hole injection layer formed using a hole injection material, a hole transport layer formed using a hole transport material, a light-emitting layer formed using a light-emitting material, an electron transport layer formed using an electron transport material, an electron injection layer formed using an electron injection material, or a layer in which a plurality of these materials are mixed can be used.

Note that an insulating layer which serves as an alignment film, an insulating layer which serves as a protrusion portion, or the like can be formed over the insulating layer 5305 and the conductive layer 5306.

Note that an insulating layer or the like which serves as a color filter, a black matrix, or a protrusion portion can be formed over the conductive layer 5308. An insulating layer which serves as an alignment film can be formed below the conductive layer 5308.

The transistor in this embodiment can be used for the semiconductor device in Embodiment 1 or 2. In particular, a non-single-crystal semiconductor, an amorphous semiconductor, a microcrystalline semiconductor, an organic semiconductor, an oxide semiconductor, or the like is used for the semiconductor layer in FIG. 39B, the transistor deteriorates. However, deterioration of the transistor can be suppressed in any of the semiconductor devices, the shift registers, or the display devices in Embodiments 1 to 6, which is advantageous.

(Embodiment 7)

In this embodiment, cross-sectional structures of a display device are described with reference to FIGS. 40A to 40C.

Figure 40A:
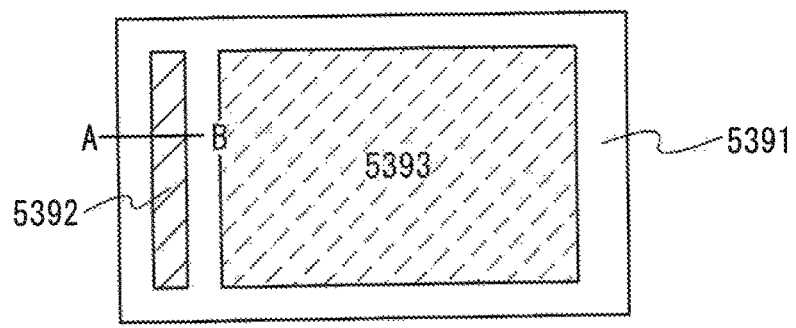
FIGS. 40A to 40C are a top view and cross-sectional views of a display device in Embodiment 7.

FIG. 40A is a top view of a display device. A driver circuit 5392 and a pixel portion 5393 are formed over a substrate 5391. An example of the driver circuit 5392 is a scan line driver circuit, a signal line driver circuit, or the like.

Figure 40B:
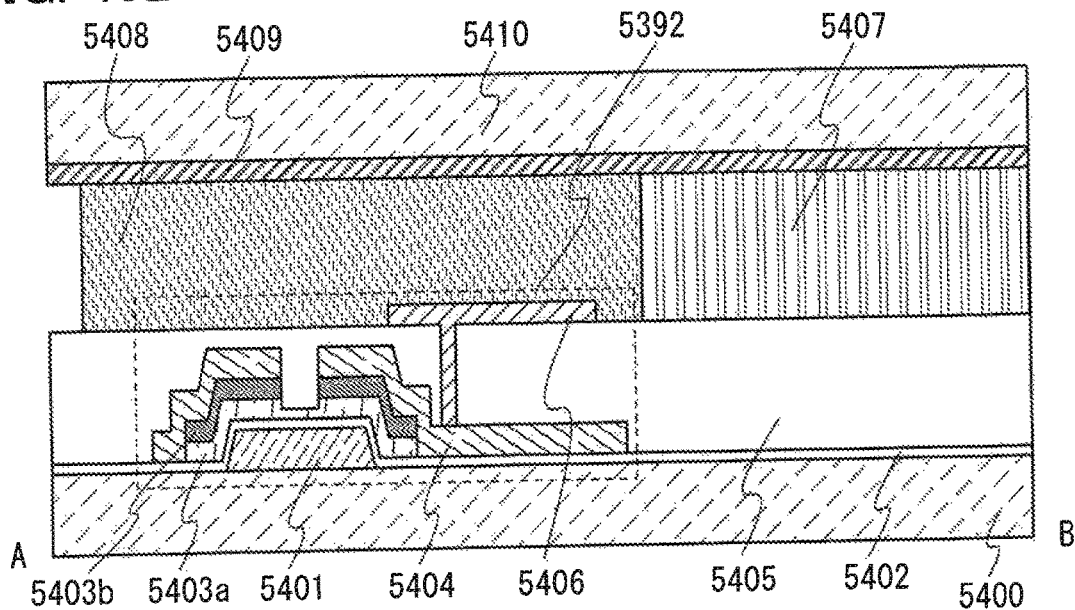

FIG. 40B illustrates a cross section A-B in FIG. 40A. FIG. 40B illustrates a substrate 5400, a conductive layer 5401 formed over the substrate 5400, an insulating layer 5402 formed so as to cover the conductive layer 5401, a semiconductor layer 5403a formed over the conductive layer 5401 and the insulating layer 5402, a semiconductor layer 5403b formed over the semiconductor layer 5403a, a conductive layer 5404 formed over the semiconductor layer 5403b and the insulating layer 5402, an insulating layer 5405 which is formed over the insulating layer 5402 and the conductive layer 5404 and is provided with an opening portion, a conductive layer 5406 formed over the insulating layer 5405 and in the opening portion in the insulating layer 5405, an insulating layer 5408 provided over the insulating layer 5405 and the conductive layer 5406, a liquid crystal layer 5407 formed over the insulating layer 5405, a conductive layer 5409 formed over the liquid crystal layer 5407 and the insulating layer 5408, and a substrate 5410 provided over the conductive layer 5409.

The conductive layer 5401 can serve as a gate electrode. The insulating layer 5402 can serve as a gate insulating film. The conductive layer 5404 can serve as a wiring, an electrode of a transistor, an electrode of a capacitor, or the like. The insulating layer 5405 can serve as an interlayer film or a planarization film. The conductive layer 5406 can serve as a wiring, a pixel electrode, or a reflective electrode. The insulating layer 5408 can serve as a sealant. The conductive layer 5409 can serve as a counter electrode or a common electrode.

Here, parasitic capacitance is generated between the driver circuit 5392 and the conductive layer 5409 in some cases. Accordingly, an output signal from the driver circuit 5392 or a potential of each node is distorted or delayed, or power consumption is increased. However, when the insulating layer 5408 which can serve as the sealant is formed over the driver circuit 5392 as illustrated in FIG. 40B, parasitic capacitance generated between the driver circuit 5392 and the conductive layer 5409 can be reduced. This is because the dielectric constant of the sealant is lower than the dielectric constant of the liquid crystal layer. Therefore, distortion or delay of the output signal from the driver circuit 5392 or the potential of each node can be reduced. Alternatively, power consumption of the driver circuit 5392 can be reduced.

Figure 40C:
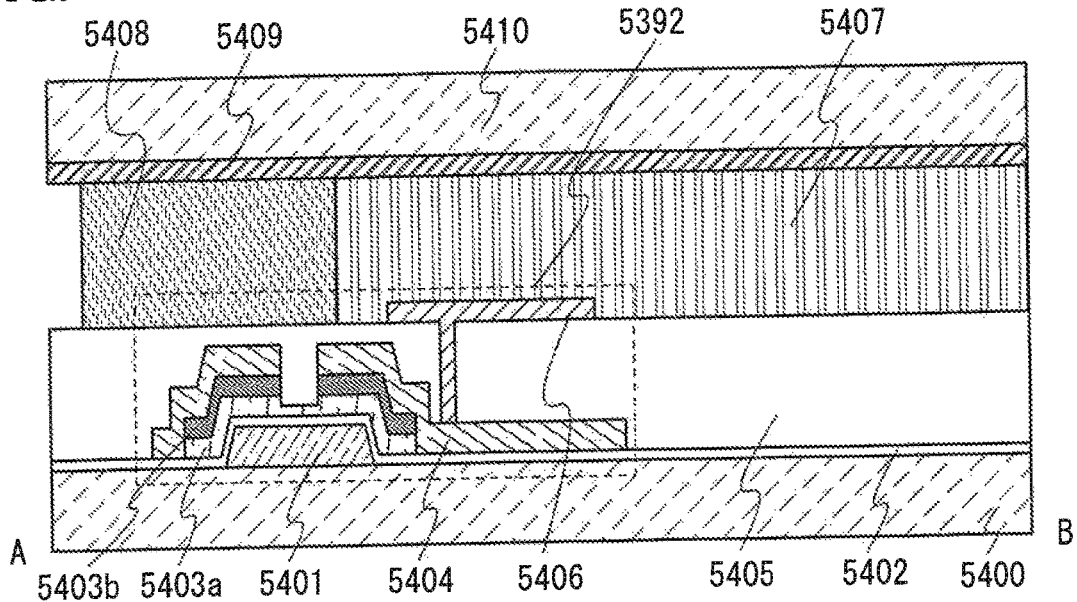

Note that as illustrated in FIG. 40C, the insulating layer 5408 which can serve as the sealant can be formed over part of the driver circuit 5392. Also in such a case, parasitic capacitance generated between the driver circuit 5392 and the conductive layer 5409 can be reduced. Thus, distortion or delay of the output signal from the driver circuit 5392 or the potential of each node can be reduced. Note that this embodiment is not limited to this. It is possible not to form the insulating layer 5408, which can serve as the sealant, over the driver circuit 5392.

Note that a display element is not limited to a liquid crystal element, and a variety of display elements such as an EL element or an electrophoretic element can be used.

In this embodiment, cross-sectional structures of the display device are described. Such a structure can be combined with any of the semiconductor devices in Embodiments 1 and 2. For example, in the case where a non-single-crystal semiconductor, a microcrystalline semiconductor, an organic semiconductor, an oxide semiconductor, or the like is used for a semiconductor layer of a transistor, the channel width of the transistor is increased. However, by reducing parasitic capacitance of the driver circuit as in this embodiment, the channel width of the transistor can be decreased. Therefore, a layout area can be reduced, so that the frame of the display device can be reduced. Alternatively, the display device can have higher definition.

(Embodiment 8)

In this embodiment, manufacturing steps of a semiconductor device are described. Here, manufacturing steps of a transistor and a capacitor are described. In particular, manufacturing steps when an oxide semiconductor is used for a semiconductor layer are described.

Figure 41A:
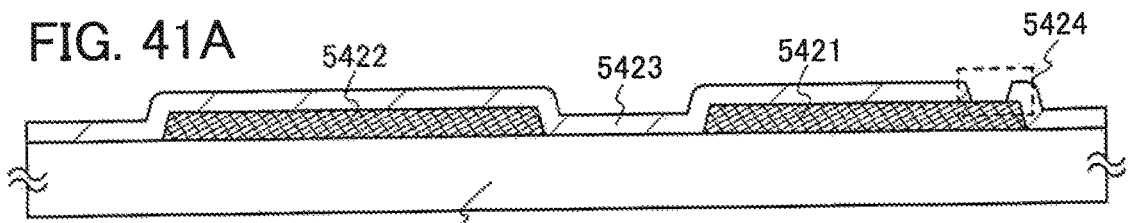
FIGS. 41A to 41E are cross-sectional views for illustrating steps of manufacturing a transistor in Embodiment 8.
Figure 41B:
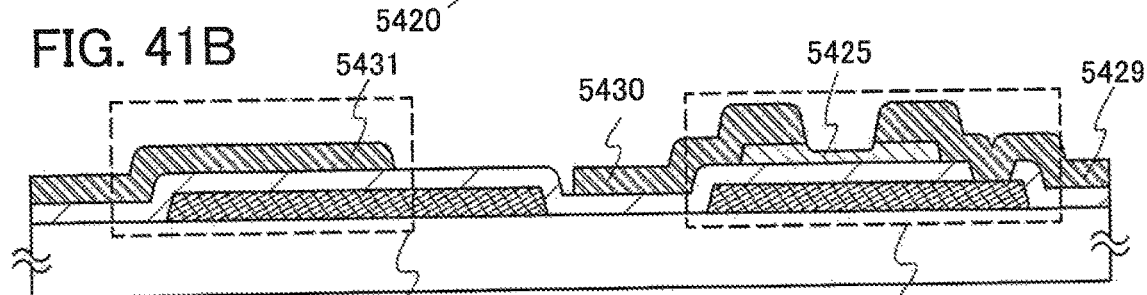
Figure 41C:
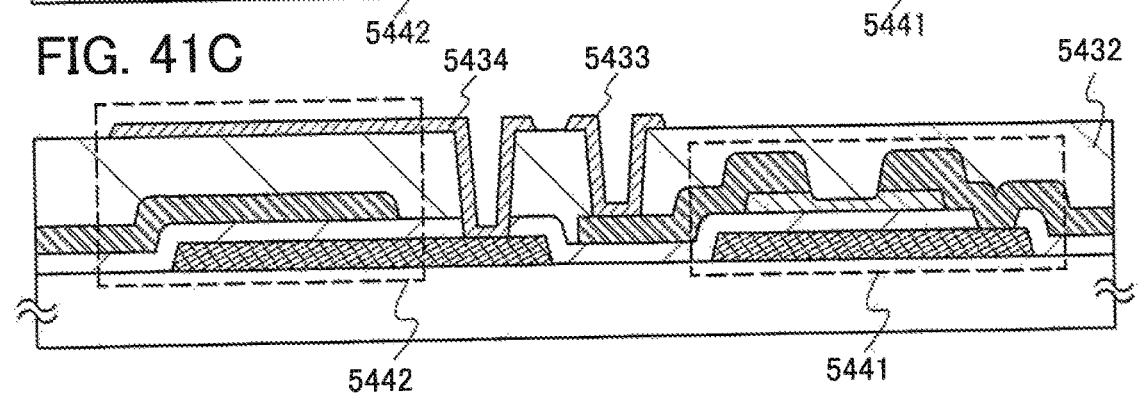

Manufacturing steps of a transistor and a capacitor are described with reference to FIGS. 41A to 41C. FIGS. 41A to 41C illustrate manufacturing steps of a transistor 5441 and a capacitor 5442. The transistor 5441 is an inverted staggered thin film transistor, in which a wiring is provided over an oxide semiconductor layer with a source electrode or a drain electrode therebetween.

First, a first conductive layer is formed over the entire surface of a substrate 5420 by sputtering. Next, the first conductive layer is selectively etched with the use of a resist mask formed through a photolithography process using a first photomask, so that a conductive layer 5421 and a conductive layer 5422 are formed. The conductive layer 5421 can serve as a gate electrode. The conductive layer 5422 can serve as one of the electrodes of the capacitor. Note that this embodiment is not limited to this, and each of the conductive layers 5421 and 5422 can include a portion serving as a wiring, a gate electrode, or an electrode of the capacitor. After that, the resist mask is removed.

Next, an insulating layer 5423 is formed over the entire surface by plasma-enhanced CVD or sputtering. The insulating layer 5423 can serve as a gate insulating layer and is formed so as to cover the conductive layers 5421 and 5422. Note that the thickness of the insulating layer 5423 is 50 to 250 nm.

Next, the insulating layer 5423 is selectively etched with the use of a resist mask formed through a photolithography process using a second photomask, so that a contact hole 5424 which reaches the conductive layer 5421 is formed. Then, the resist mask is removed. Note that this embodiment is not limited to this, and the contact hole 5424 can be eliminated. Alternatively, the contact hole 5424 can be formed after an oxide semiconductor layer is formed. A cross-sectional view of the steps so far corresponds to FIG. 41A.

Next, an oxide semiconductor layer is formed over the entire surface by sputtering. Note that this embodiment is not limited to this, and it is possible to form the oxide semiconductor layer by sputtering and to form a buffer layer (e.g., an n+ layer) thereover. Note that the thickness of the oxide semiconductor layer is 5 to 200 nm.

Next, the oxide semiconductor layer is selectively etched using a third photomask. After that, the resist mask is removed.

Next, a second conductive layer is formed over the entire surface by sputtering. Then, the second conductive layer is selectively etched with the use of a resist mask formed through a photolithography process using a fourth photomask, so that a conductive layer 5429, a conductive layer 5430, and a conductive layer 5431 are formed. The conductive layer 5429 is connected to the conductive layer 5421 through the contact hole 5424. The conductive layers 5429 and 5430 can serve as the source electrode and the drain electrode. The conductive layer 5431 can serve as the other of the electrodes of the capacitor. Note that this embodiment is not limited to this, and each of the conductive layers 5429, 5430, and 5431 can include a portion serving as a wiring, the source electrode, the drain electrode, or the electrode of the capacitor. A cross-sectional view of the steps so far corresponds to FIG. 41B.

Next, heat treatment is performed at 200 to 600° C. in an air atmosphere or a nitrogen atmosphere. Through this heat treatment, rearrangement at the atomic level occurs in an In—Ga—Zn—O-based non-single-crystal layer. In this manner, through heat treatment (including light annealing), strain which inhibits carrier movement is released. Note that there is no particular limitation to timing at which the heat treatment is performed, and the heat treatment can be performed at any time after the oxide semiconductor layer is formed.

Next, an insulating layer 5432 is formed over the entire surface. The insulating layer 5432 can have either a single-layer structure or a layered structure. For example, in the case where an organic insulating layer is used as the insulating layer 5432, the organic insulating layer is formed in such a manner that a composition which is a material for the organic insulating layer is applied and subjected to heat treatment at 200 to 600° C. in an air atmosphere or a nitrogen atmosphere. By forming the organic insulating layer which is in contact with the oxide semiconductor layer in this manner, a thin film transistor with highly reliable electric characteristics can be manufactured. Note that in the case where an organic insulating layer is used as the insulating layer 5432, a silicon nitride film or a silicon oxide film can be provided below the organic insulating layer.

Next, a third conductive layer is formed over the entire surface. Then, the third conductive layer is selectively etched with the use of a resist mask formed through a photolithography process using a fifth photomask, so that a conductive layer 5433 and a conductive layer 5434 are formed. A cross-sectional view of the steps so far corresponds to FIG. 41C. Each of the conductive layers 5433 and 5434 can serve as a wiring, a pixel electrode, a reflective electrode, a light-transmitting electrode, or the electrode of the capacitor. In particular, since the conductive layer 5434 is connected to the conductive layer 5422, the conductive layer 5434 can serve as the electrode of the capacitor 5442. Note that this embodiment is not limited to this, and the conductive layers 5433 and 5434 can have a function of connecting the first conductive layer and the second conductive layer to each other. For example, by connecting the conductive layers 5433 and 5434 to each other, the conductive layer 5422 and the conductive layer 5430 can be connected to each other through the third conductive layer (the conductive layers 5433 and 5434).

Through the above steps, the transistor 5441 and the capacitor 5442 can be manufactured.

Figure 41D:
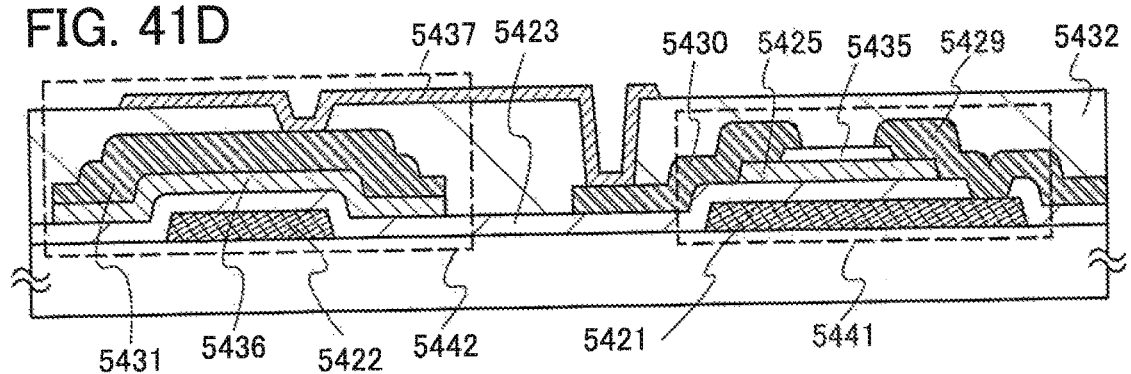

Note that as illustrated in FIG. 41D, an insulating layer 5435 can be formed over the oxide semiconductor layer 5425. Note that reference numerals 5437 and 5436 denote a conductive layer and an oxide semiconductor layer, respectively.

Figure 41E:
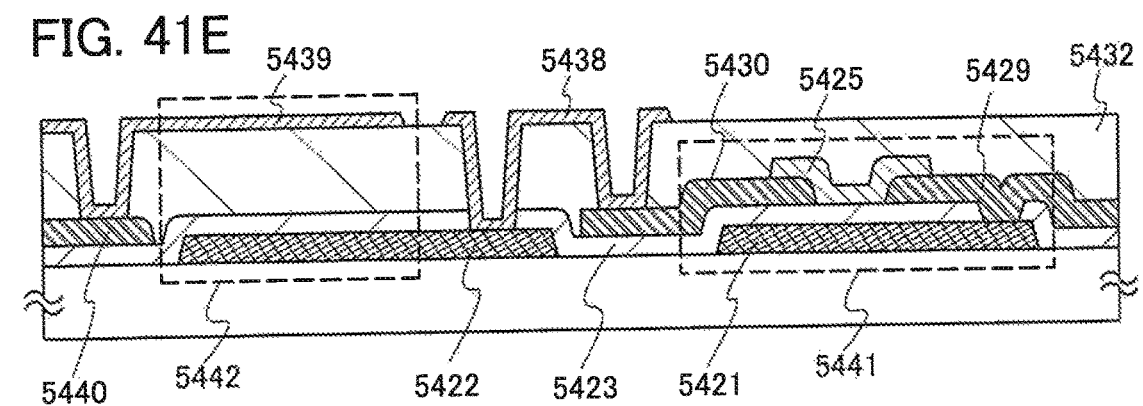

Note that as illustrated in FIG. 41E, the oxide semiconductor layer 5425 can be formed after the second conductive layer is patterned. Note that reference numerals 5438 and 5439 each denote a conductive layer.

Note that for the substrate, the insulating film, the conductive film, and the semiconductor layer in this embodiment, the materials described in the other embodiments or materials which are similar to those described in this specification can be used.

(Embodiment 9)

In this embodiment, a layout diagram (also referred to as a top view) of a semiconductor device is described. Specifically, in this embodiment, a layout diagram of the semiconductor device in FIG. 1A is described. Note that the content described in this embodiment can be combined with the content described in any of the other embodiments as appropriate. Note that the layout diagram in this embodiment is one example, and the layout diagram of the semiconductor device is not limited to this.

Figure 42:
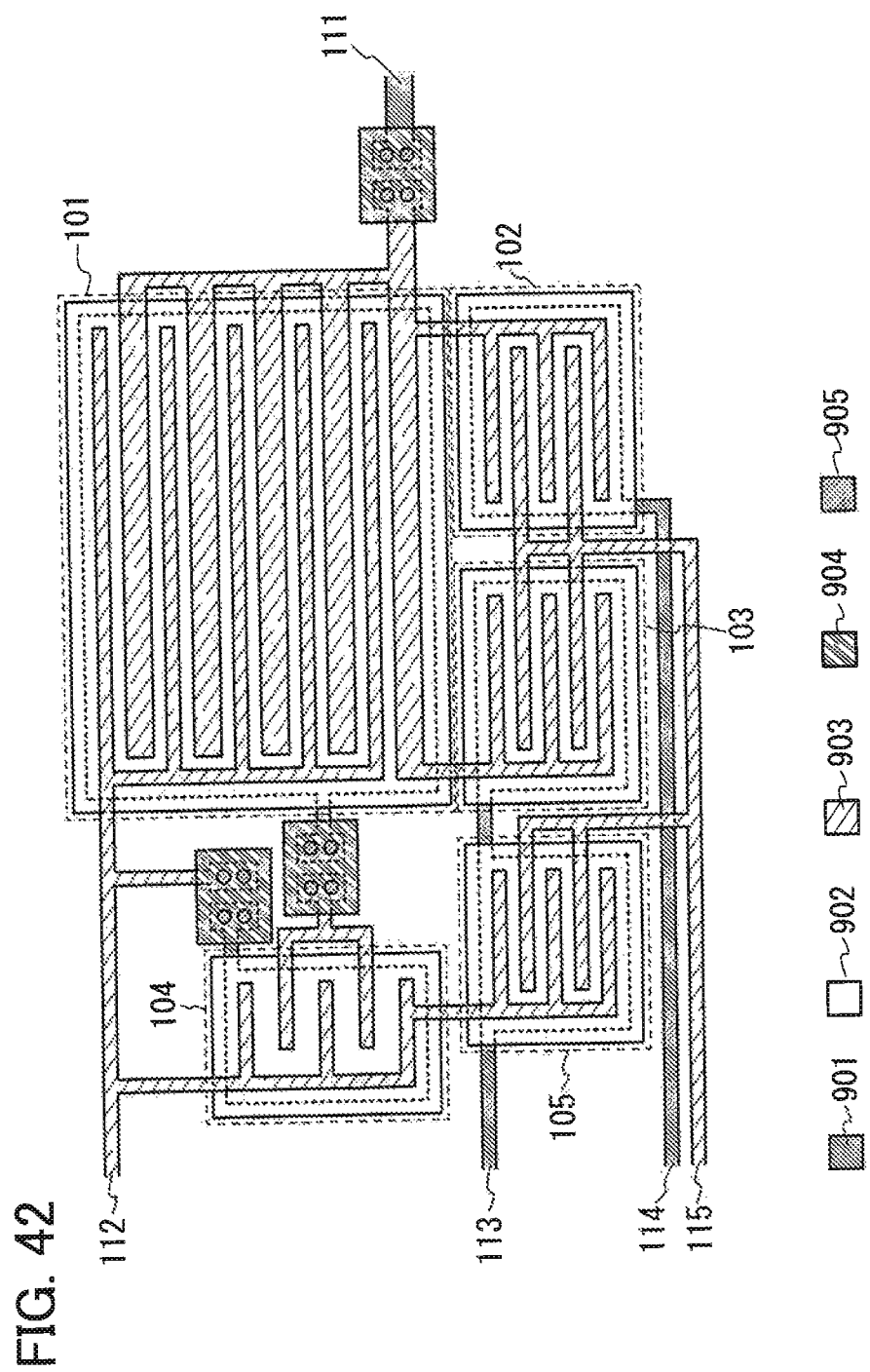
FIG. 42 is a layout diagram of a semiconductor device in Embodiment 9.

The layout diagram in this embodiment is described with reference to FIG. 42. FIG. 42 is a layout diagram of the semiconductor device in FIG. 1A.

Transistors, wirings, and the like illustrated in FIG. 42 include a conductive layer 901, a semiconductor layer 902, a conductive layer 903, a conductive layer 904, and a contact hole 905. However, this embodiment is not limited to this. A different conductive layer, an insulating film, or a different contact hole can be newly formed. For example, a contact hole for connecting the conductive layer 901 and the conductive layer 903 to each other can be additionally provided.

The conductive layer 901 can include a portion which functions as a gate electrode or a wiring. The semiconductor layer 902 can include a portion which functions as a semiconductor layer of the transistor. The conductive layer 903 can include a portion which functions as a wiring, a source, or a drain. The conductive layer 904 can include a portion which functions as a light-transmitting electrode, a pixel electrode, or a wiring. The contact hole 905 has a function of connecting the conductive layer 901 and the conductive layer 904 to each other or a function of connecting the conductive layer 903 and the conductive layer 904 to each other.

Note that the semiconductor layer 902 can be provided in a portion where the conductive layer 901 and the conductive layer 903 overlap with each other. Accordingly, parasitic capacitance between the conductive layer 901 and the conductive layer 903 can be reduced, so that noise can be reduced. For a similar reason, the semiconductor layer 902 or the conductive layer 903 can be provided in a portion where the conductive layer 901 and the conductive layer 904 overlap with each other.

Note that the conductive layer 904 can be formed over part of the conductive layer 901 and can be connected to the conductive layer 901 through the contact hole 905. Accordingly, wiring resistance can be lowered. Alternatively, the conductive layers 903 and 904 can be formed over part of the conductive layer 901; the conductive layer 901 can be connected to the conductive layer 904 through the contact hole 905; and the conductive layer 903 can be connected to the conductive layer 904 through the different contact hole 905. In this manner, the wiring resistance can be further lowered.

Note that the conductive layer 904 can be formed over part of the conductive layer 903, and the conductive layer 903 can be connected to the conductive layer 904 through the contact hole 905. Accordingly, wiring resistance can be lowered.

Note that the conductive layer 901 or the conductive layer 903 can be formed below part of the conductive layer 904, and the conductive layer 904 can be connected to the conductive layer 901 or the conductive layer 903 through the contact hole 905. Accordingly, wiring resistance can be lowered.

Note that as described above, parasitic capacitance between the gate of the transistor 101 and the second terminal of the transistor 101 can be made higher than parasitic capacitance between the gate of the transistor 101 and the first terminal of the transistor 101. Therefore, in the transistor 101, an area where the conductive layer 903 functioning as the second terminal and the conductive layer 901 functioning as the gate overlap with each other is preferably larger than an area where the conductive layer 903 functioning as the first terminal and the conductive layer 901 functioning as the gate overlap with each other.

(Embodiment 10)

In this embodiment, examples of electronic devices are described.

FIGS. 43A to 43H and FIGS. 44A to 44D illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, smell, or infrared ray), a microphone 5008, and the like.

Figure 43A:
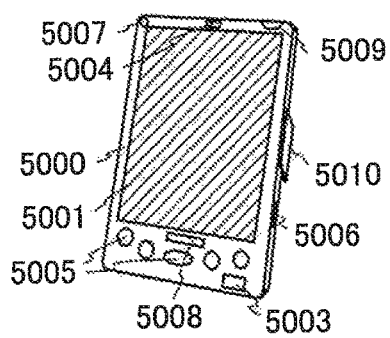
FIGS. 43A to 43H are diagrams for illustrating electronic devices in Embodiment 10.
Figure 43B:
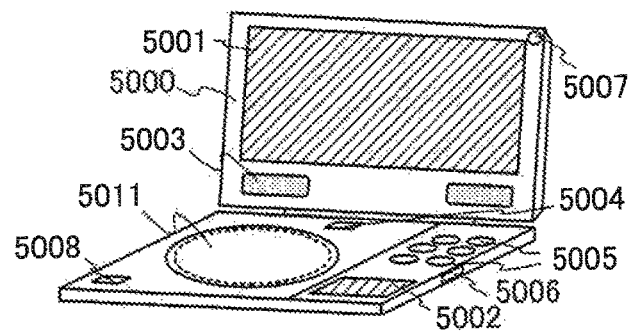
Figure 43C:
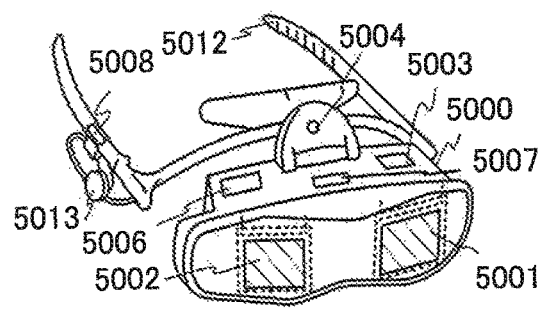
Figure 43D:
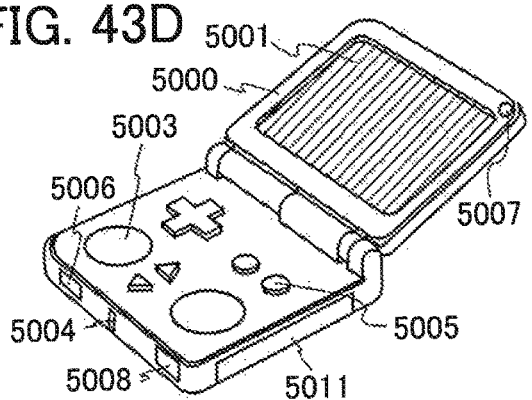
Figure 43E:
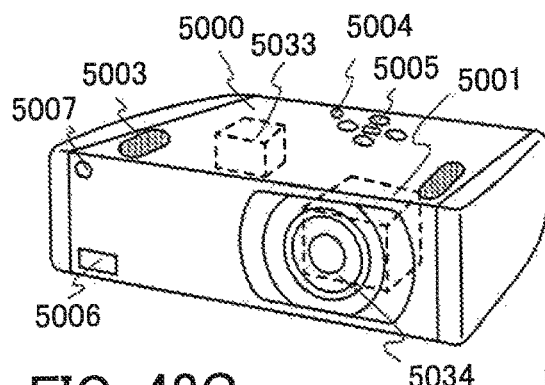
Figure 43F:
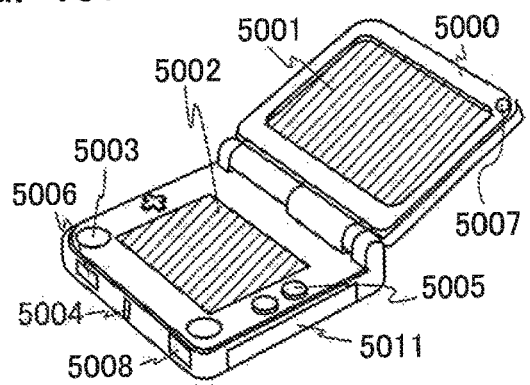
Figure 43G:
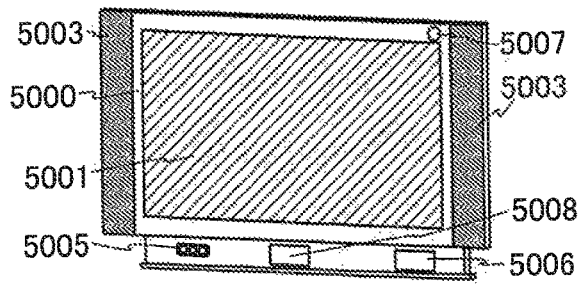
Figure 43H:
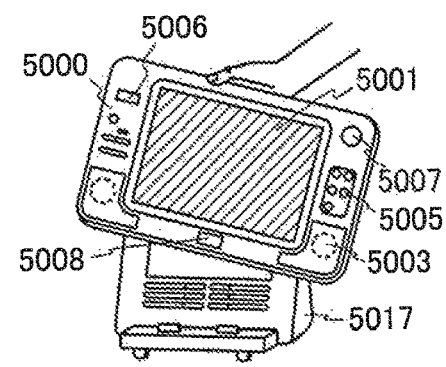
Figure 44A:
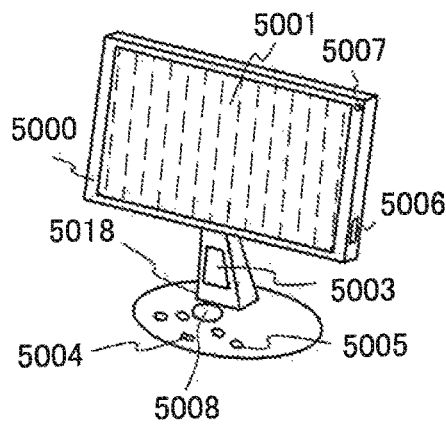
FIGS. 44A to 44H are diagrams for illustrating electronic devices in Embodiment 10.
Figure 44B:
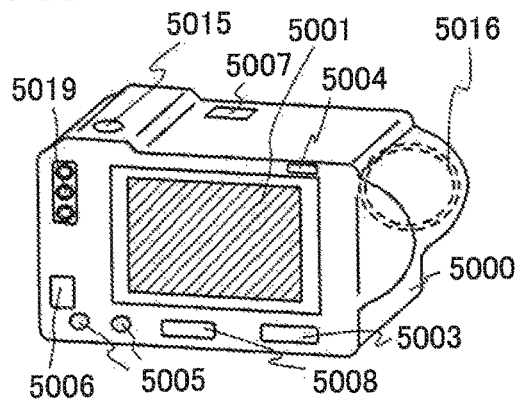
Figure 44C:
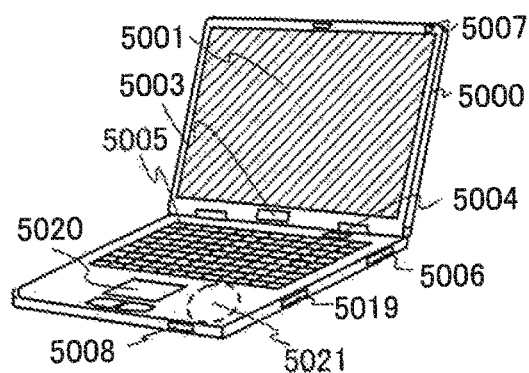
Figure 44D:
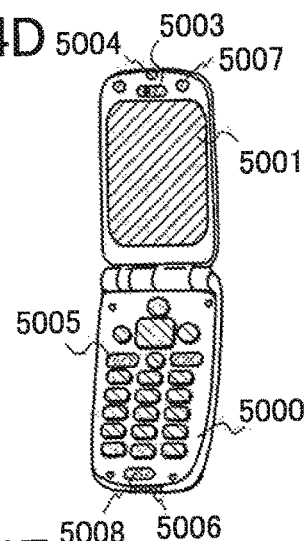

FIG. 43A illustrates a mobile computer, which can include a switch 5009, an infrared port 5010, and the like in addition to the above objects. FIG. 43B illustrates a portable image regenerating device provided with a memory medium (e.g., a DVD regenerating device), which can include a second display portion 5002, a memory medium reading portion 5011, and the like in addition to the above objects. FIG. 43C illustrates a goggle-type display, which can include the second display portion 5002, a support portion 5012, an earphone 5013, and the like in addition to the above objects. FIG. 43D illustrates a portable game machine, which can include the memory medium reading portion 5011 and the like in addition to the above objects. FIG. 43E illustrates a projector, which can include a light source 5033, a projector lens 5034, and the like in addition to the above objects. FIG. 43F illustrates a portable game machine, which can include the second display portion 5002, the memory medium reading portion 5011, and the like in addition to the above objects. FIG. 43G illustrates a television receiver, which can include a tuner, an image processing portion, and the like in addition to the above objects. FIG. 43H illustrates a portable television receiver, which can include a charger 5017 capable of transmitting and receiving signals and the like in addition to the above objects. FIG. 44A illustrates a display, which can include a support base 5018 and the like in addition to the above objects. FIG. 44B illustrates a camera, which can include an external connecting port 5019, a shutter button 5015, an image receiving portion 5016, and the like in addition to the above objects. FIG. 44C illustrates a computer, which can include a pointing device 5020, the external connecting port 5019, a reader/writer 5021, and the like in addition to the above objects. FIG. 44D illustrates a mobile phone, which can include an antenna, a tuner of one-segment (1seg digital TV broadcasts) partial reception service for mobile phones and mobile terminals, and the like in addition to the above objects.

The electronic devices illustrated in FIGS. 43A to 43H and FIGS. 44A to 44D can have a variety of functions, for example, a function of displaying a lot of information (e.g., a still image, a moving image, and a text image) on a display portion; a touch panel function; a function of displaying a calendar, date, time, and the like; a function of controlling processing with a lot of software (programs); a wireless communication function; a function of being connected to a variety of computer networks with a wireless communication function; a function of transmitting and receiving a lot of data with a wireless communication function; a function of reading a program or data stored in a memory medium and displaying the program or data on a display portion. Further, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on the display portion, or the like. Note that functions which can be provided for the electronic devices illustrated in FIGS. 43A to 43H and FIGS. 44A to 44D are not limited them, and the electronic devices can have a variety of functions.

The electronic devices described in this embodiment each include a display portion for displaying some kind of information. By combining the electronic device in this embodiment with any of the semiconductor devices, shift registers, or display devices in Embodiments 1 to 5, it is possible to achieve improvement in reliability, improvement in yield, reduction in cost, an increase in the size of the display portion, an increase in the definition of the display portion, or the like.

Next, applications of semiconductor devices are described.

Figure 44E:
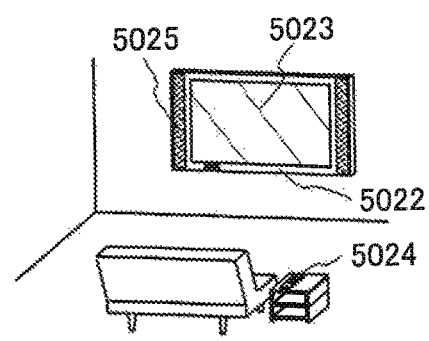

FIG. 44E illustrates an example in which a semiconductor device is incorporated in a building structure. FIG. 44E illustrates a housing 5022, a display portion 5023, a remote controller 5024 which is an operation portion, a speaker 5025, and the like. The semiconductor device is incorporated in the building structure as a wall-hanging type and can be provided without requiring a large space.

Figure 44F:
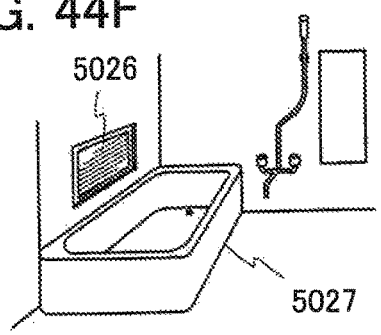

FIG. 44F illustrates another example in which a semiconductor device is incorporated in a building structure. A display panel 5026 is incorporated in a prefabricated bath unit 5027, so that a bather can view the display panel 5026.

Note that although this embodiment describes the wall and the prefabricated bath are given as examples of the building structures, this embodiment is not limited to them. The semiconductor devices can be provided in a variety of building structures.

Next, examples in which semiconductor devices are incorporated in moving objects are described.

Figure 44G:
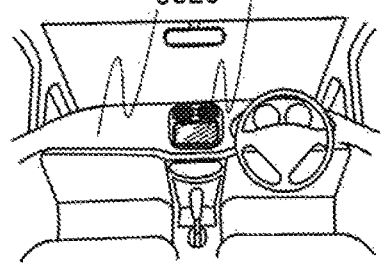

FIG. 44G illustrates an example in which a semiconductor device is incorporated in a car. A display panel 5028 is incorporated in a car body 5029 of the car and can display information related to the operation of the car or information input from inside or outside of the car on demand. Note that the display panel 5028 may have a navigation function.

Figure 44H:
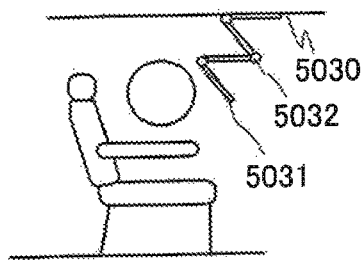

FIG. 44H illustrates an example in which a semiconductor device is incorporated in a passenger airplane. FIG. 44H illustrates a usage pattern when a display panel 5031 is provided for a ceiling 5030 above a seat of the passenger airplane. The display panel 5031 is incorporated in the ceiling 5030 through a hinge portion 5032, and a passenger can view the display panel 5031 by stretching of the hinge portion 5032. The display panel 5031 has a function of displaying information by the operation of the passenger.

Note that although bodies of a car and an airplane are illustrated as examples of moving objects in this embodiment, this embodiment is not limited to them. The semiconductor devices can be provided for a variety of objects such as two-wheeled vehicles, four-wheeled vehicles (including cars, buses, and the like), trains (including monorails, railroads, and the like), and vessels.

This application is based on Japanese Patent Application serial no. 2009-209099 filed with Japan Patent Office on Sep. 10, 2009, the entire contents of which are hereby incorporated by reference.

What is claimed is:

1. A semiconductor device comprising:
   a first transistor, a second transistor, a third transistor, a fourth transistor, a fifth transistor, and a sixth transistor,
   wherein one of a source and a drain of the first transistor is directly connected to a first wiring,
   wherein the other one of the source and the drain of the first transistor is directly connected to a second wiring,
   wherein one of a source and a drain of the second transistor is directly connected to a third wiring,
   wherein the other one of the source and the drain of the second transistor is directly connected to the second wiring,
   wherein one of a source and a drain of the third transistor is directly connected to a fourth wiring,
   wherein the other one of the source and the drain of the third transistor is electrically connected to a gate of the first transistor,
   wherein a gate of the third transistor is directly connected to a fifth wiring,
   wherein one of a source and a drain of the fourth transistor is directly connected to the third wiring,
   wherein the other one of the source and the drain of the fourth transistor is electrically connected to the gate of the first transistor,
   wherein a gate of the fourth transistor is directly connected to a gate of the second transistor,
   wherein one of a source and a drain of the fifth transistor is directly connected to the fifth wiring,
   wherein the other one of the source and the drain of the fifth transistor is directly connected to the gate of the second transistor,
   wherein a gate of the fifth transistor is electrically connected to the gate of the first transistor,
   wherein one of a source and a drain of the sixth transistor is directly connected to the gate of the second transistor, and
   wherein a gate of the sixth transistor is directly connected to the fifth wiring.

2. The semiconductor device according to claim 1, further comprising a gate driver,
   wherein the first transistor to the sixth transistor are part of the gate driver,
   wherein the second wiring is a second gate signal line,
   wherein the third wiring is a power supply line, and
   wherein the fourth wiring is a first gate signal line.

3. The semiconductor device according to claim 1, further comprising a first gate driver and a second gate driver,
   wherein the first gate driver and the second gate driver can drive same wirings,
   wherein the first transistor to the sixth transistor are part of one of the first gate driver and the second gate driver,
   wherein the second wiring is a second gate signal line,
   wherein the third wiring is a power supply line, and
   wherein the fourth wiring is a first gate signal line.

4. The semiconductor device according to claim 1,
   wherein one cycle of the first clock signal has a first period and a second period,
   wherein the first clock signal is H level during the first period,
   wherein the first clock signal is L level during the second period,
   wherein the first period and the second period have different lengths,
   wherein one cycle of the second clock signal has a third period and a fourth period,
   wherein the second clock signal is H level during the third period,
   wherein the second clock signal is L level during the fourth period, and
   wherein the third period and the fourth period have different lengths.

5. A semiconductor device comprising:
   a first transistor, a second transistor, a third transistor, a fourth transistor, a fifth transistor, and a sixth transistor,
   wherein one of a source and a drain of the first transistor is directly connected to a first wiring,
   wherein the other one of the source and the drain of the first transistor is directly connected to a second wiring,
   wherein one of a source and a drain of the second transistor is directly connected to a third wiring,
   wherein the other one of the source and the drain of the second transistor is directly connected to the second wiring,
   wherein one of a source and a drain of the third transistor is directly connected to a fourth wiring,
   wherein the other one of the source and the drain of the third transistor is electrically connected to a gate of the first transistor,
   wherein a gate of the third transistor is directly connected to a fifth wiring,
   wherein one of a source and a drain of the fourth transistor is directly connected to the third wiring,
   wherein the other one of the source and the drain of the fourth transistor is electrically connected to the gate of the first transistor,
   wherein a gate of the fourth transistor is directly connected to a gate of the second transistor,
   wherein one of a source and a drain of the fifth transistor is directly connected to the fifth wiring, wherein the other one of the source and the drain of the fifth transistor is directly connected to the gate of the second transistor, wherein a gate of the fifth transistor is electrically connected to the gate of the first transistor, wherein one of a source and a drain of the sixth transistor is directly connected to the gate of the second transistor, wherein a gate of the sixth transistor is directly connected to the fifth wiring, wherein a first clock signal is supplied to the first wiring, and wherein a second clock signal is supplied to the fifth wiring.

6. The semiconductor device according to claim 5, further comprising a gate driver, wherein the first transistor to the sixth transistor are part of the gate driver, wherein the second wiring is a second gate signal line, wherein the third wiring is a power supply line, and wherein the fourth wiring is a first gate signal line.

7. The semiconductor device according to claim 5, further comprising a first gate driver and a second gate driver, wherein the first gate driver and the second gate driver can drive same wirings, wherein the first transistor to the sixth transistor are part of one of the first gate driver and the second gate driver, wherein the second wiring is a second gate signal line, wherein the third wiring is a power supply line, and wherein the fourth wiring is a first gate signal line.

8. The semiconductor device according to claim 5, wherein one cycle of the first clock signal has a first period and a second period, wherein the first clock signal is H level during the first period, wherein the first clock signal is L level during the second period, wherein the first period and the second period have different lengths, wherein one cycle of the second clock signal has a third period and a fourth period, wherein the second clock signal is H level during the third period, wherein the second clock signal is L level during the fourth period, and wherein the third period and the fourth period have different lengths.

9. A semiconductor device comprising:

a first transistor, a second transistor, a third transistor, a fourth transistor, a fifth transistor, a sixth transistor, a seventh transistor, an eighth transistor, a ninth transistor, a tenth transistor, an eleventh transistor, and a twelfth transistor, wherein one of a source and a drain of the first transistor is directly connected to a first wiring, wherein the other one of the source and the drain of the first transistor is directly connected to a second wiring, wherein one of a source and a drain of the second transistor is directly connected to a third wiring, wherein the other one of the source and the drain of the second transistor is directly connected to the second wiring, wherein one of a source and a drain of the third transistor is directly connected to a fourth wiring, wherein the other one of the source and the drain of the third transistor is electrically connected to a gate of the first transistor, wherein a gate of the third transistor is directly connected to a fifth wiring, wherein one of a source and a drain of the fourth transistor is directly connected to the third wiring, wherein the other one of the source and the drain of the fourth transistor is electrically connected to the gate of the first transistor, wherein a gate of the fourth transistor is directly connected to a gate of the second transistor, wherein one of a source and a drain of the fifth transistor is directly connected to the fifth wiring, wherein the other one of the source and the drain of the fifth transistor is directly connected to the gate of the second transistor, wherein a gate of the fifth transistor is electrically connected to the gate of the first transistor, wherein one of a source and a drain of the sixth transistor is directly connected to the gate of the second transistor, wherein a gate of the sixth transistor is directly connected to the fifth wiring, wherein one of a source and a drain of the seventh transistor is directly connected to the fifth wiring, wherein the other one of the source and the drain of the seventh transistor is directly connected to a sixth wiring, wherein one of a source and a drain of the eighth transistor is directly connected to the third wiring, wherein the other one of the source and the drain of the eighth transistor is directly connected to the sixth wiring, wherein one of a source and a drain of the ninth transistor is directly connected to the second wiring, wherein the other one of the source and the drain of the ninth transistor is electrically directly connected to a gate of the seventh transistor, wherein a gate of the ninth transistor is directly connected to the first wiring, wherein one of a source and a drain of the tenth transistor is directly connected to the third wiring, wherein the other one of the source and the drain of the tenth transistor is electrically connected to the gate of the seventh transistor, wherein a gate of the tenth transistor is directly connected to a gate of the eighth transistor, wherein one of a source and a drain of the eleventh transistor is directly connected to the first wiring, wherein the other one of the source and the drain of the eleventh transistor is directly connected to the gate of the eighth transistor, wherein a gate of the eleventh transistor is electrically connected to the gate of the seventh transistor, wherein one of a source and a drain of the twelfth transistor is directly connected to the gate of the eighth transistor, and wherein a gate of the twelfth transistor is directly connected to the first wiring.

10. The semiconductor device according to claim 9, further comprising a gate driver, wherein the first transistor to the sixth transistor are part of the gate driver, wherein the second wiring is a second gate signal line, wherein the third wiring is a power supply line, and wherein the fourth wiring is a first gate signal line.

11. The semiconductor device according to claim 9, further comprising a first gate driver and a second gate driver, wherein the first gate driver and the second gate driver can drive same wirings,
wherein the first transistor to the twelfth transistor are part of one of the first gate driver and the second gate driver,
wherein the second wiring is a second gate signal line,
wherein the third wiring is a power supply line, and
wherein the fourth wiring is a first gate signal line.

12. The semiconductor device according to claim 9,
wherein one cycle of the first clock signal has a first period and a second period,
wherein the first clock signal is H level during the first period,
wherein the first clock signal is L level during the second period,
wherein the first period and the second period have different lengths,
wherein one cycle of the second clock signal has a third period and a fourth period,
wherein the second clock signal is H level during the third period,
wherein the second clock signal is L level during the fourth period, and
wherein the third period and the fourth period have different lengths.

13. A semiconductor device comprising:
a first transistor, a second transistor, a third transistor, a fourth transistor, a fifth transistor, a sixth transistor, a seventh transistor, an eighth transistor, a ninth transistor, a tenth transistor, an eleventh transistor, and a twelfth transistor,
wherein one of a source and a drain of the first transistor is directly connected to a first wiring,
wherein the other one of the source and the drain of the first transistor is directly connected to a second wiring,
wherein one of a source and a drain of the second transistor is directly connected to a third wiring,
wherein the other one of the source and the drain of the second transistor is directly connected to the second wiring,
wherein one of a source and a drain of the third transistor is directly connected to a fourth wiring,
wherein the other one of the source and the drain of the third transistor is electrically connected to a gate of the first transistor,
wherein a gate of the third transistor is directly connected to a fifth wiring,
wherein one of a source and a drain of the fourth transistor is directly connected to the third wiring,
wherein the other one of the source and the drain of the fourth transistor is electrically connected to the gate of the first transistor,
wherein a gate of the fourth transistor is directly connected to a gate of the second transistor,
wherein one of a source and a drain of the fifth transistor is directly connected to the fifth wiring,
wherein the other one of the source and the drain of the fifth transistor is directly connected to the gate of the second transistor,
wherein a gate of the fifth transistor is electrically connected to the gate of the first transistor,
wherein one of a source and a drain of the sixth transistor is directly connected to the gate of the second transistor,
wherein a gate of the sixth transistor is directly connected to the fifth wiring,
wherein one of a source and a drain of the seventh transistor is directly connected to the fifth wiring,
wherein the other one of the source and the drain of the seventh transistor is directly connected to a sixth wiring,
wherein one of a source and a drain of the eighth transistor is directly connected to the third wiring,
wherein the other one of the source and the drain of the eighth transistor is directly connected to the sixth wiring,
wherein one of a source and a drain of the ninth transistor is directly connected to the second wiring,
wherein the other one of the source and the drain of the ninth transistor is electrically connected to a gate of the seventh transistor,
wherein a gate of the ninth transistor is directly connected to the first wiring,
wherein one of a source and a drain of the tenth transistor is directly connected to the third wiring,
wherein the other one of the source and the drain of the tenth transistor is electrically connected to the gate of the seventh transistor,
wherein a gate of the tenth transistor is directly connected to a gate of the eighth transistor,
wherein one of a source and a drain of the eleventh transistor is directly connected to the first wiring,
wherein the other one of the source and the drain of the eleventh transistor is directly connected to the gate of the eighth transistor,
wherein a gate of the eleventh transistor is electrically connected to the gate of the seventh transistor,
wherein one of a source and a drain of the twelfth transistor is directly connected to the gate of the eighth transistor,
wherein a gate of the twelfth transistor is directly connected to the first wiring,
wherein a first clock signal is supplied to the first wiring, and
wherein a second clock signal is supplied to the fifth wiring.

14. The semiconductor device according to claim 13, further comprising a gate driver,
wherein the first transistor to the sixth transistor are part of the gate driver,
wherein the second wiring is a second gate signal line,
wherein the third wiring is a power supply line, and
wherein the fourth wiring is a first gate signal line.

15. The semiconductor device according to claim 13, further comprising a first gate driver and a second gate driver,
wherein the first gate driver and the second gate driver can drive same wirings,
wherein the first transistor to the twelfth transistor are part of one of the first gate driver and the second gate driver,
wherein the second wiring is a second gate signal line,
wherein the third wiring is a power supply line, and
wherein the fourth wiring is a first gate signal line.

16. The semiconductor device according to claim 13,
wherein one cycle of the first clock signal has a first period and a second period,
wherein the first clock signal is H level during the first period,
wherein the first clock signal is L level during the second period,
wherein the first period and the second period have different lengths,
wherein one cycle of the second clock signal has a third period and a fourth period, wherein the second clock signal is H level during the third period, wherein the second clock signal is L level during the fourth period, and wherein the third period and the fourth period have different lengths.

17. the semiconductor device according to claim 9, further comprising a thirteenth transistor, a fourteenth transistor, a fifteenth transistor, a sixteenth transistor, a seventeenth transistor, and an eighteenth transistor, wherein one of a source and a drain of the thirteenth transistor is directly connected to the first wiring, wherein the other one of the source and the drain of the thirteenth transistor is directly connected to a seventh wiring, wherein one of a source and a drain of the fourteenth transistor is directly connected to the third wiring, wherein the other one of the source and the drain of the fourteenth transistor is directly connected to the seventh wiring, wherein one of a source and a drain of the fifteenth transistor is directly connected to the sixth wiring, wherein the other one of the source and the drain of the fifteenth transistor is electrically connected to a gate of the thirteenth transistor, wherein a gate of the fifteenth transistor is directly connected to the fifth wiring, wherein one of a source and a drain of the sixteenth transistor is directly connected to the third wiring, wherein the other one of the source and the drain of the sixteenth transistor is electrically connected to the gate of the thirteenth transistor, wherein a gate of the sixteenth transistor is directly connected to a gate of the fourteenth transistor, wherein one of a source and a drain of the seventeenth transistor is directly connected to the fifth wiring, wherein the other one of the source and the drain of the seventeenth transistor is directly connected to the gate of the fourteenth transistor, wherein a gate of the seventeenth transistor is electrically connected to the gate of the thirteenth transistor, wherein one of a source and a drain of the eighteenth transistor is directly connected to the gate of the fourteenth transistor, and wherein a gate of the eighteenth transistor is directly connected to the fifth wiring.

18. the semiconductor device according to claim 13, further comprising a thirteenth transistor, a fourteenth transistor, a fifteenth transistor, a sixteenth transistor, a seventeenth transistor, and an eighteenth transistor, wherein one of a source and a drain of the thirteenth transistor is directly connected to the first wiring, wherein the other one of the source and the drain of the thirteenth transistor is directly connected to a seventh wiring, wherein one of a source and a drain of the fourteenth transistor is directly connected to the third wiring, wherein the other one of the source and the drain of the fourteenth transistor is directly connected to the seventh wiring, wherein one of a source and a drain of the fifteenth transistor is directly connected to the sixth wiring, wherein the other one of the source and the drain of the fifteenth transistor is electrically connected to a gate of the thirteenth transistor, wherein a gate of the fifteenth transistor is directly connected to the fifth wiring, wherein one of a source and a drain of the sixteenth transistor is directly connected to the third wiring, wherein the other one of the source and the drain of the sixteenth transistor is electrically connected to the gate of the thirteenth transistor, wherein a gate of the sixteenth transistor is directly connected to a gate of the fourteenth transistor, wherein one of a source and a drain of the seventeenth transistor is directly connected to the fifth wiring, wherein the other one of the source and the drain of the seventeenth transistor is directly connected to the gate of the fourteenth transistor, wherein a gate of the seventeenth transistor is electrically connected to the gate of the thirteenth transistor, wherein one of a source and a drain of the eighteenth transistor is directly connected to the gate of the fourteenth transistor, and wherein a gate of the eighteenth transistor is directly connected to the fifth wiring.

\* \* \* \* \*